(12) United States Patent
Takahashi et al.

(10) Patent No.: US 8,030,732 B2
(45) Date of Patent: Oct. 4, 2011

(54) SEMICONDUCTOR DEVICE AND METHOD FOR MANUFACTURING THE SAME

(75) Inventors: Makoto Takahashi, Kawasaki (JP); Minoru Endou, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/401,382

(22) Filed: Mar. 10, 2009

(65) Prior Publication Data

US 2009/0230452 A1   Sep. 17, 2009

(30) Foreign Application Priority Data

Mar. 12, 2008  (JP) .................................. 2008-063389

(51) Int. Cl.
  *H01L 29/00* (2006.01)
  *H01L 29/788* (2006.01)
  *H01L 29/76* (2006.01)
(52) U.S. Cl. ......... 257/510; 257/314; 257/315; 257/321
(58) Field of Classification Search .................. 257/510, 257/324, 315, 314, 317, 321, 320, 506, 522, 257/523, 656, 647, 401, 508
See application file for complete search history.

(56) References Cited

U.S. PATENT DOCUMENTS

| 5,844,270 | A   |   | 12/1998 | Kim et al. |         |
|-----------|-----|---|---------|------------|---------|
| 6,417,047 | B1  | * | 7/2002  | Isobe      | 438/258 |
| 6,437,411 | B1  | * | 8/2002  | Choi et al.| 257/413 |
| 6,448,606 | B1  | * | 9/2002  | Yu et al.  | 257/315 |
| 6,541,320 | B2  | * | 4/2003  | Brown et al.| 438/197 |
| 6,875,668 | B2  | * | 4/2005  | Nguyen et al.| 438/386 |

FOREIGN PATENT DOCUMENTS

| JP | 9-307083 A    | 11/1997 |
| JP | 2005-530357 A | 10/2005 |
| WO | 2004/001824 A1 | 6/2003 |

* cited by examiner

*Primary Examiner* — Chuong A. Luu
(74) *Attorney, Agent, or Firm* — Westerman, Hattori, Daniels & Adrian, LLP

(57) ABSTRACT

A semiconductor device which has a semiconductor substrate, an isolation insulating film formed in the semiconductor substrate, a conductive pattern formed over the semiconductor substrate and the isolation insulating film, so that a side face of the conductive pattern is formed over the isolation insulating film, and an insulating film is formed over the isolation insulating film, the conductive pattern and the side face of the conductive pattern, and the side face of the conductive pattern comprises a notch.

7 Claims, 54 Drawing Sheets

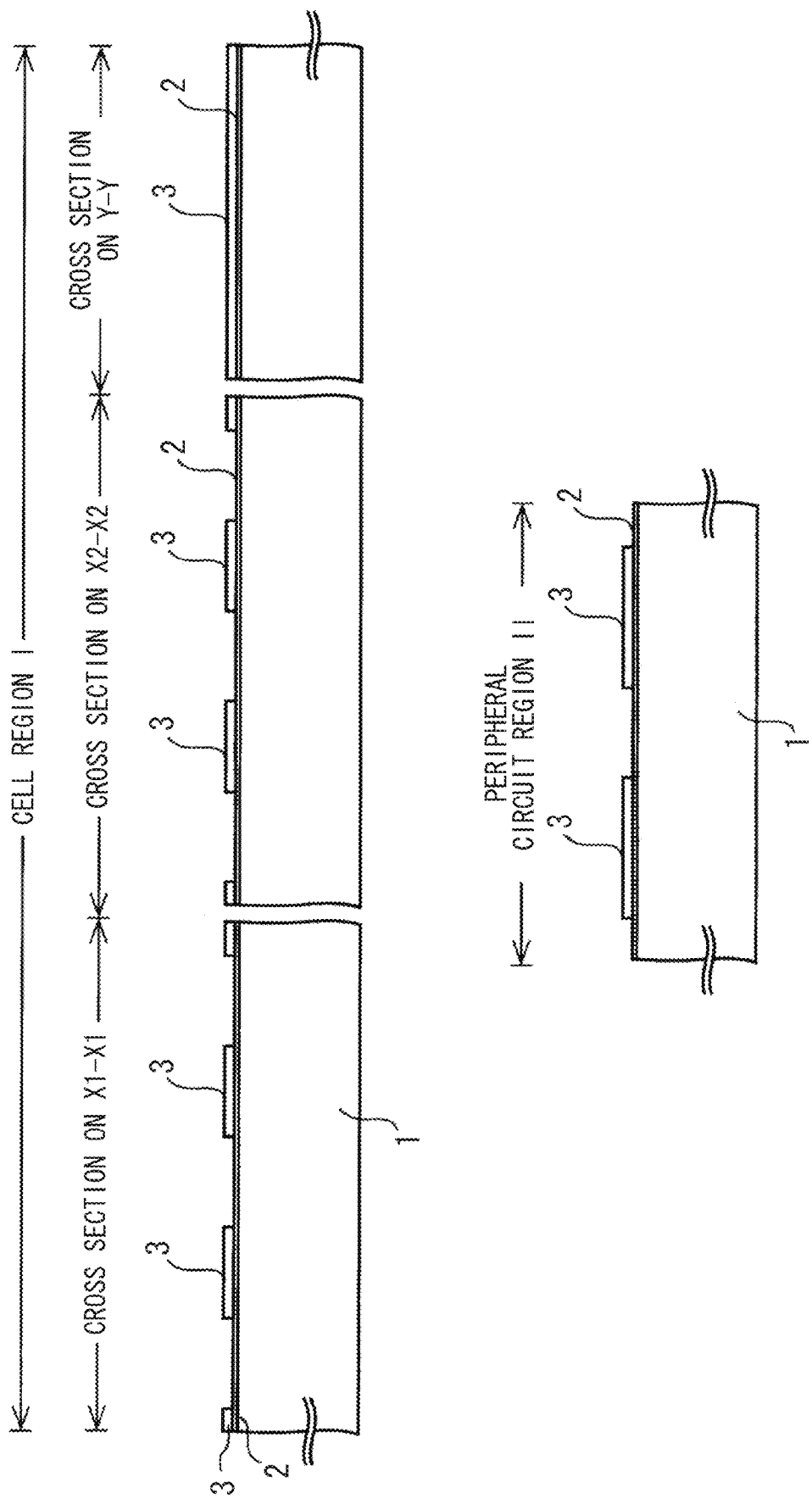

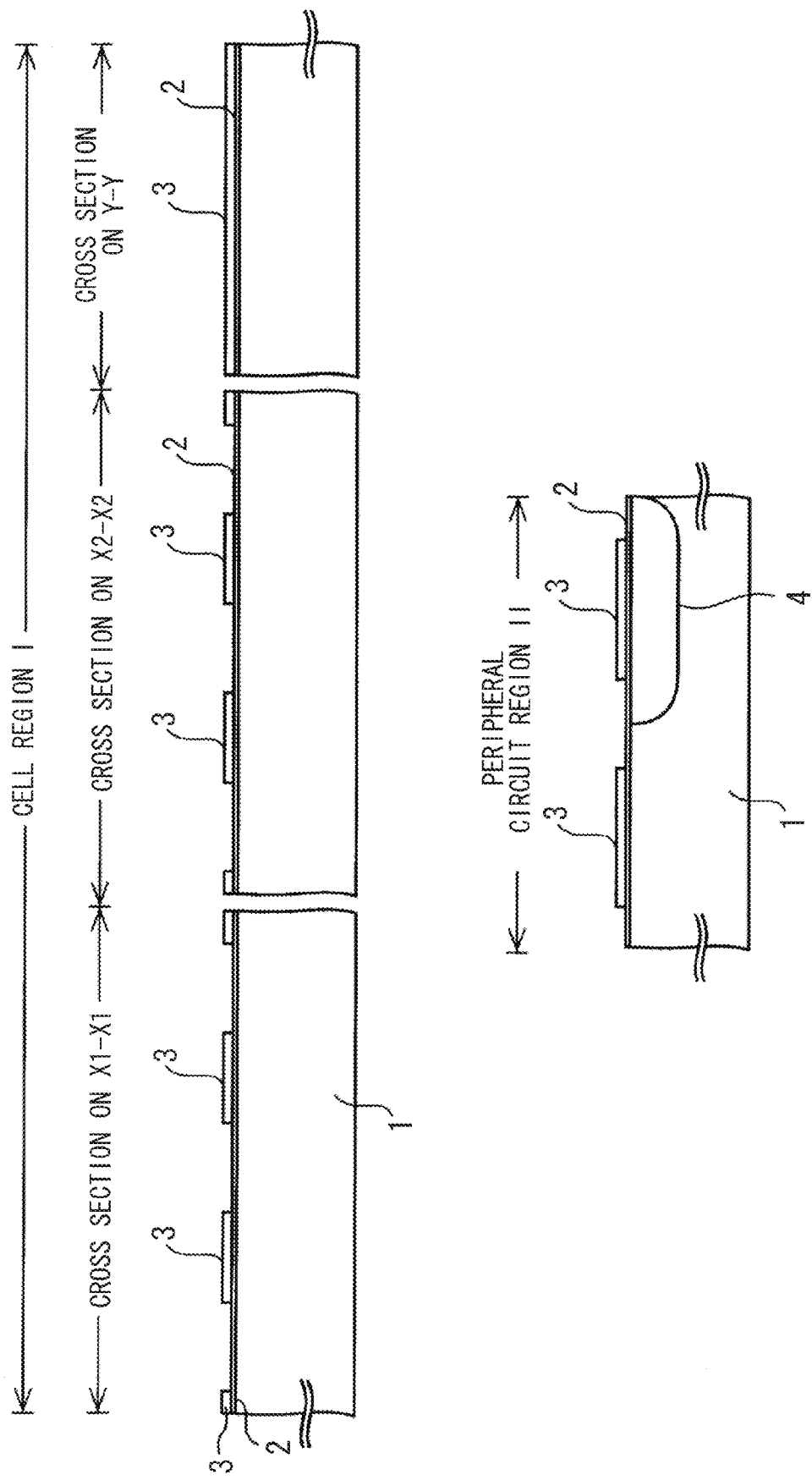

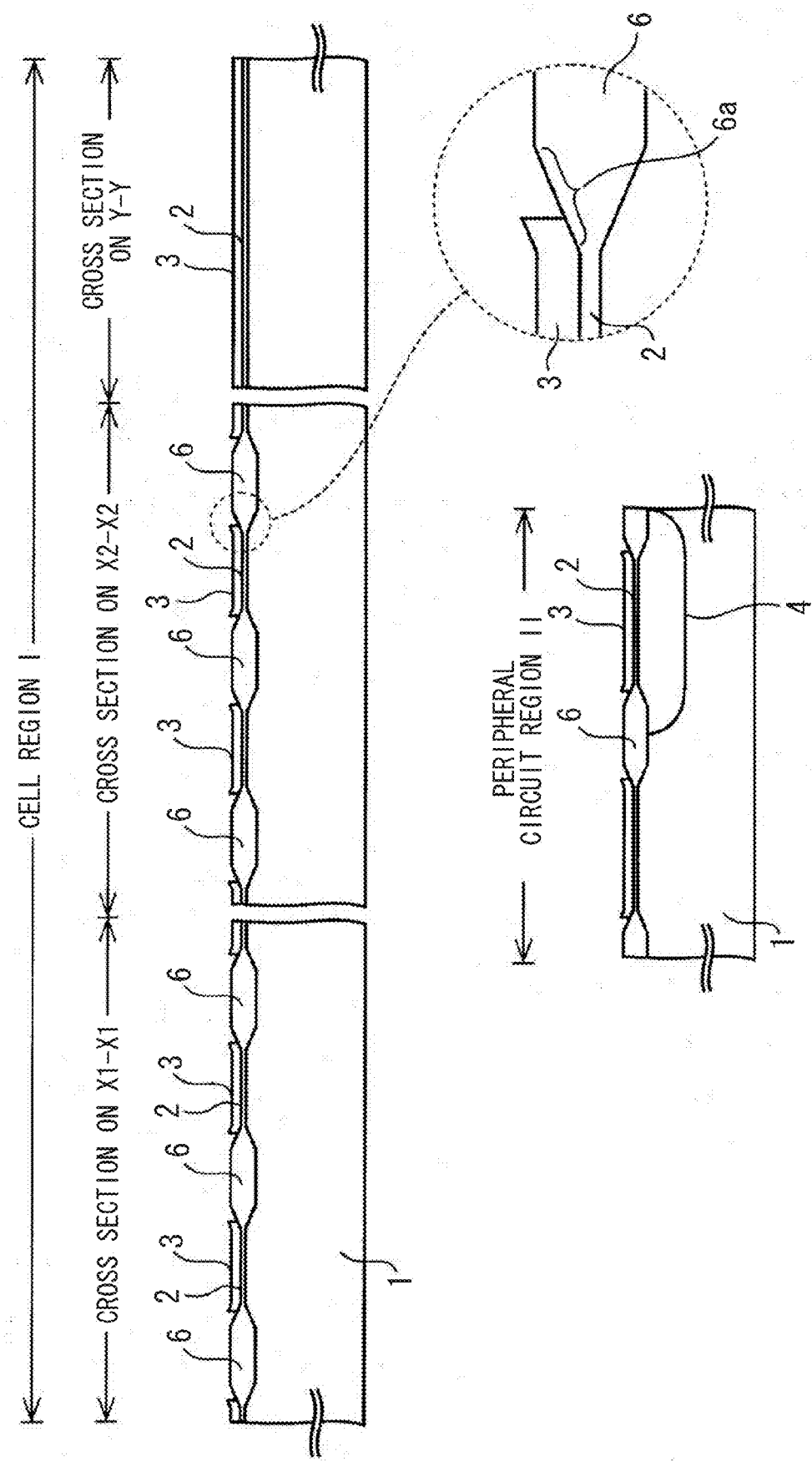

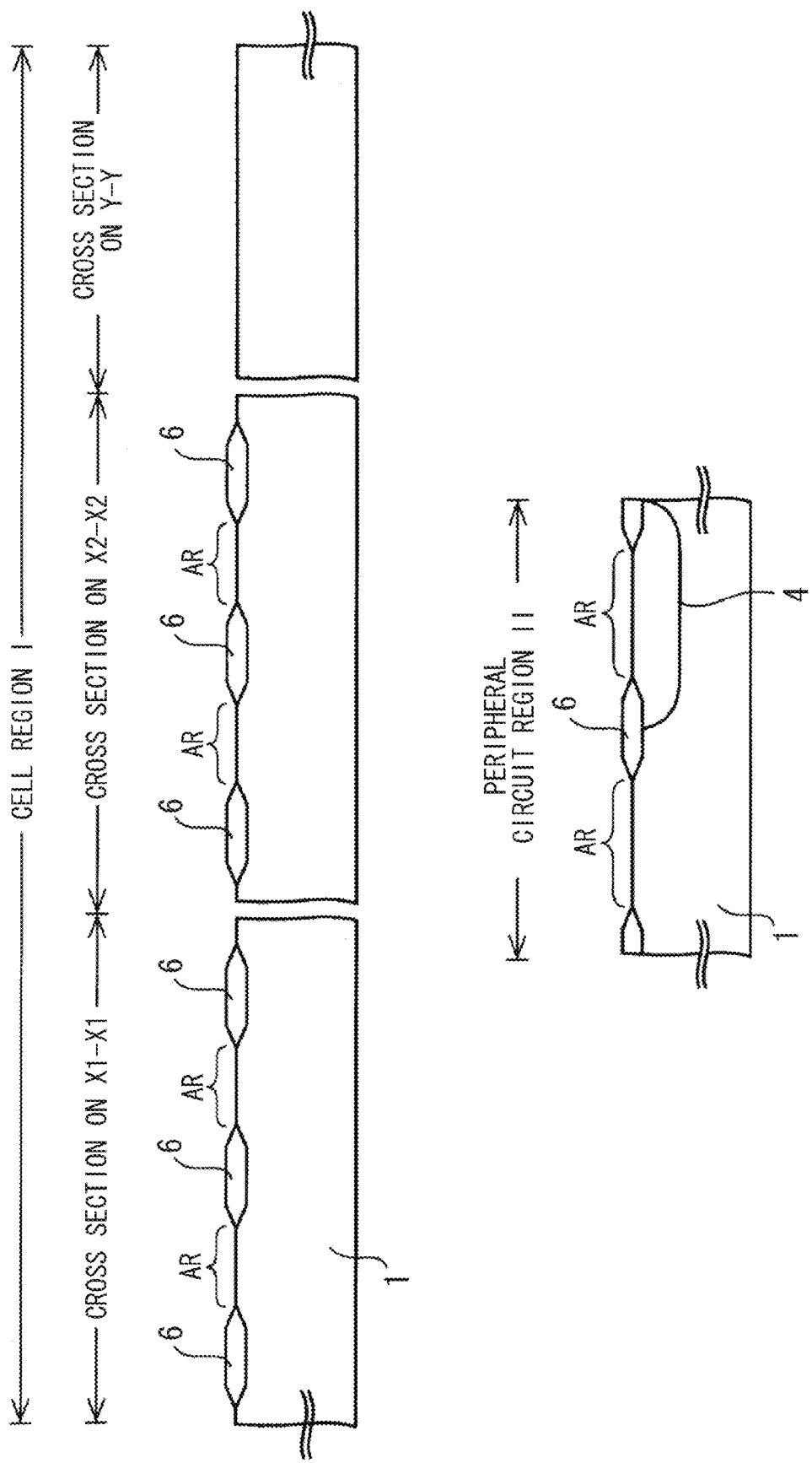

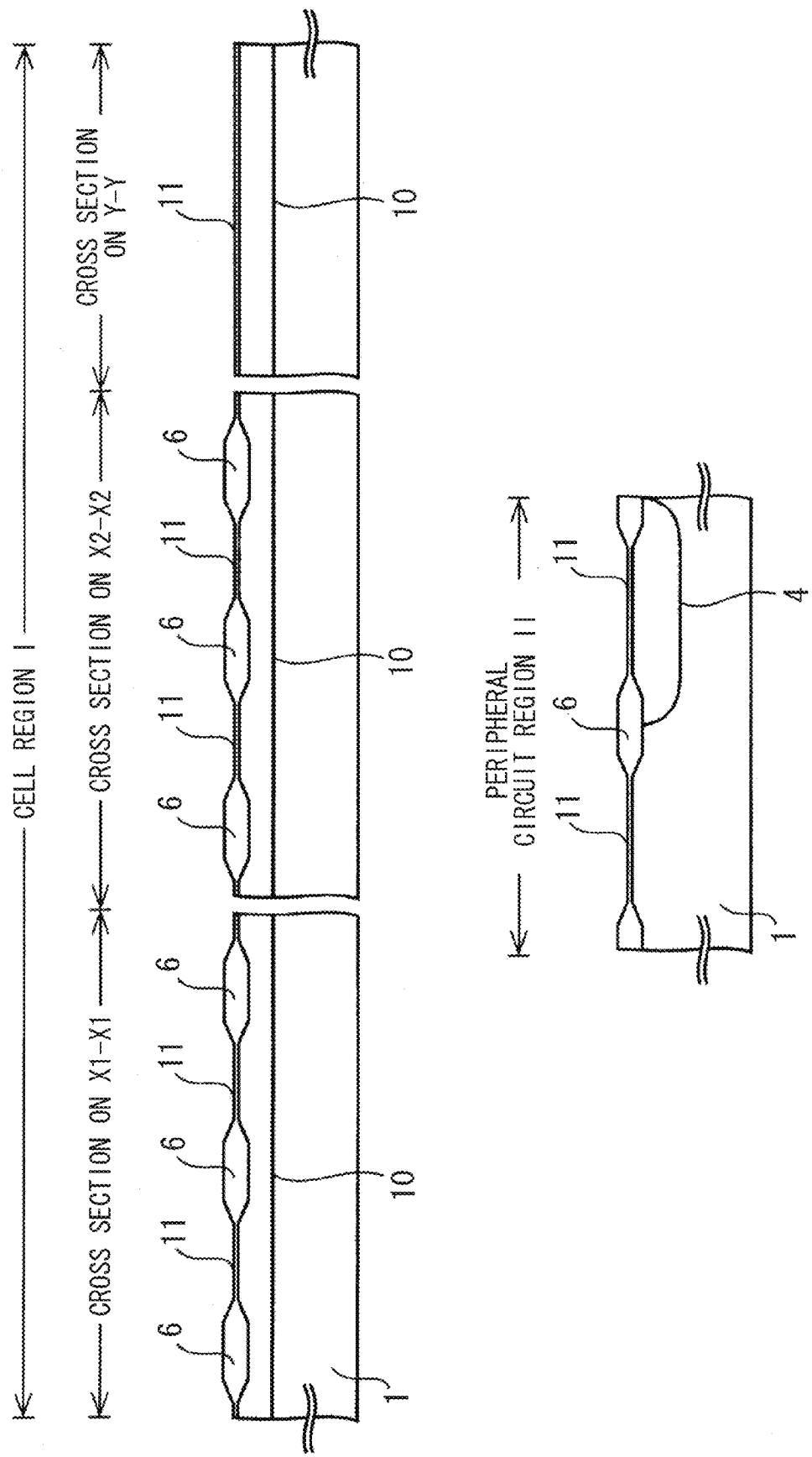

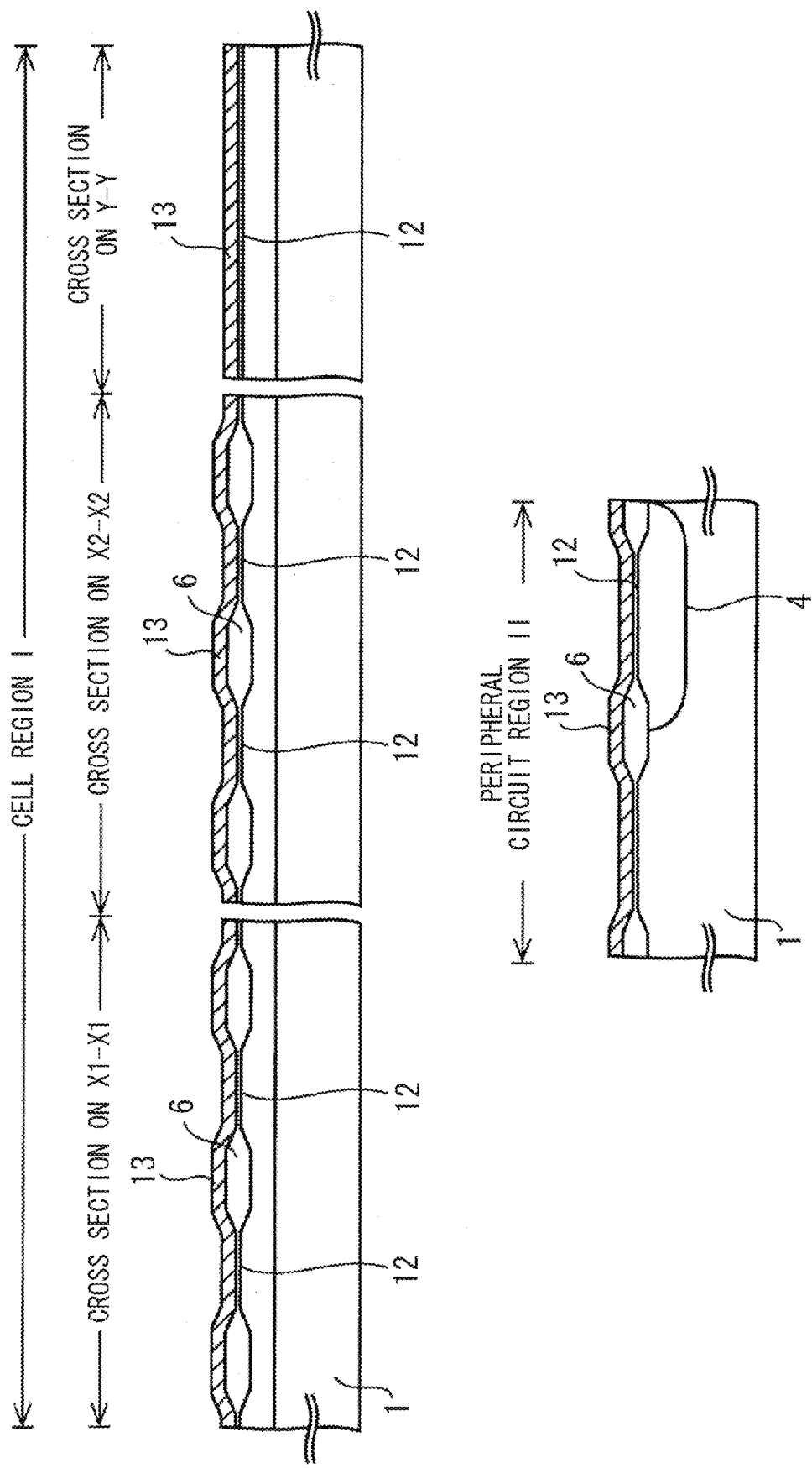

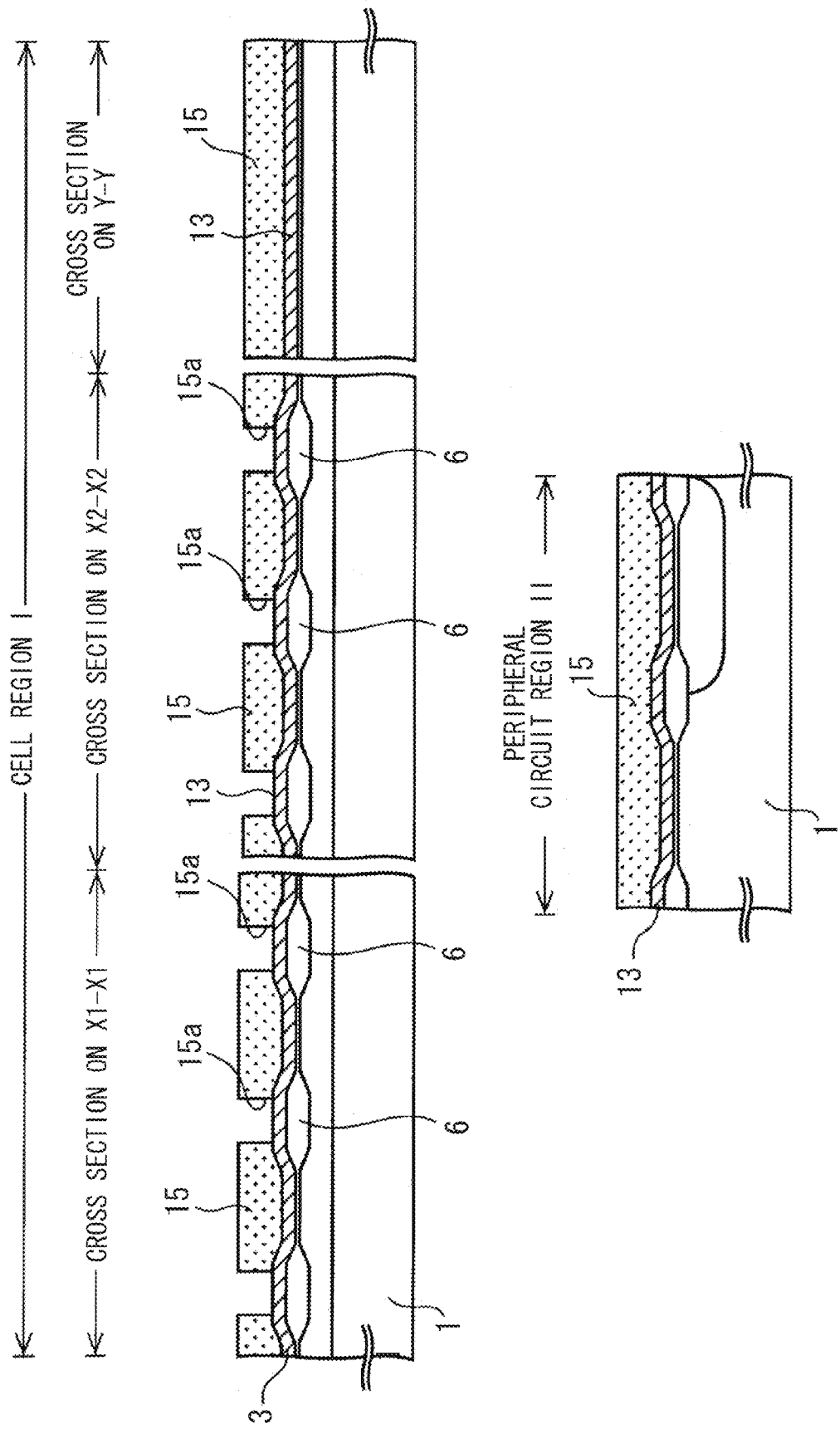

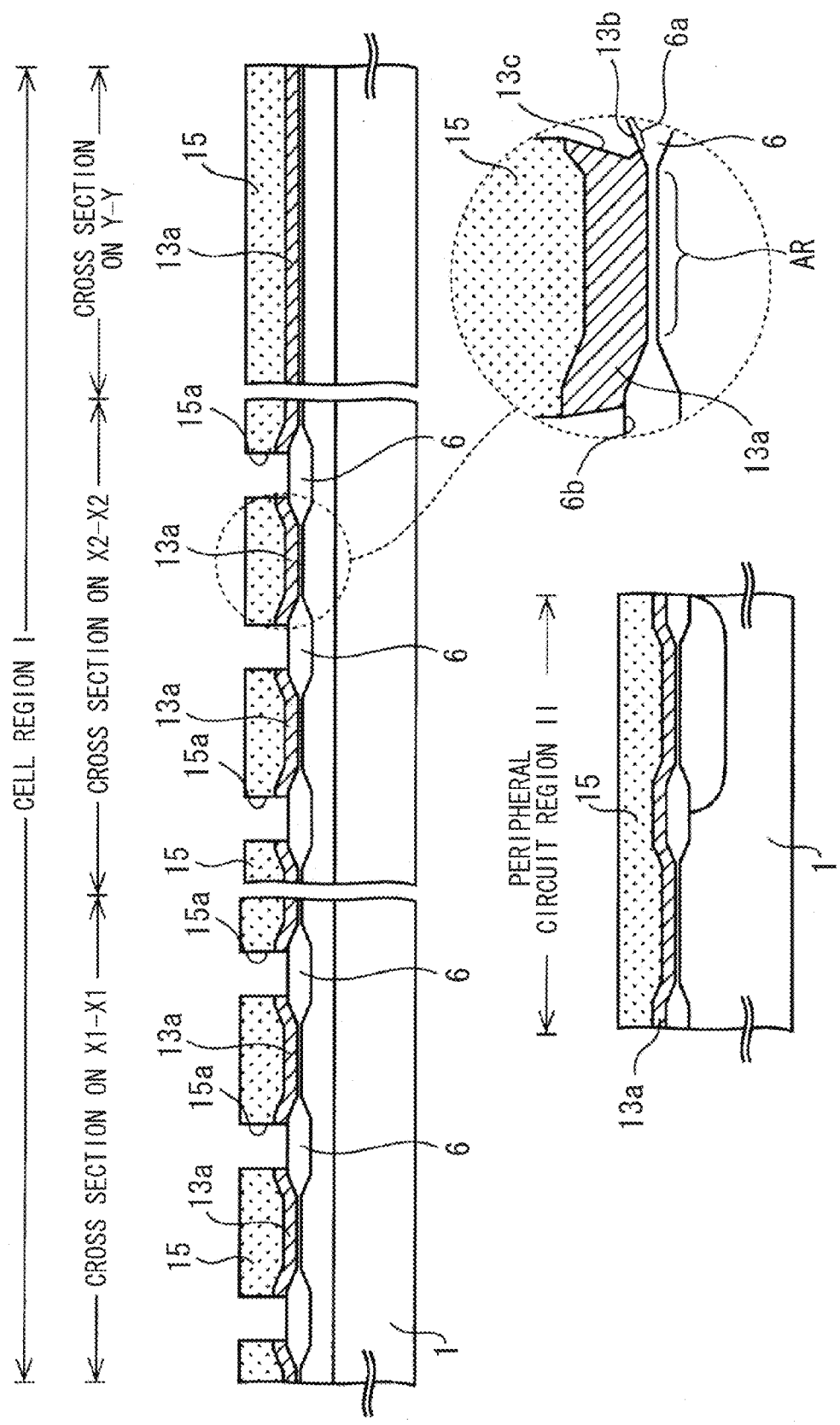

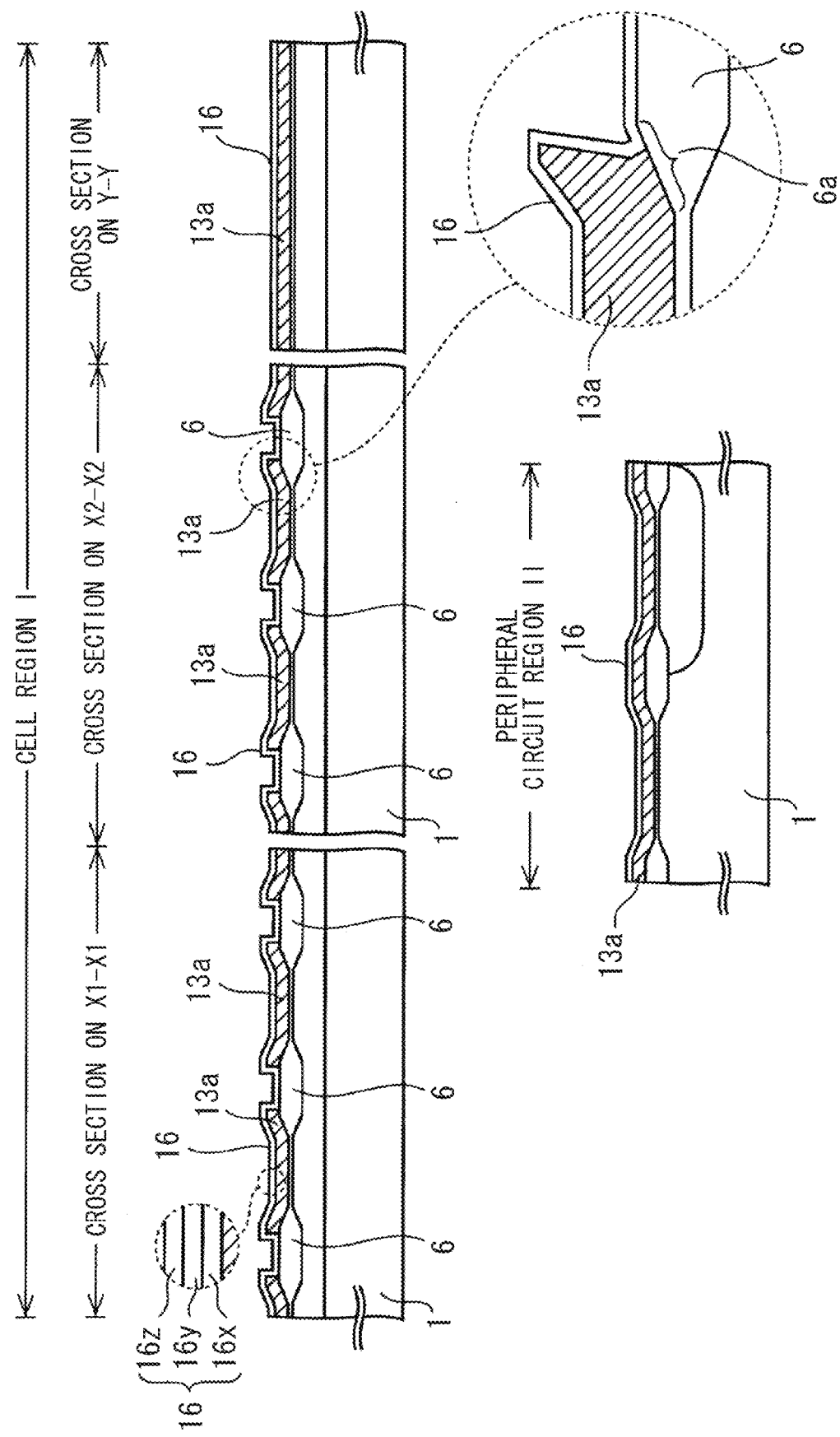

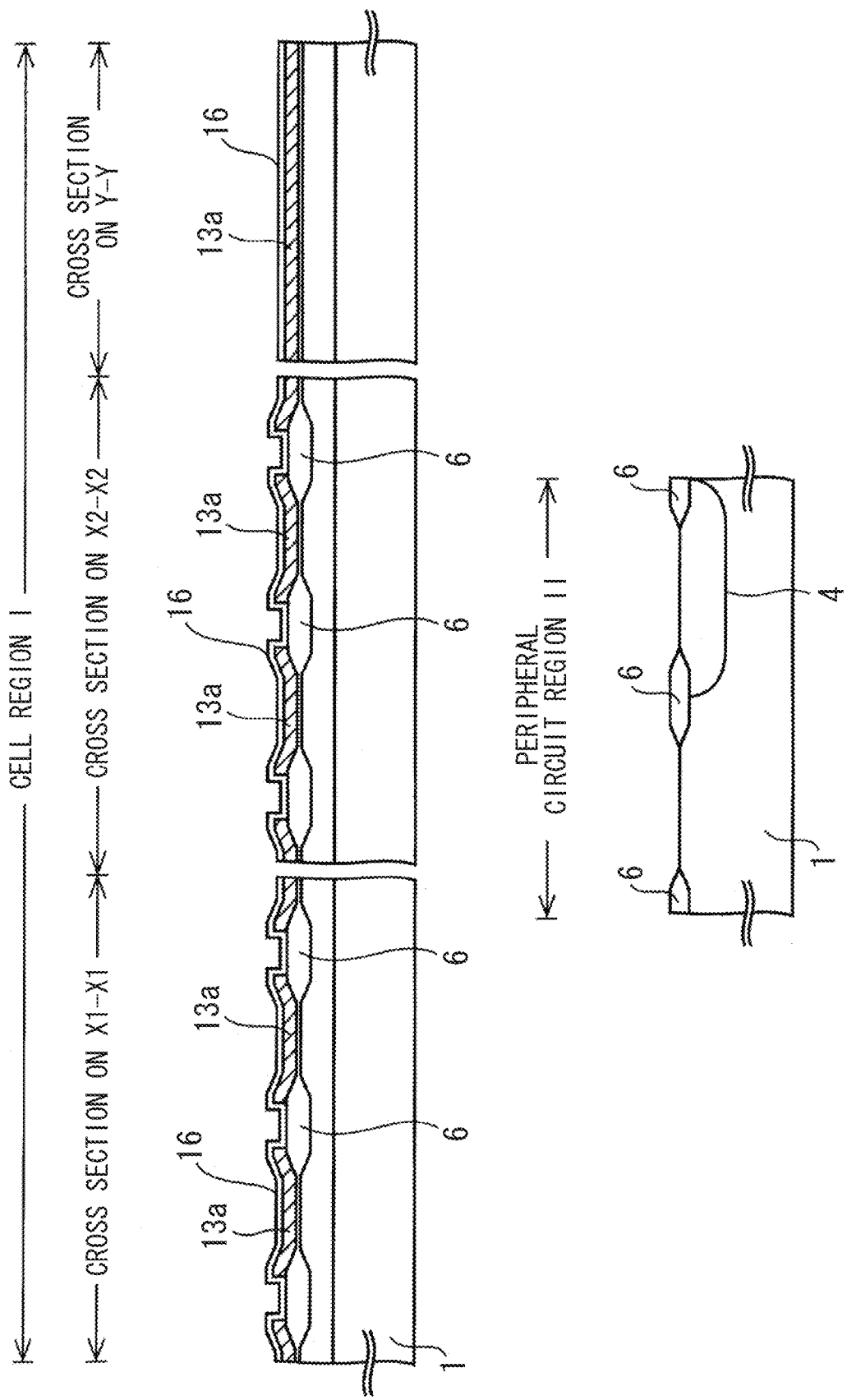

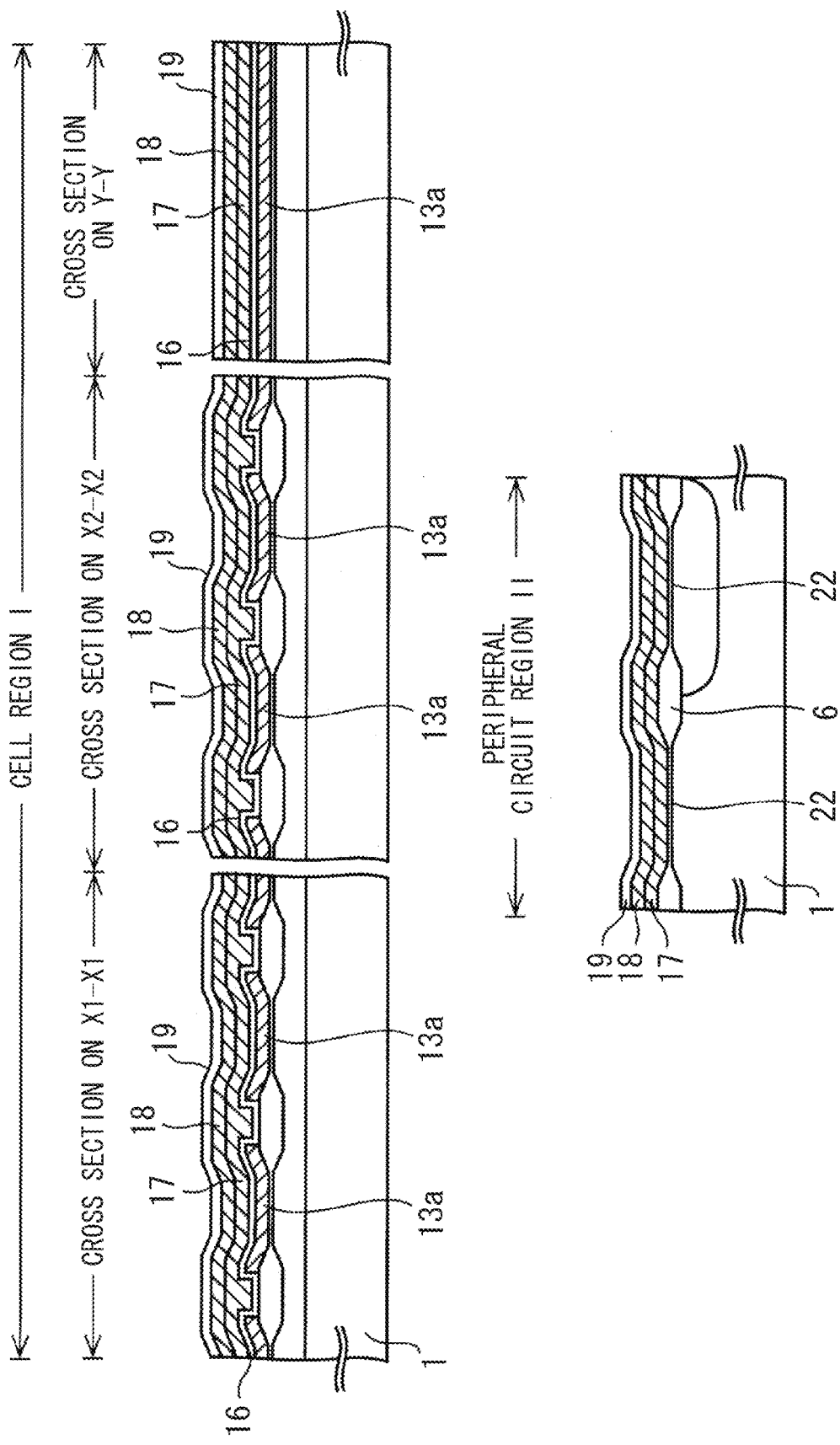

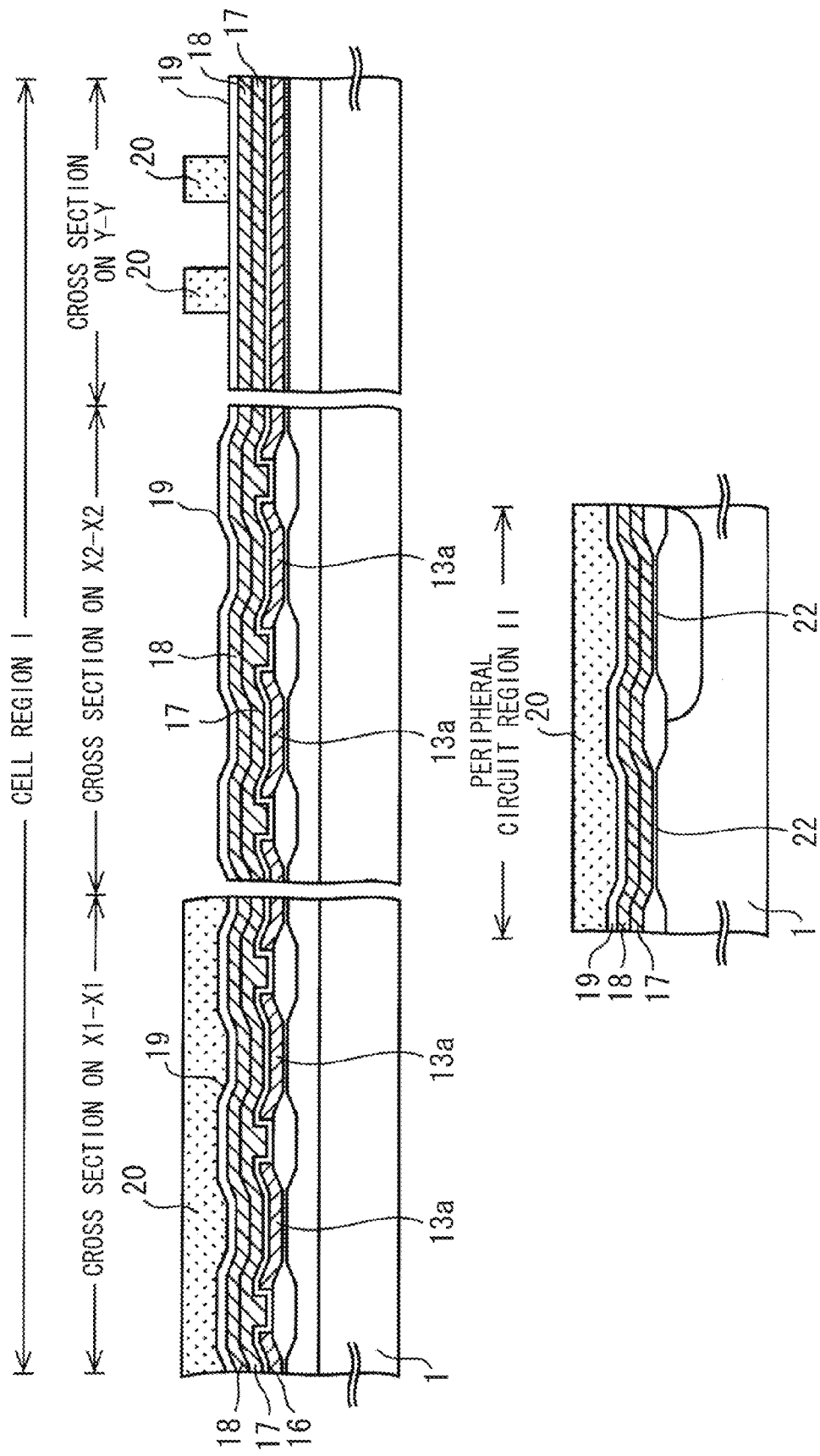

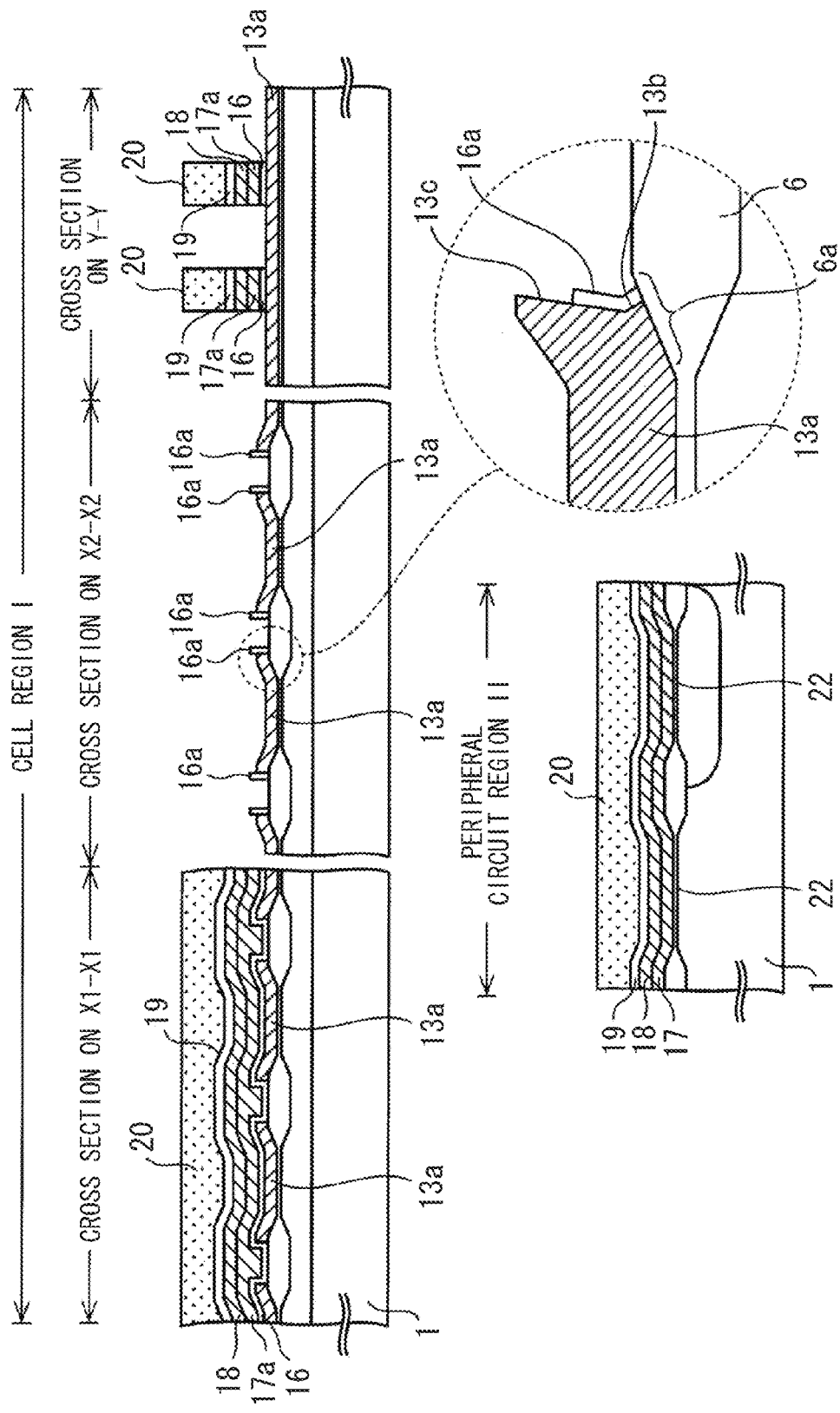

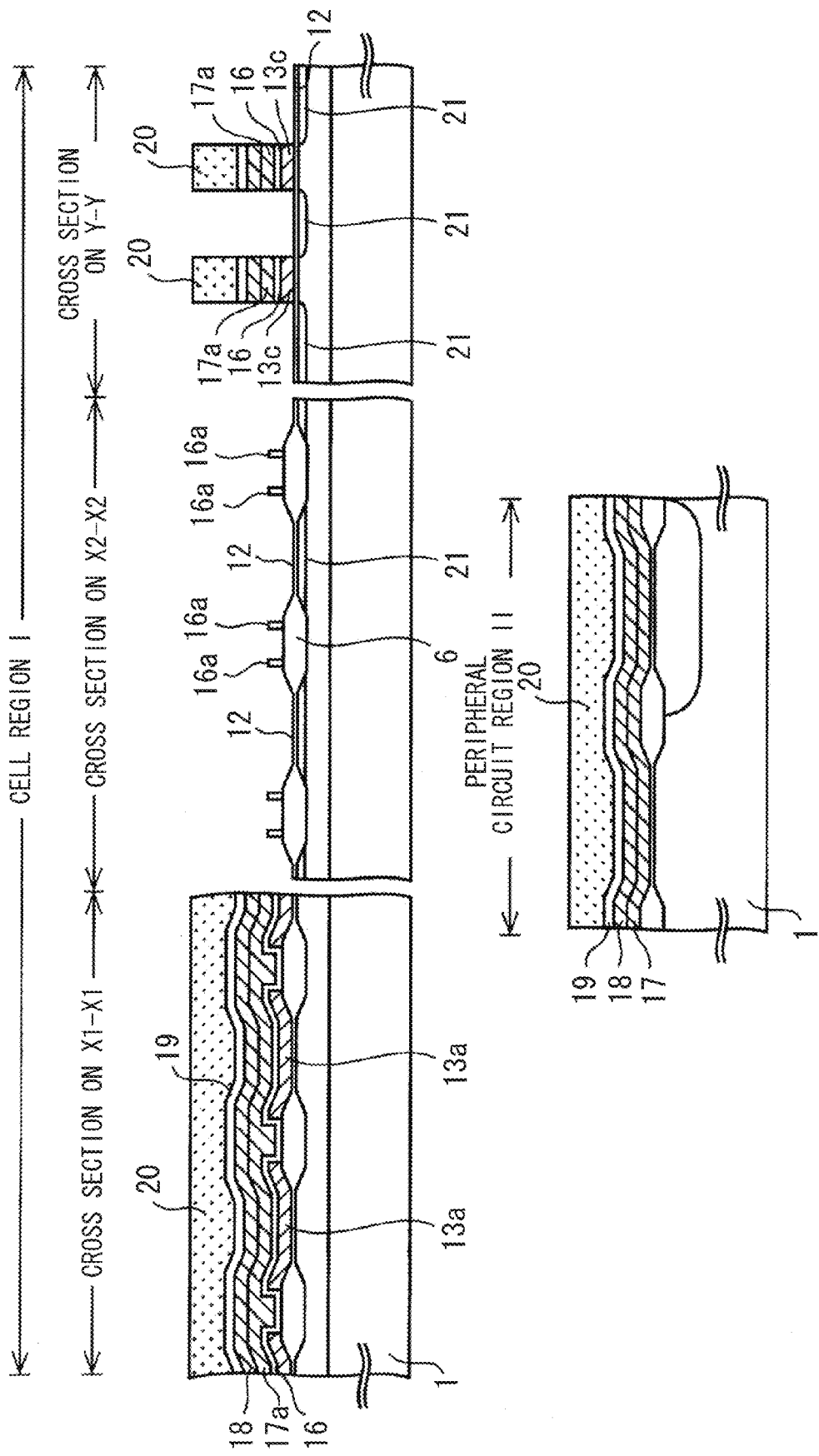

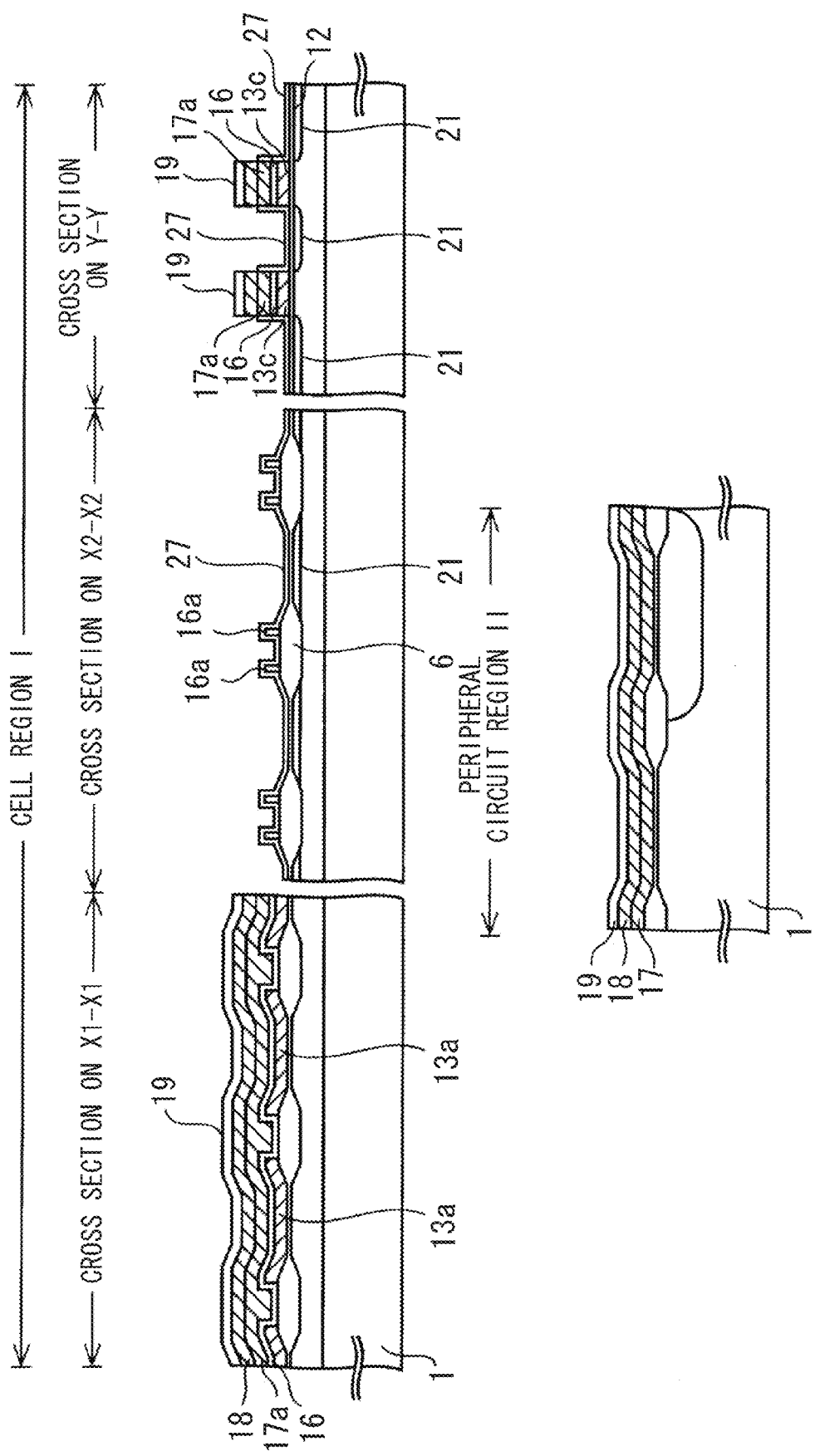

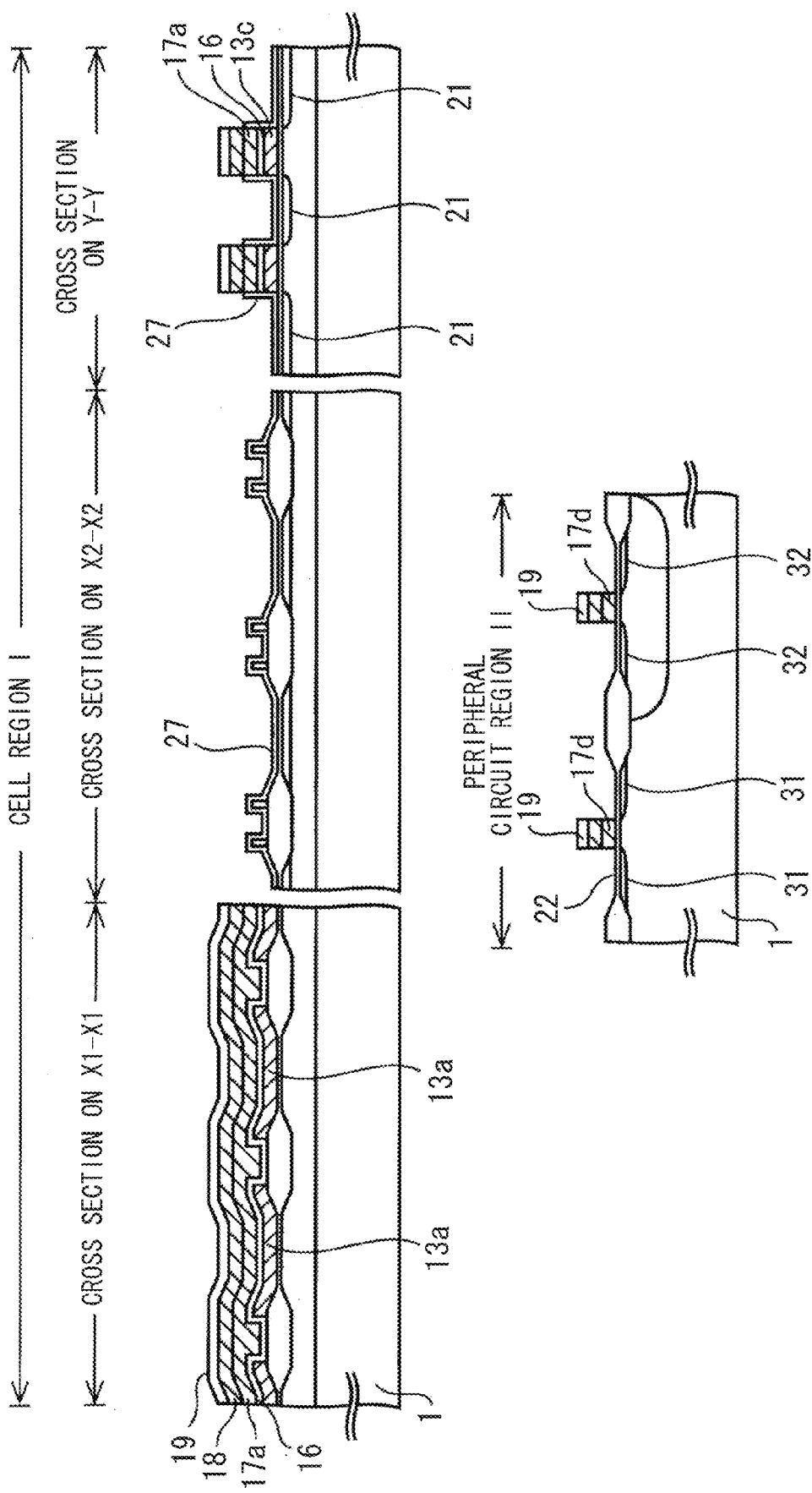

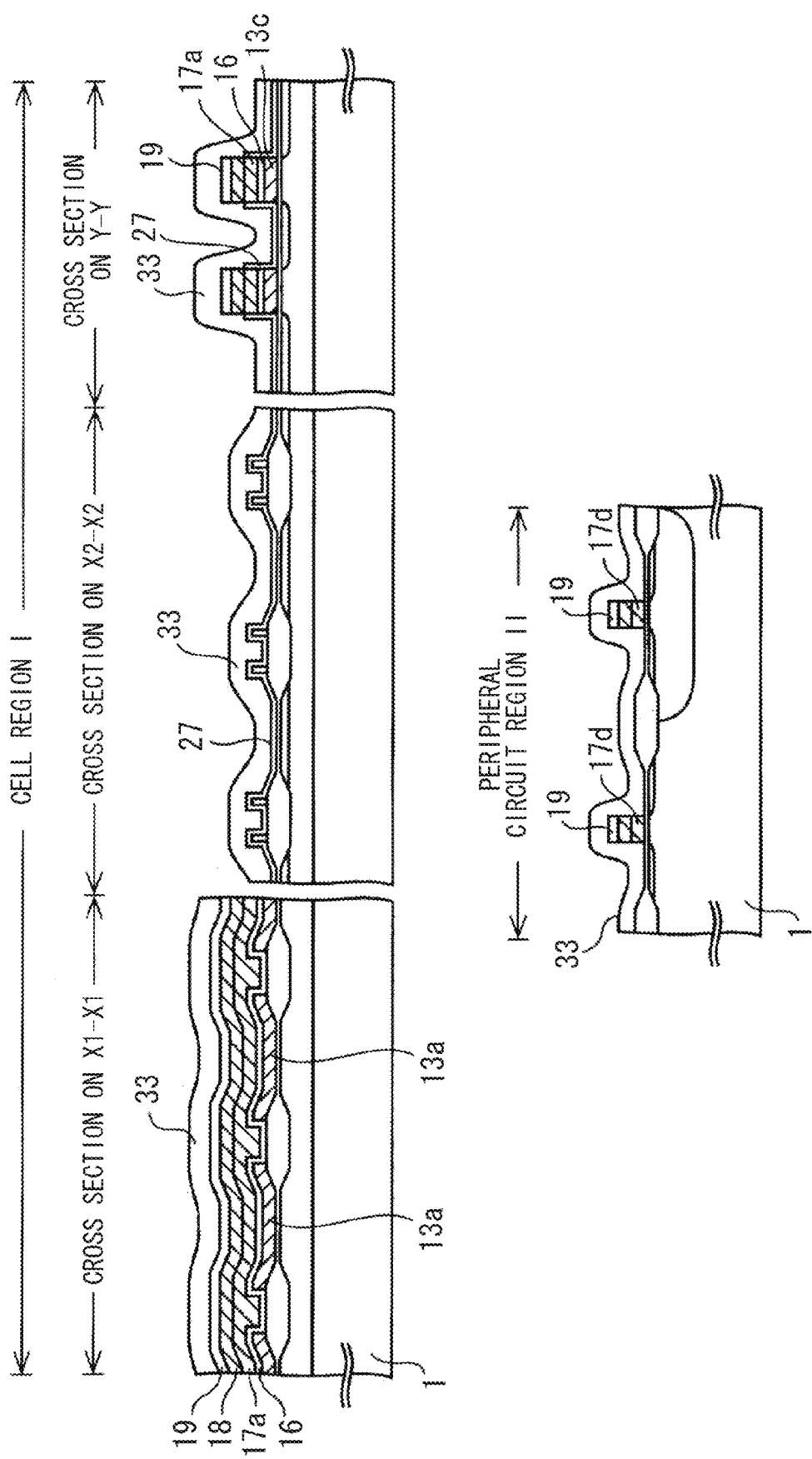

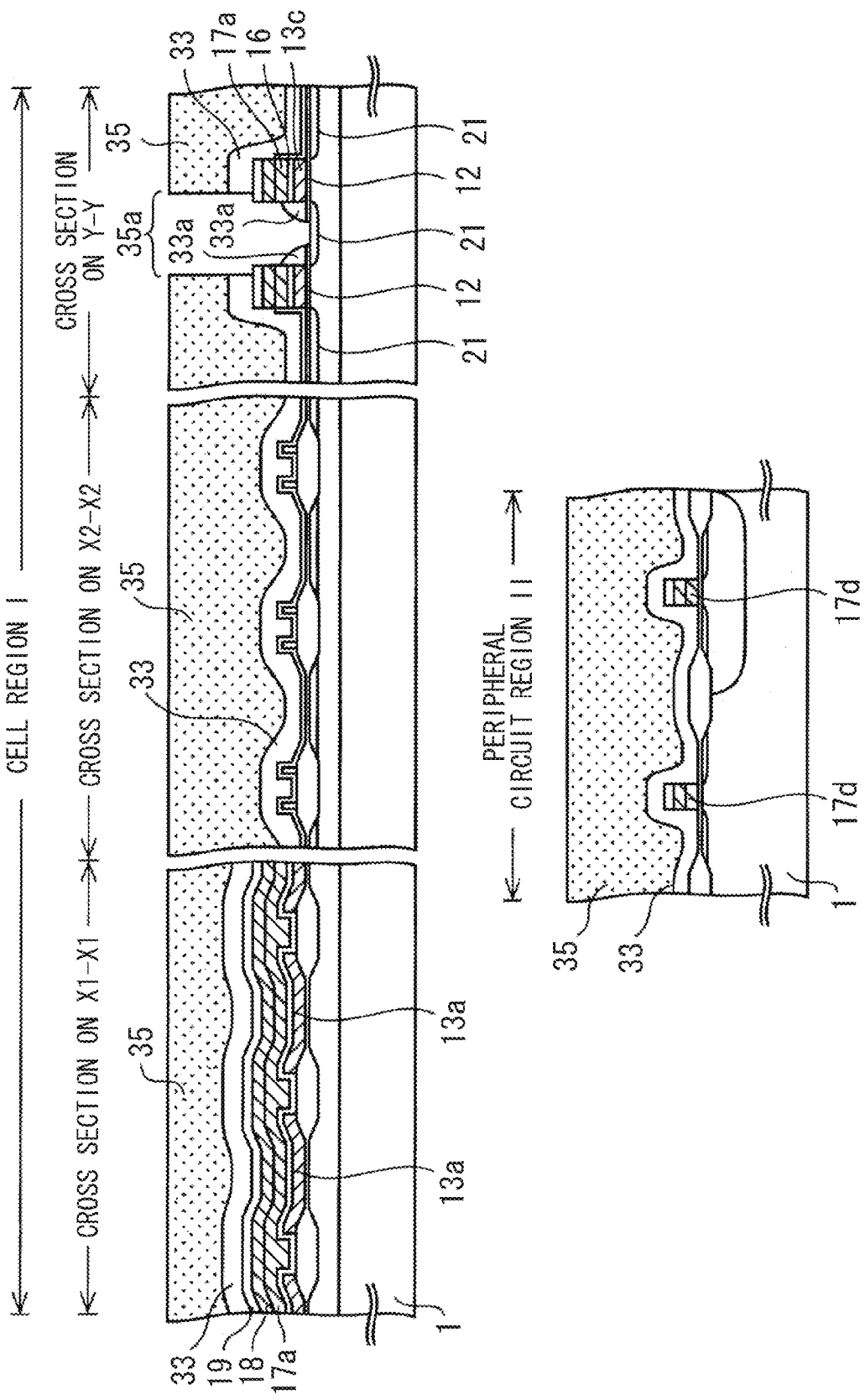

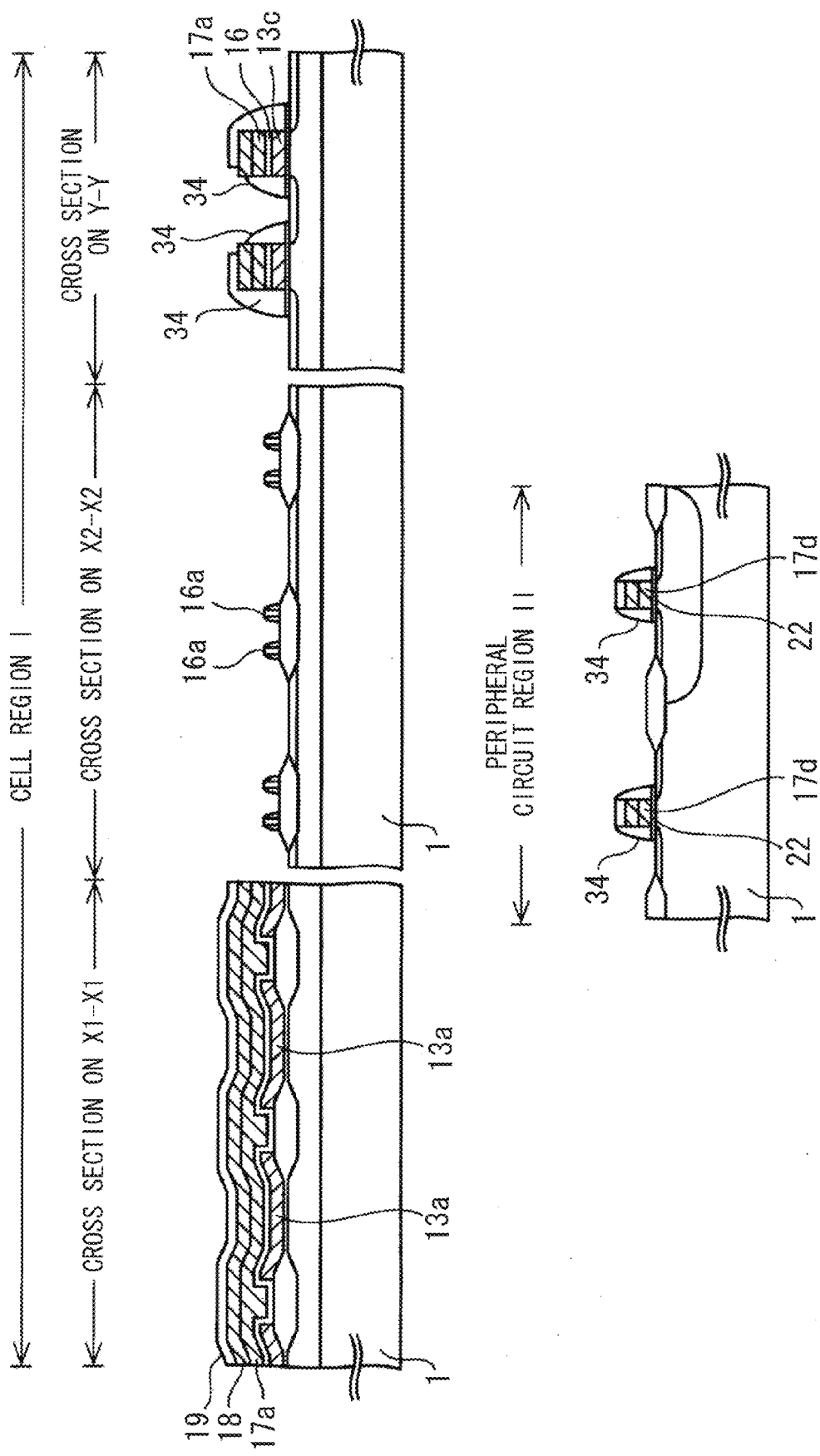

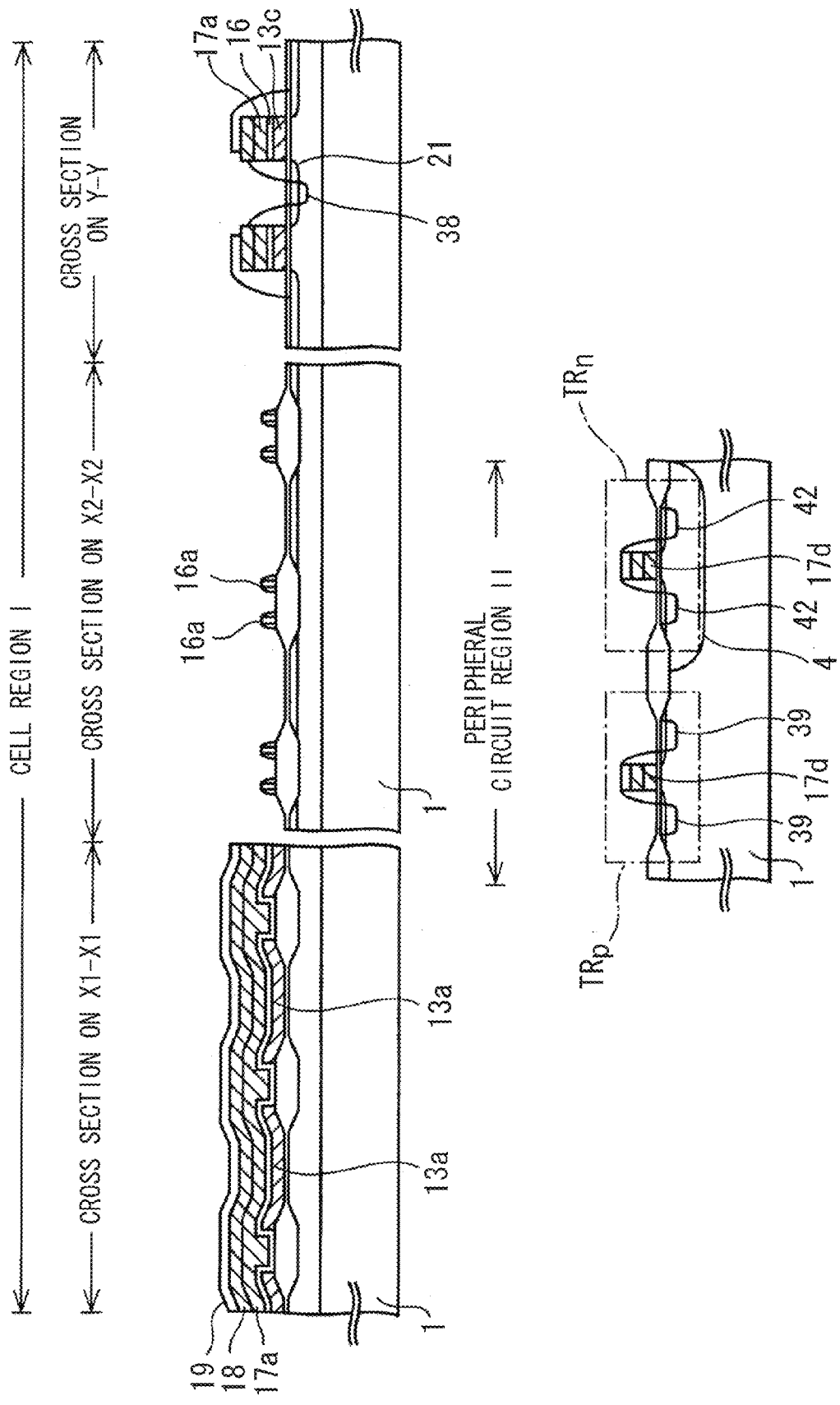

FIG. 2A
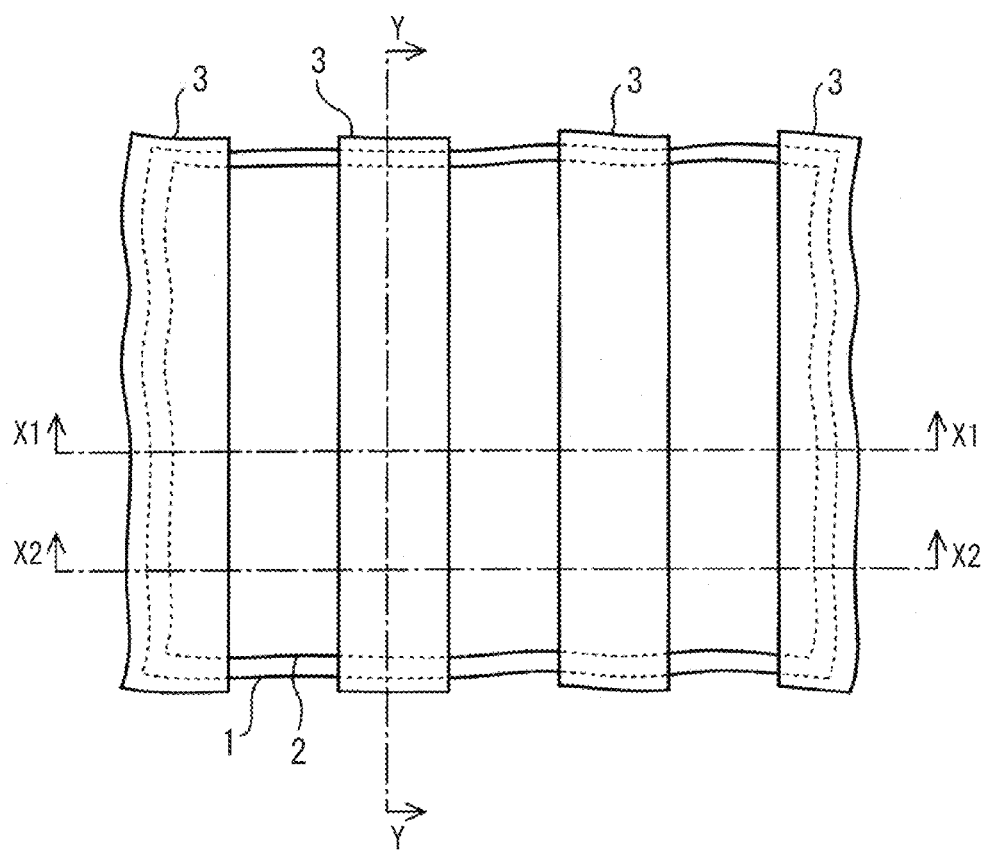
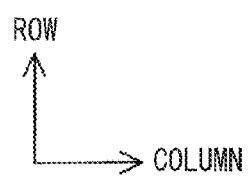

FIG. 2D
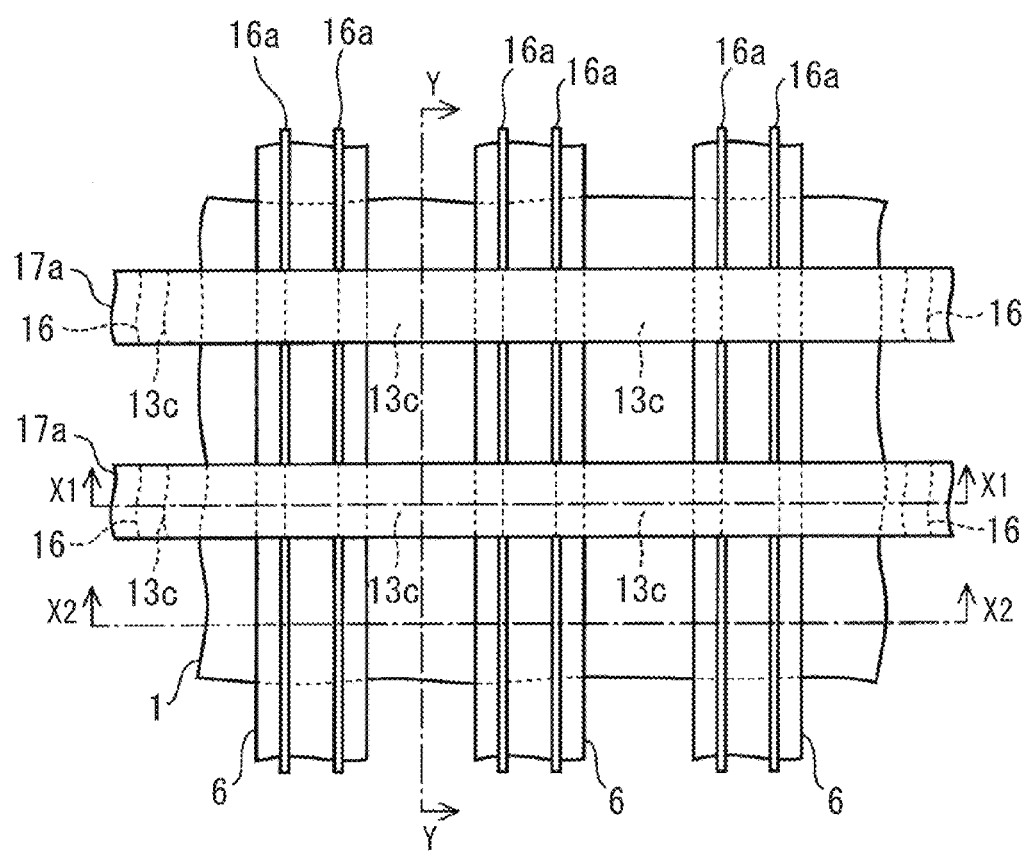
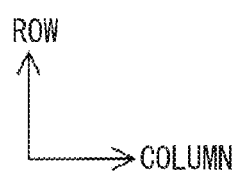

FIG. 2E
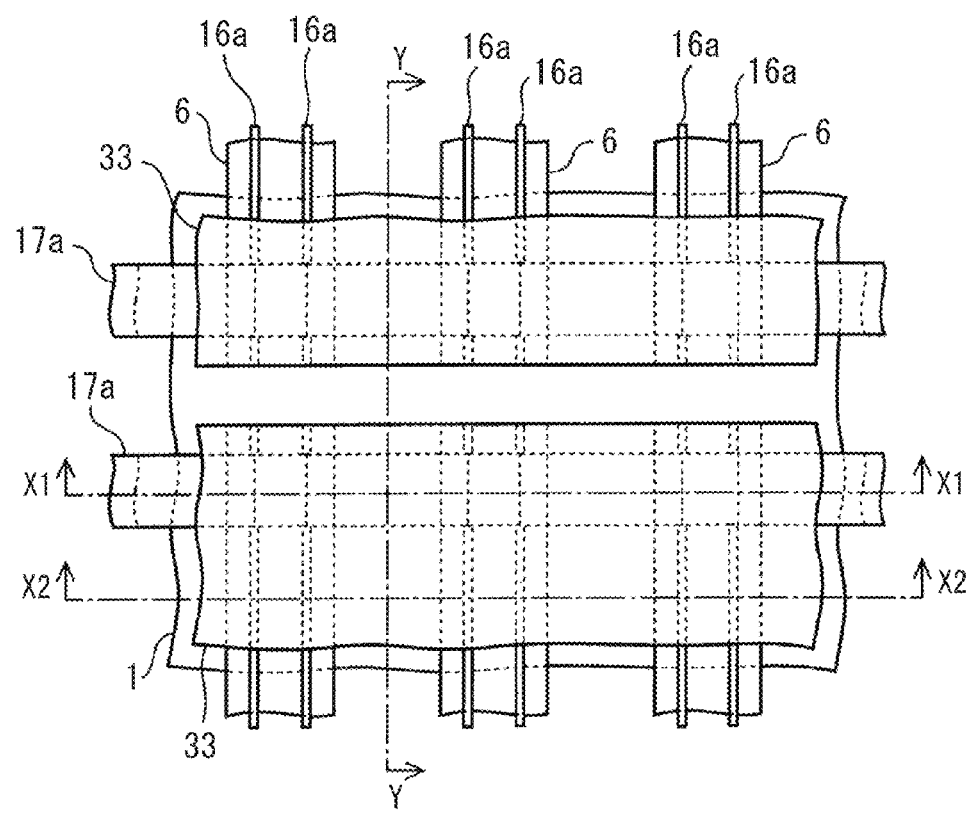
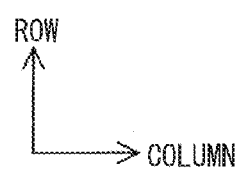

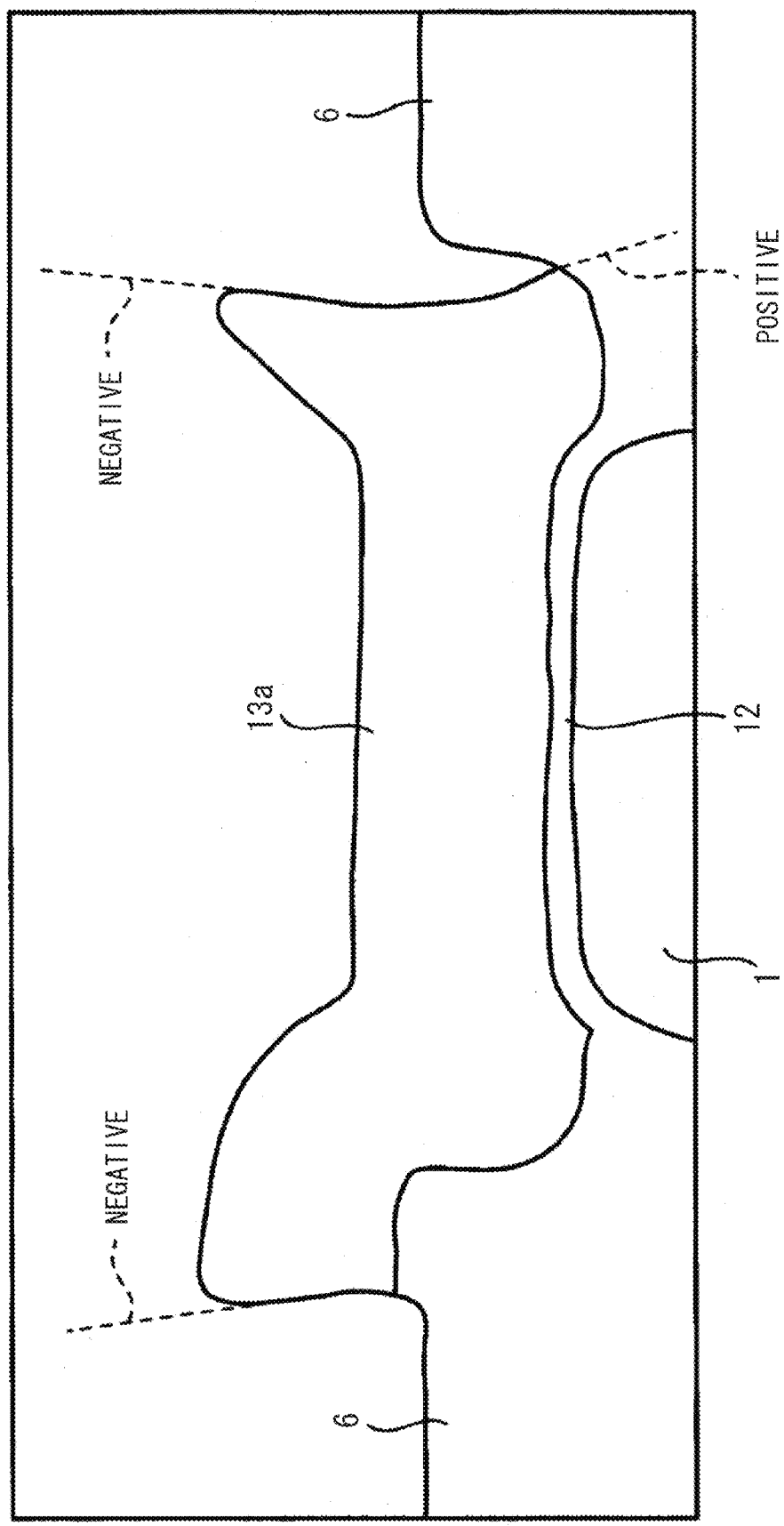

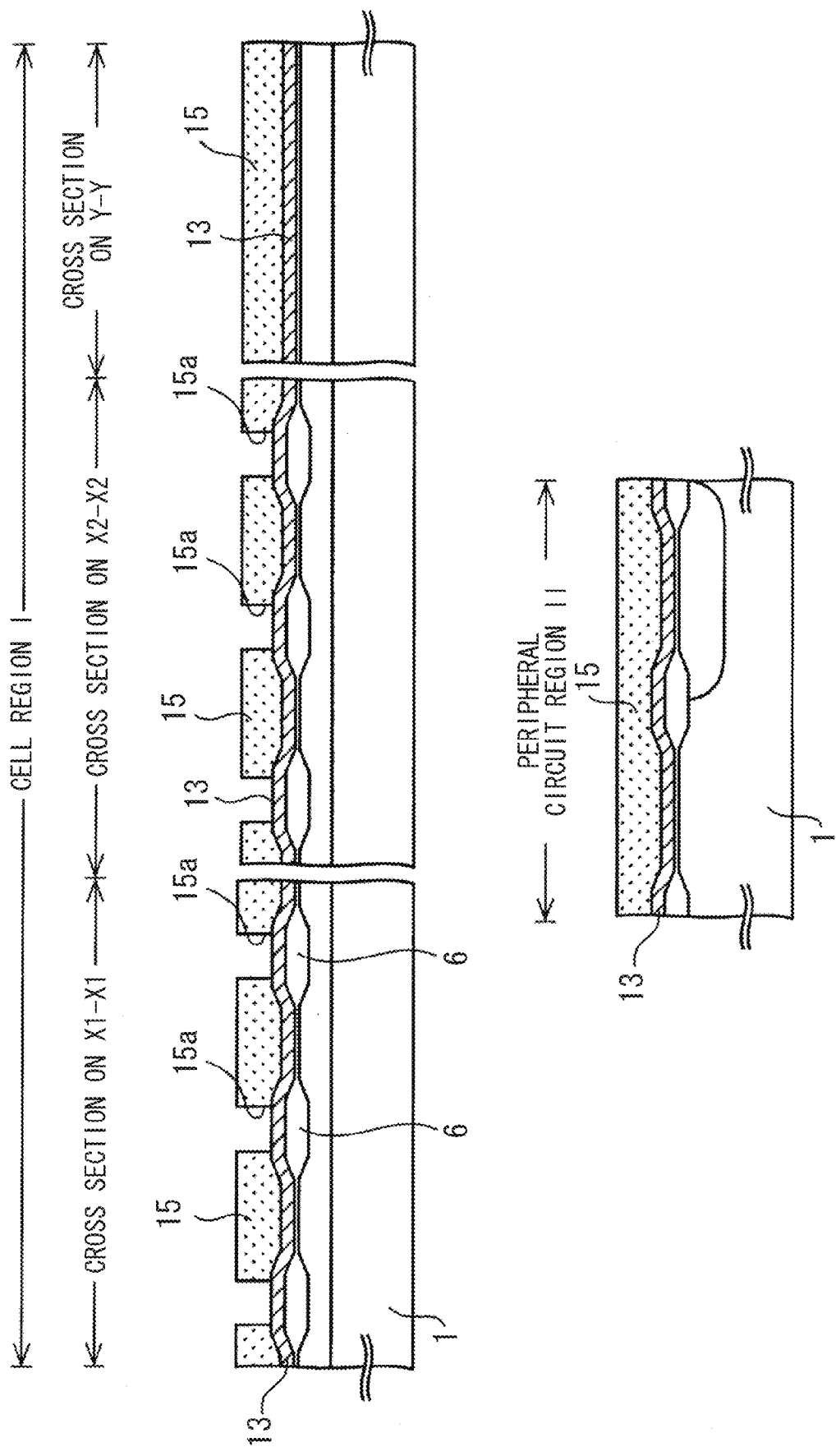

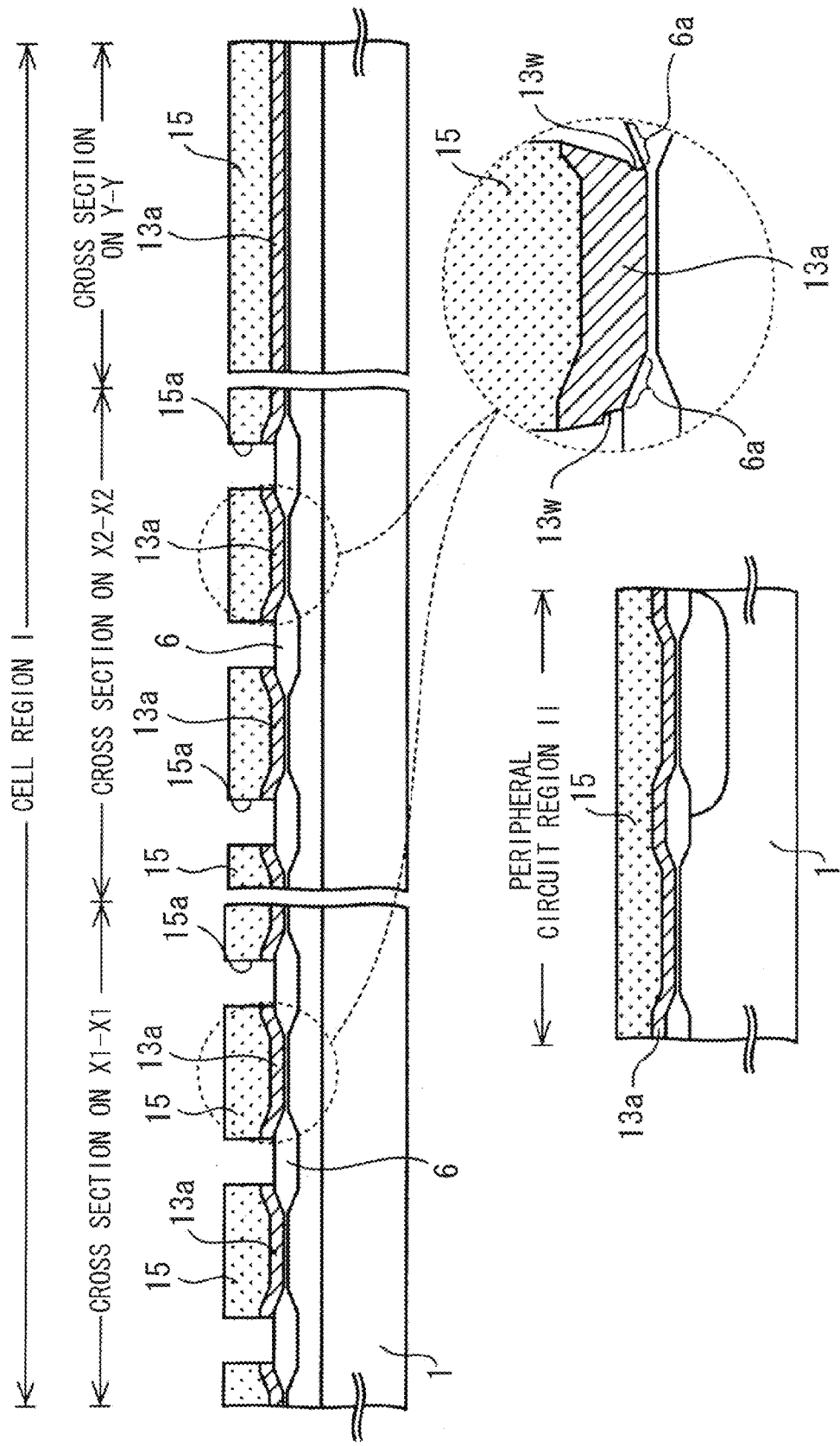

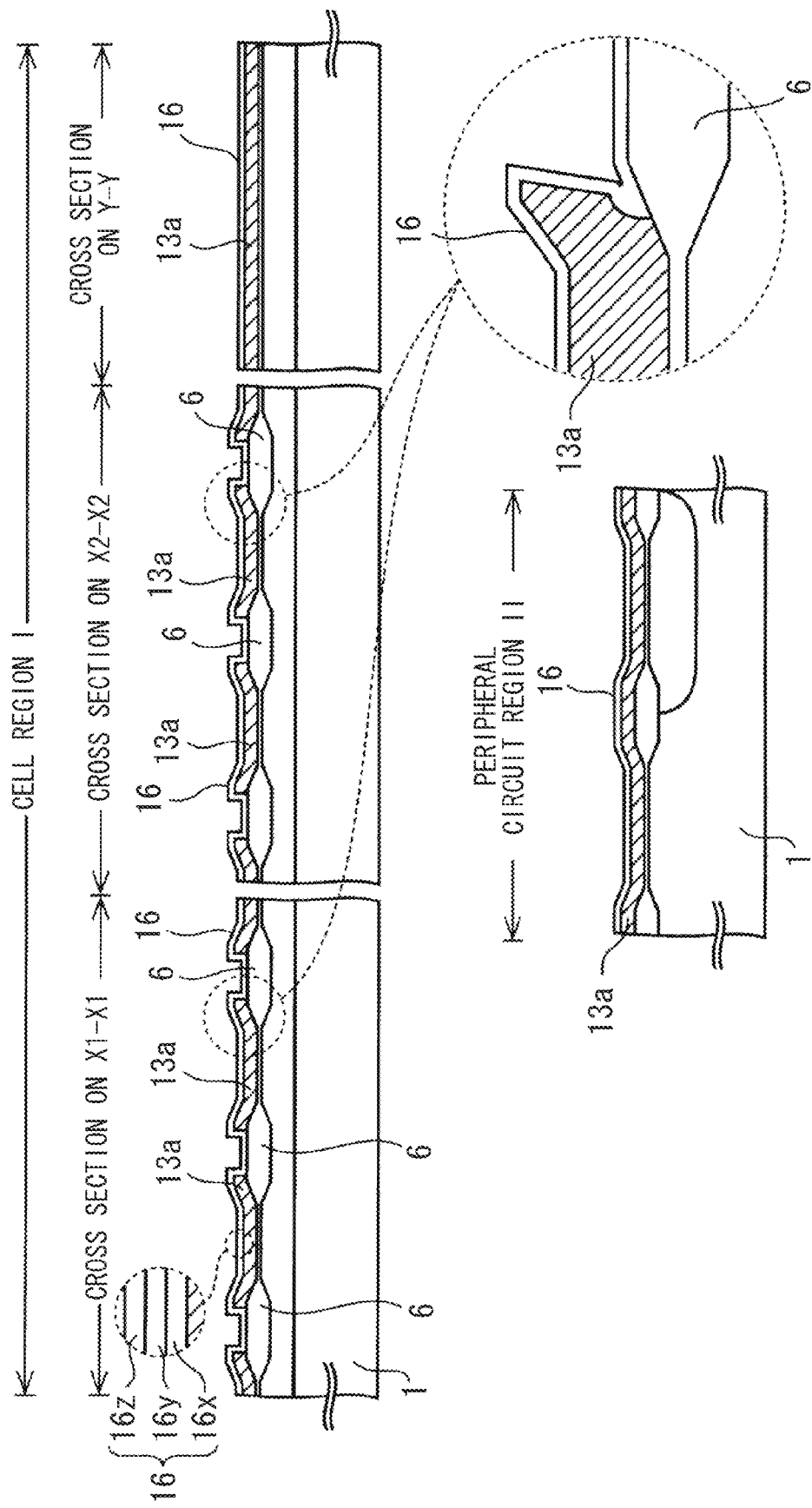

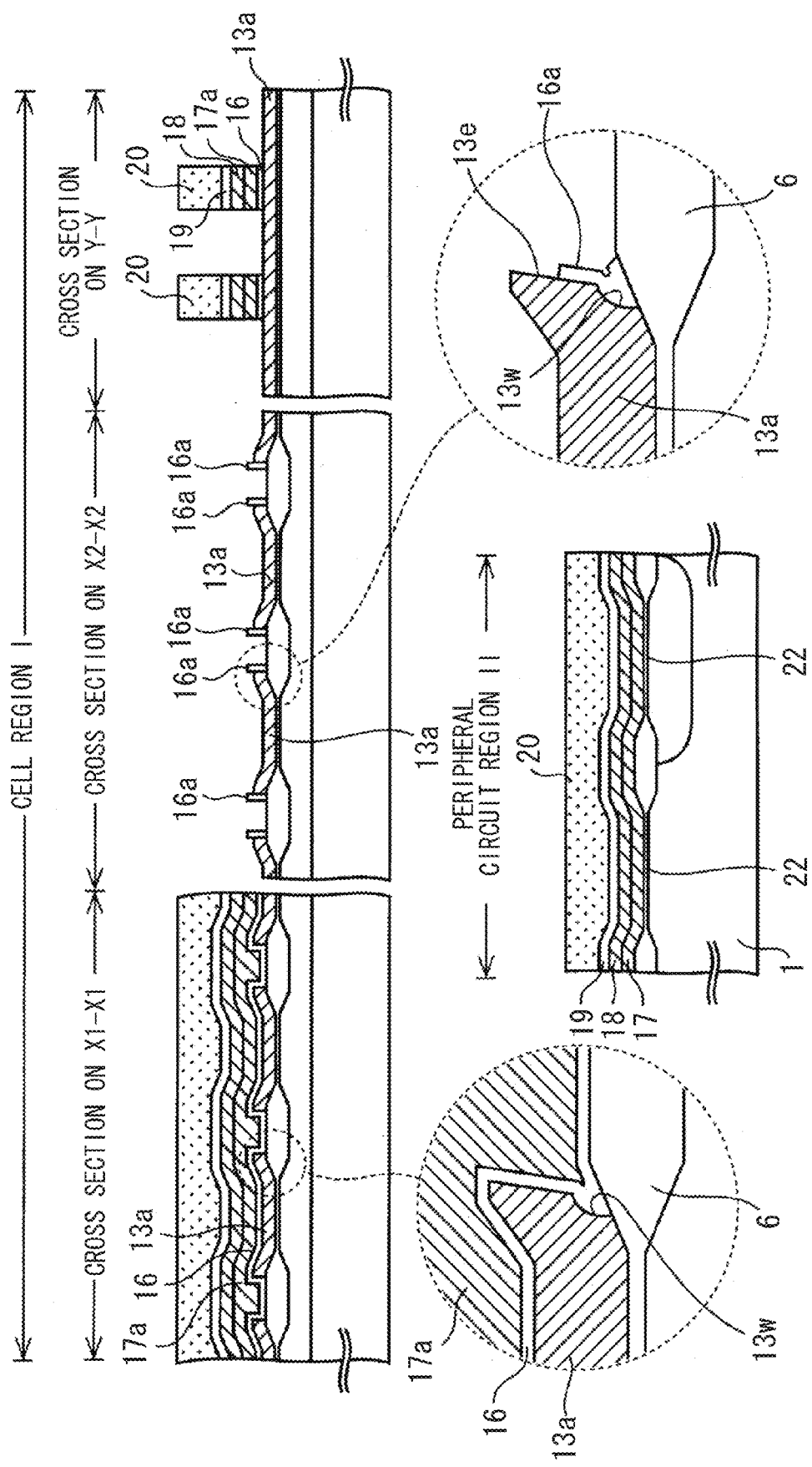

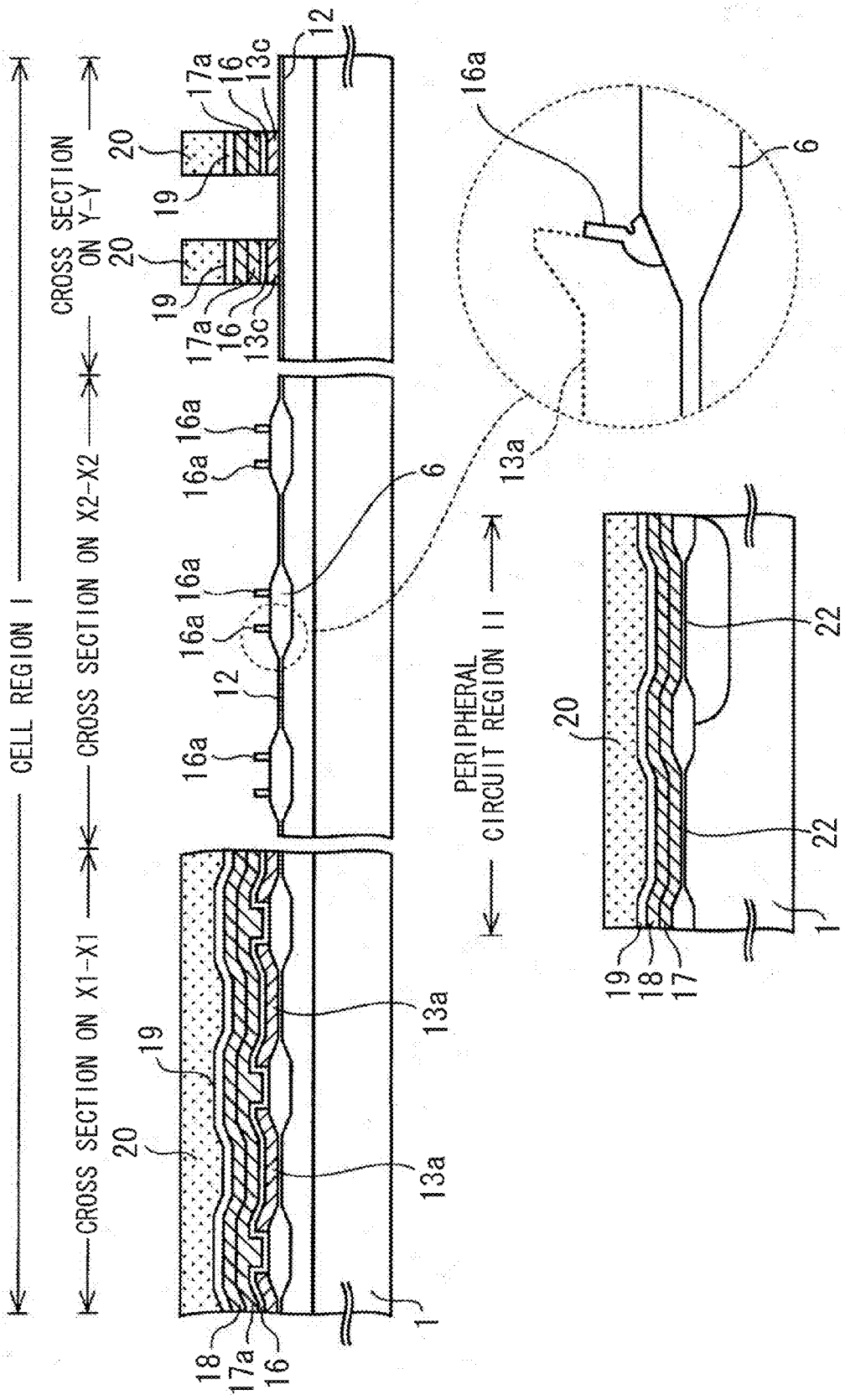

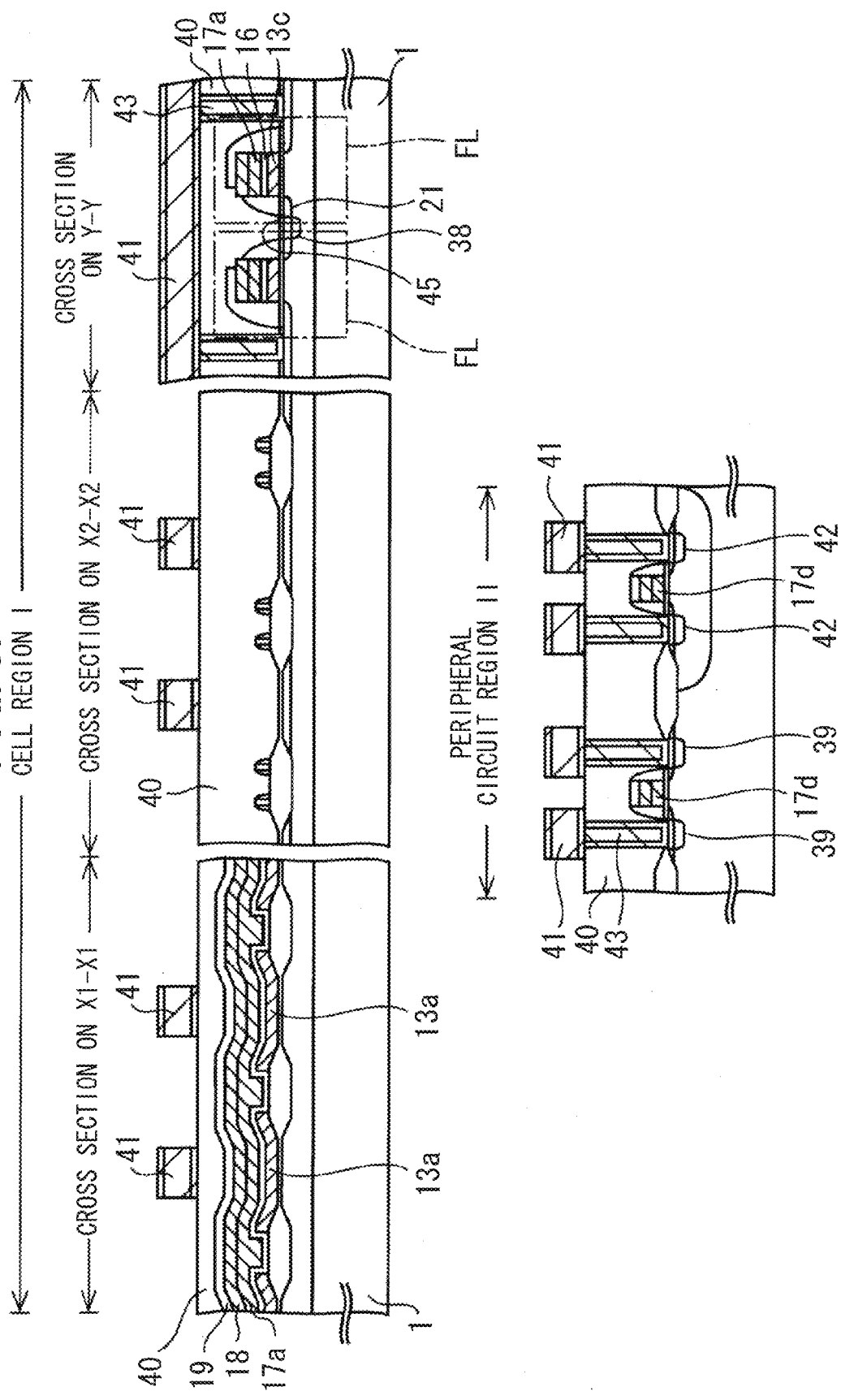

FIG. 6A
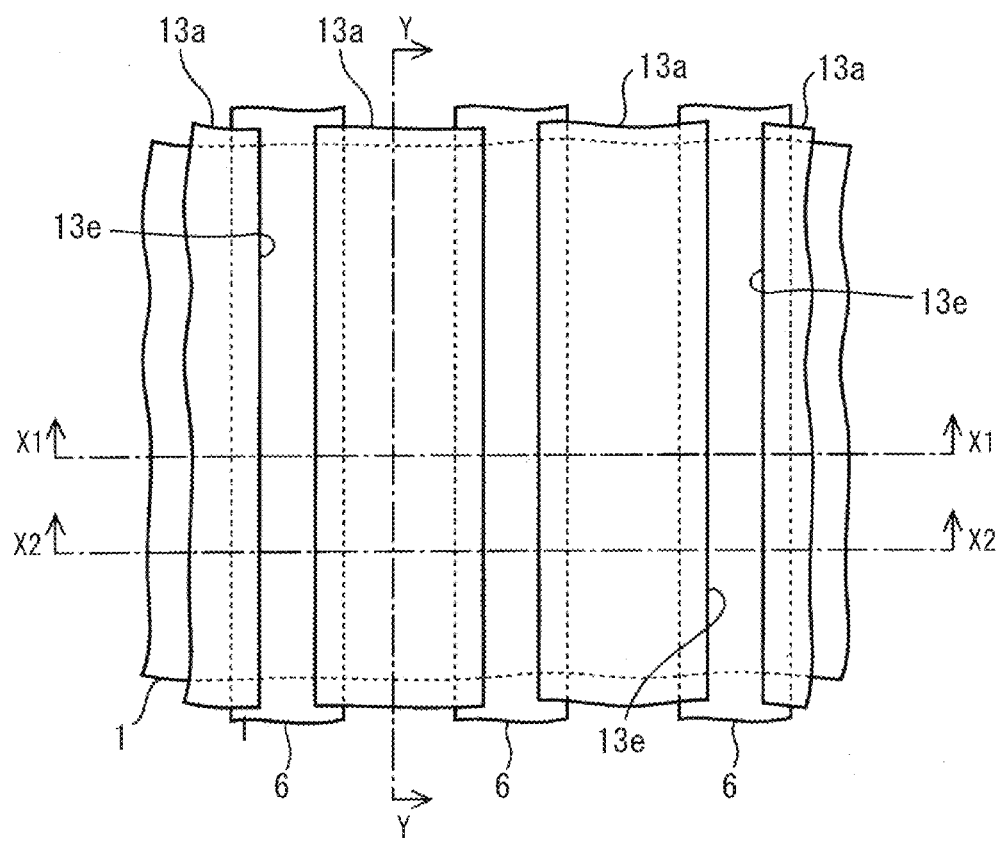
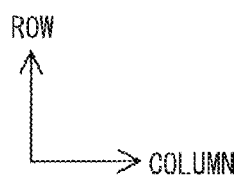

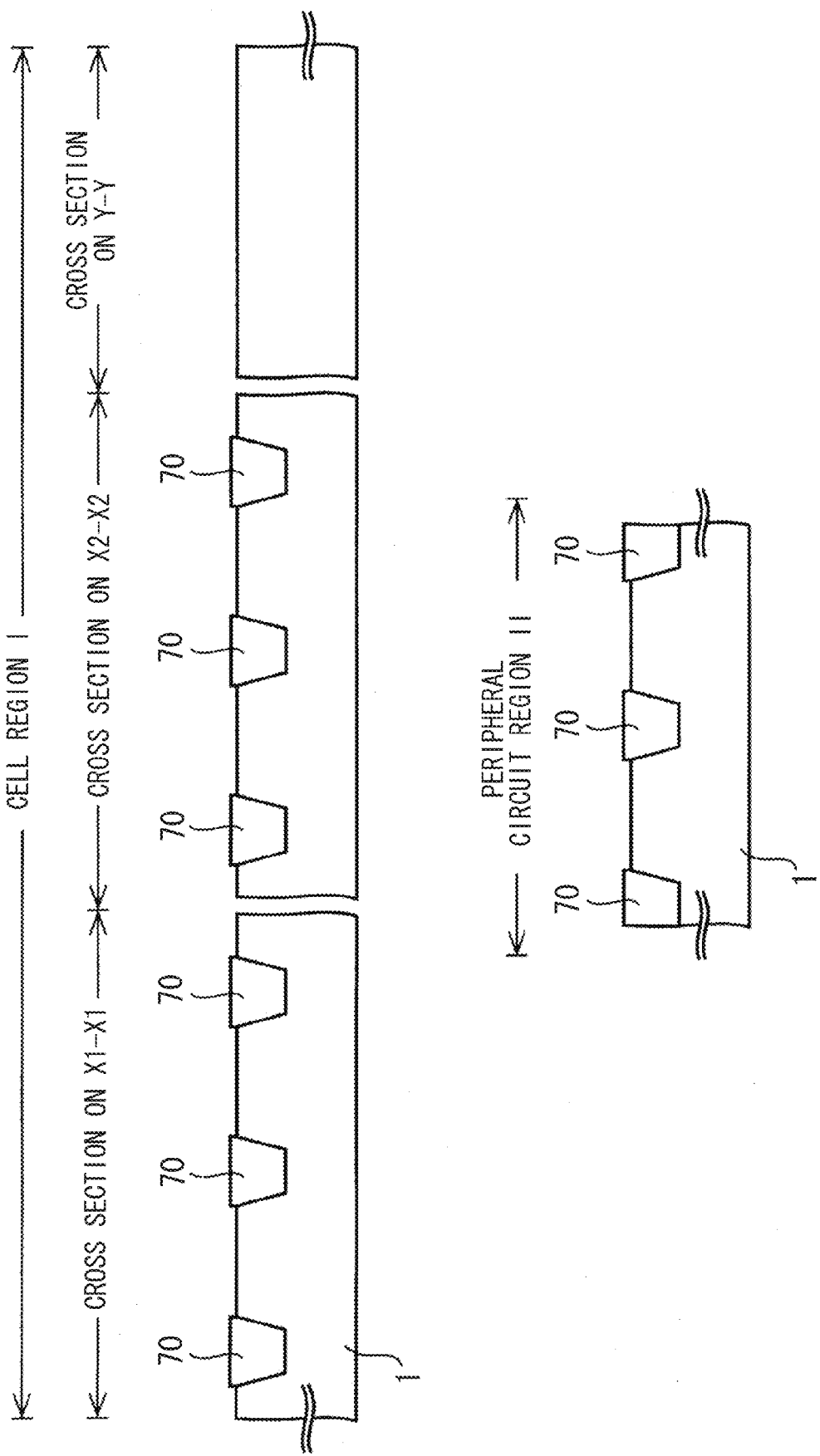

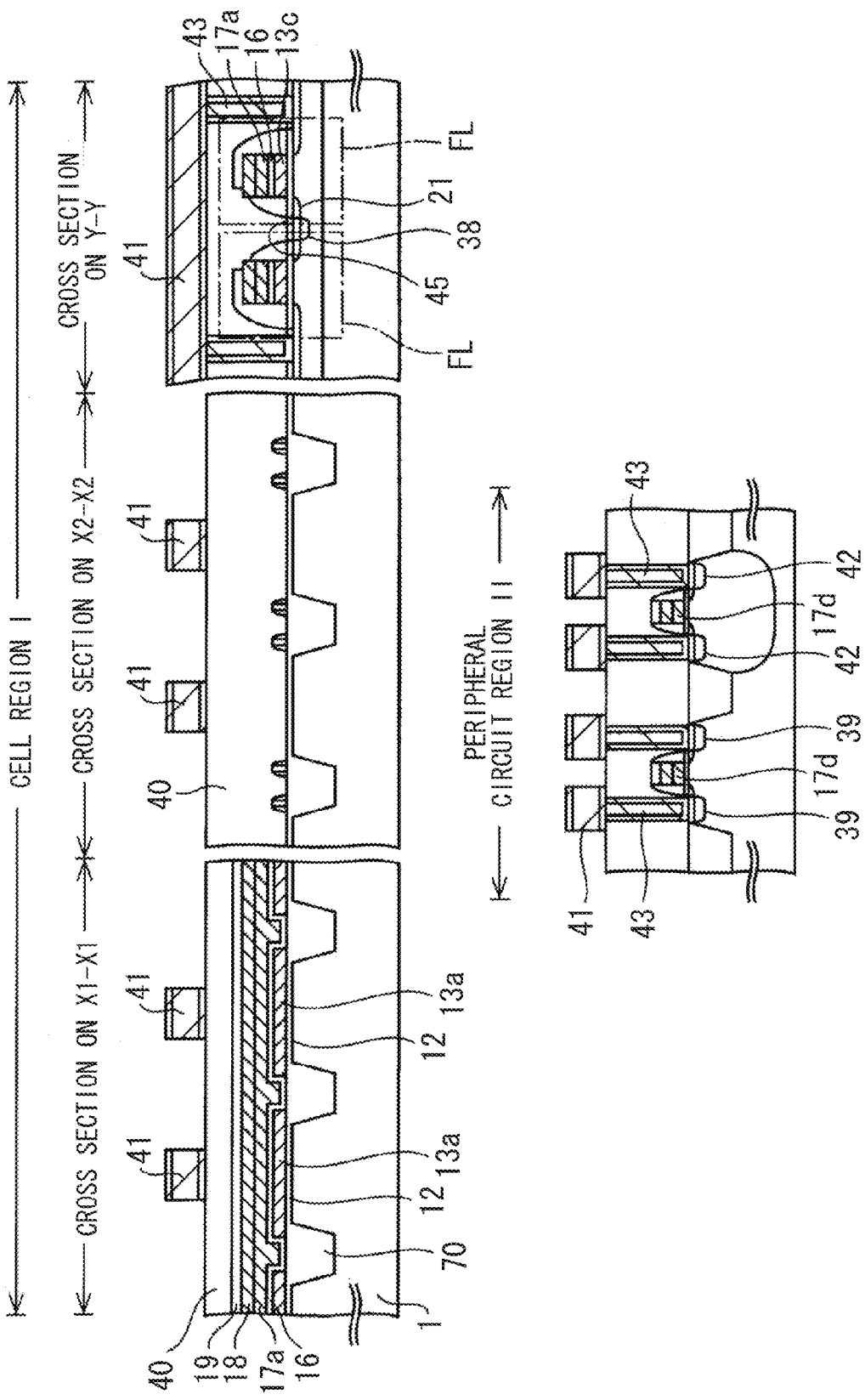

US 8,030,732 B2

SEMICONDUCTOR DEVICE AND METHOD FOR MANUFACTURING THE SAME

CROSS-REFERENCE TO RELATED APPLICATIONS

This application is based upon and claims the benefit of priority of Japanese Patent Application No. 2008-063389 filed on Mar. 12, 2008, the entire contents of which are incorporated herein by reference.

FIELD

The present application relates to a semiconductor device and a method for manufacturing the same.

BACKGROUND

There are a variety of types of nonvolatile memories formed over semiconductor substrates. Among these various nonvolatile memories, a flash memory storing information by accumulating electrons in a floating gate is widely used in general because of its advantage for attaining a high degree of integration.

A flash memory includes a plurality of flash memory cells over a semiconductor substrate. Each flash memory cell includes a tunnel insulating film, a floating gate, an intermediate insulating film and a control gate in this order over an active region of the semiconductor substrate.

In writing data, charge of electrons or holes is injected from the active region through the tunnel insulating film into the floating gate, thereby changing the threshold voltage of a flash memory cell. A difference is caused in the threshold voltage depending upon the presence of charge within the floating gate. The difference is allowed to correspond to data of "1" or "0", and thus, data is written in the flash memory cell.

Since charge stored in a floating gate thus works as a carrier of information, if the charge leaks out of the floating gate in actual use, data written in the flash memory may not be correctly read. Such a failure is designated as charge loss and may be a factor in lowering the yield and the reliability of the flash memory.

One reason for the leakage of the charge is a fence-shaped conductive residue produced in forming the floating gate by patterning a conductive film. The conductive residue is produced because the intermediate insulating film works as an etching mask in the patterning and the conductive film remains beside the intermediate insulating film. Since the conductive residue is coupled to the floating gate, charge stored in the floating gate leaks out through the conductive residue. It results in encouraging the charge loss.

Japanese National Publication No. 2005-530357 discusses a process for preventing the conductive residue. In this process, a conductive spacer is additionally formed beside the conductive film and an intermediate insulating film is formed on an inclined surface of the spacer, so that the intermediate insulating film may minimally work as an etching mask in patterning the conductive film.

The process is, however, disadvantageous because the number of steps is increased by additionally forming the conductive spacer and it is understood that the cost may be increased and the yield may be lowered.

SUMMARY

According to an aspect of embodiments of the invention, a semiconductor device includes a semiconductor substrate, an isolation insulating film formed in the semiconductor substrate, a conductive pattern formed over the semiconductor substrate and the isolation insulating film, including a side face of the conductive pattern over the isolation insulating film, and an insulating film formed over the isolation insulating film, the conductive pattern and the side face of the conductive pattern, wherein the side face of the conductive pattern comprises a notch.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A-2E depict plan views of the semiconductor device;

FIG. 3 depicts a cross-sectional view of the semiconductor device on the basis of a cross-sectional image obtained with an SEM;

FIGS. 5A-5F depict cross-sectional views of a semiconductor device of Embodiment 1;

FIGS. 6A and 6B depict plan views of the semiconductor device of Embodiment 1;

FIGS. 12A-12F depict cross-sectional views of a semiconductor device of Embodiment 2.

DESCRIPTION OF THE EMBODIMENTS

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

Figure 1A:
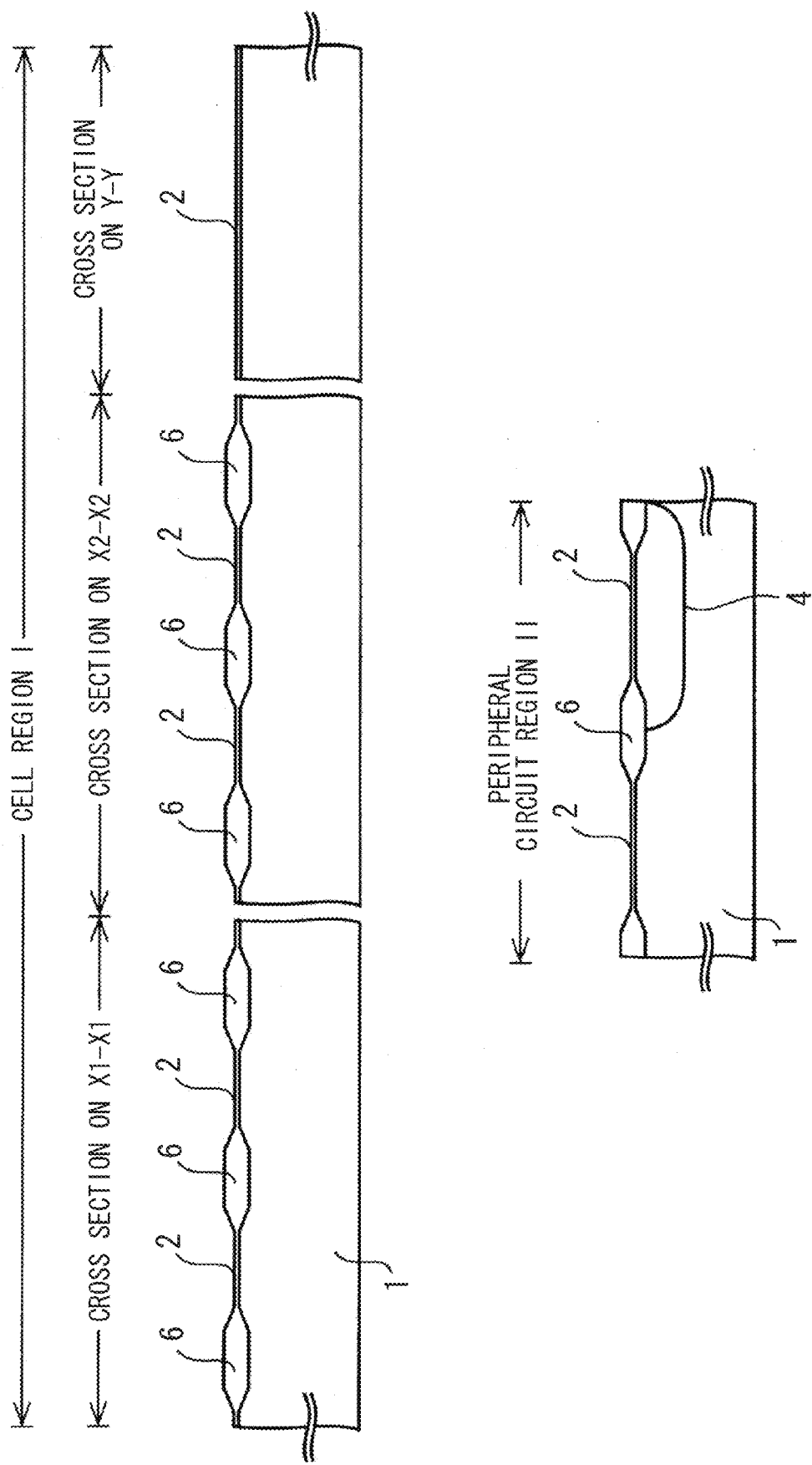
FIGS. 1AA-1BB depict cross-sectional views of a semiconductor device.
Figure 1A:
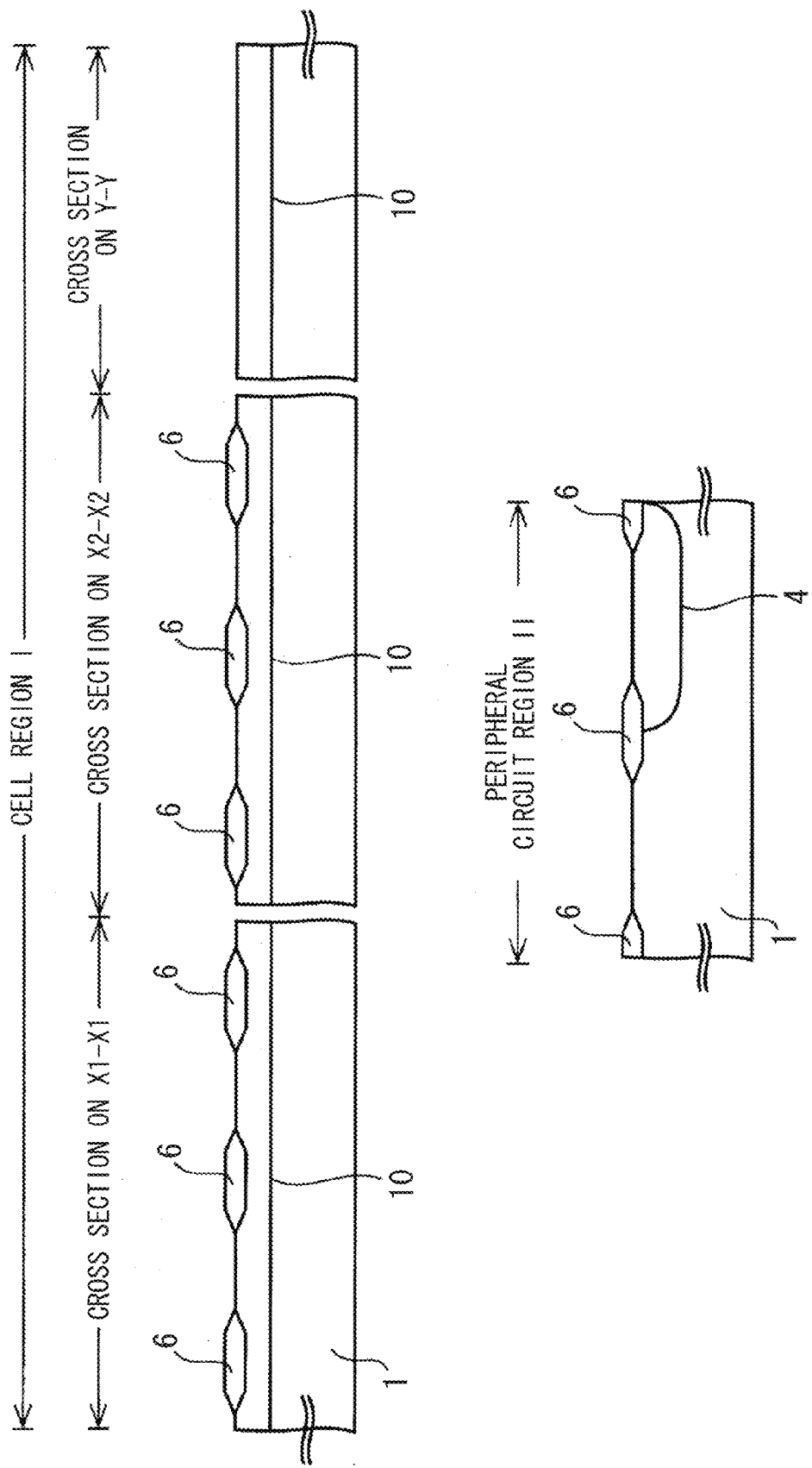
Figure 1A:
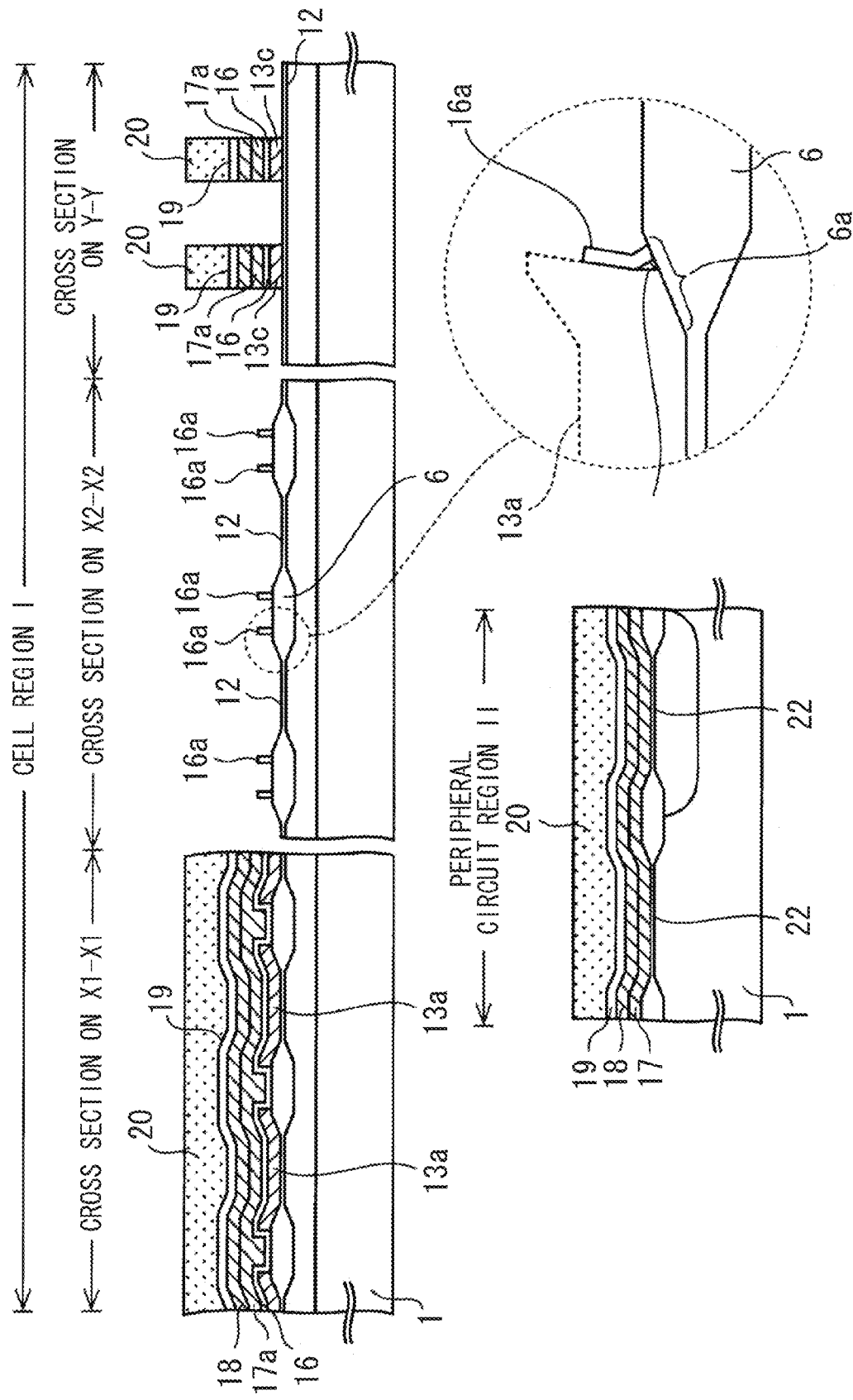
Figure 1A:
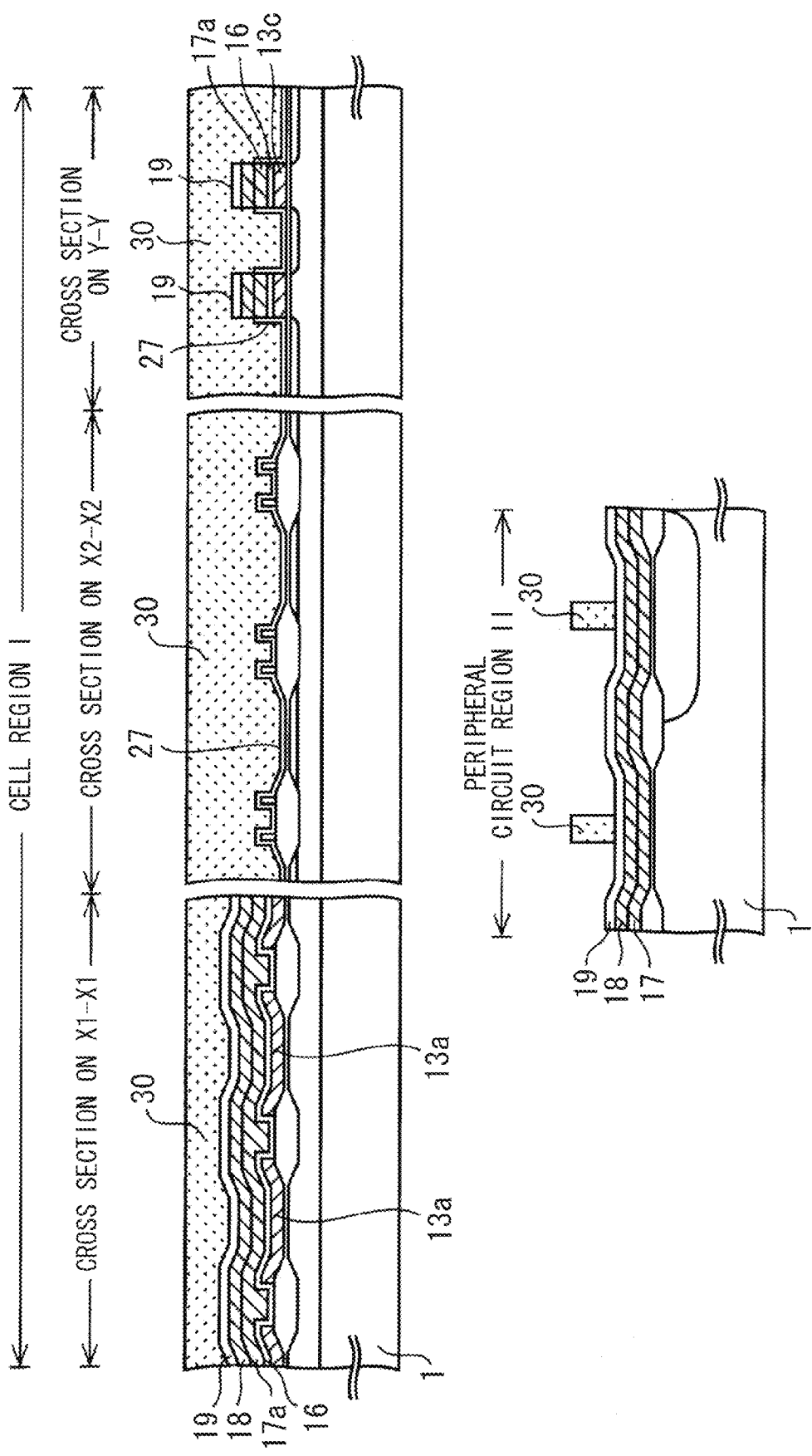
Figure 1A:
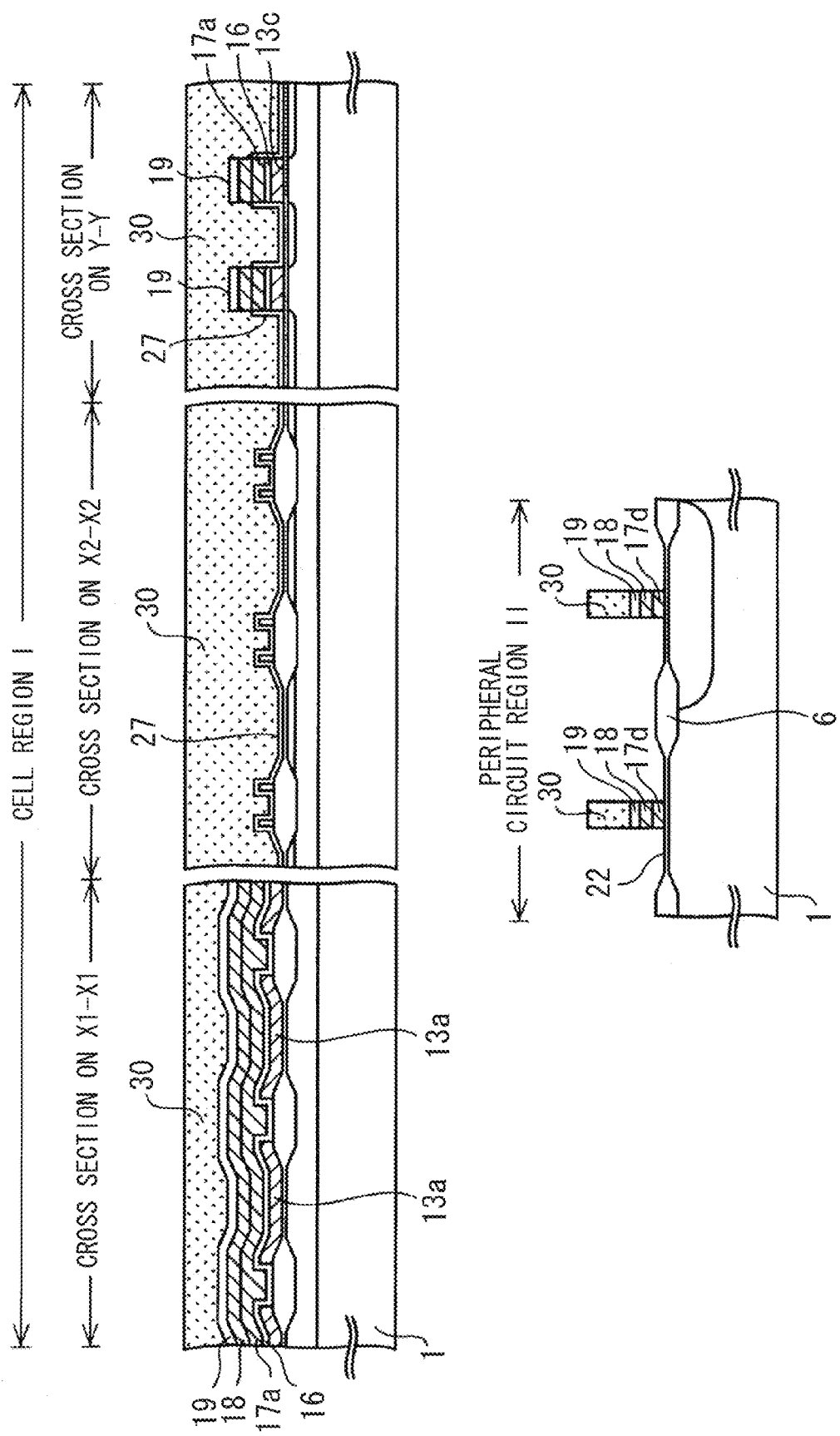
Figure 1A:
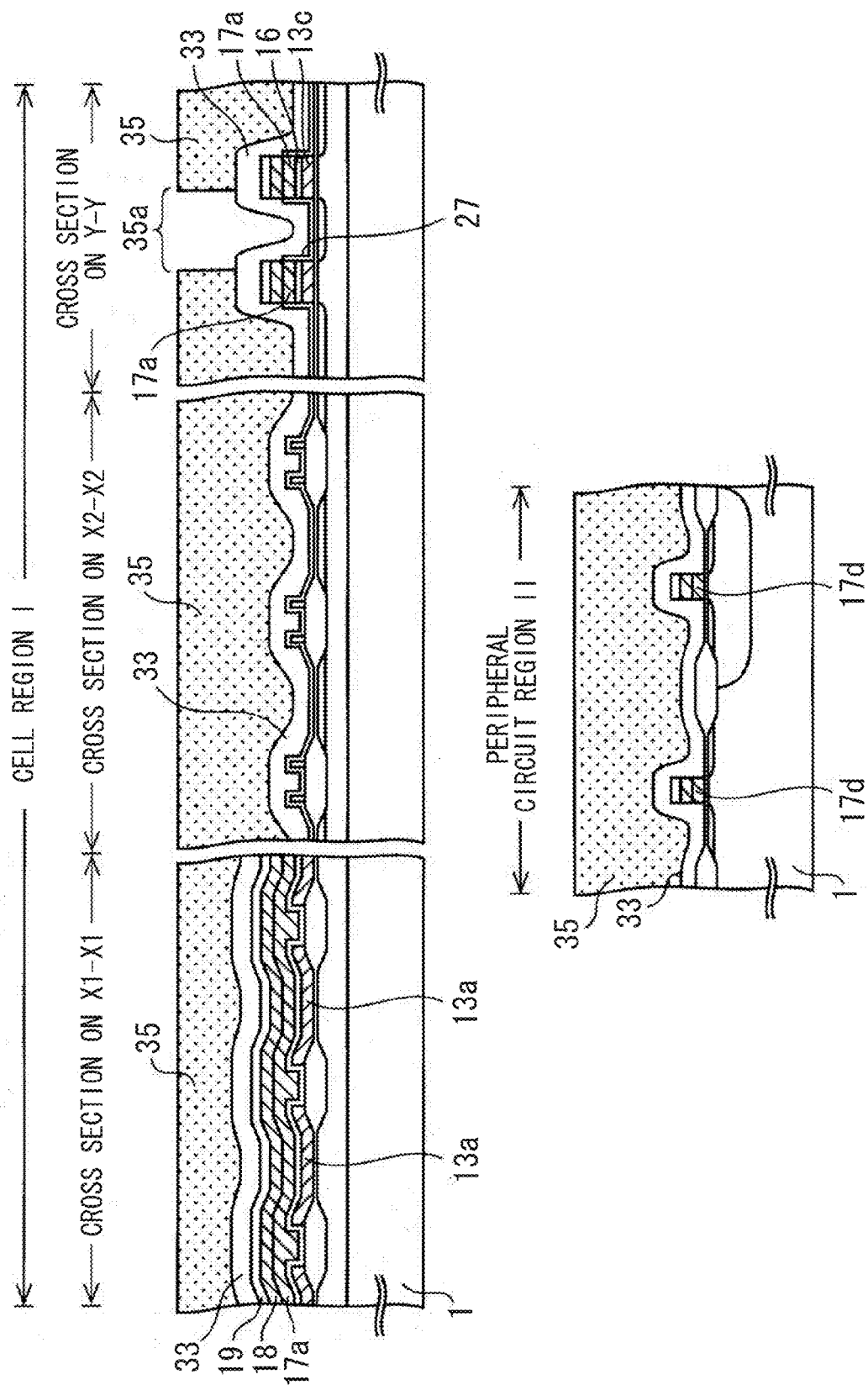
Figure 1A:
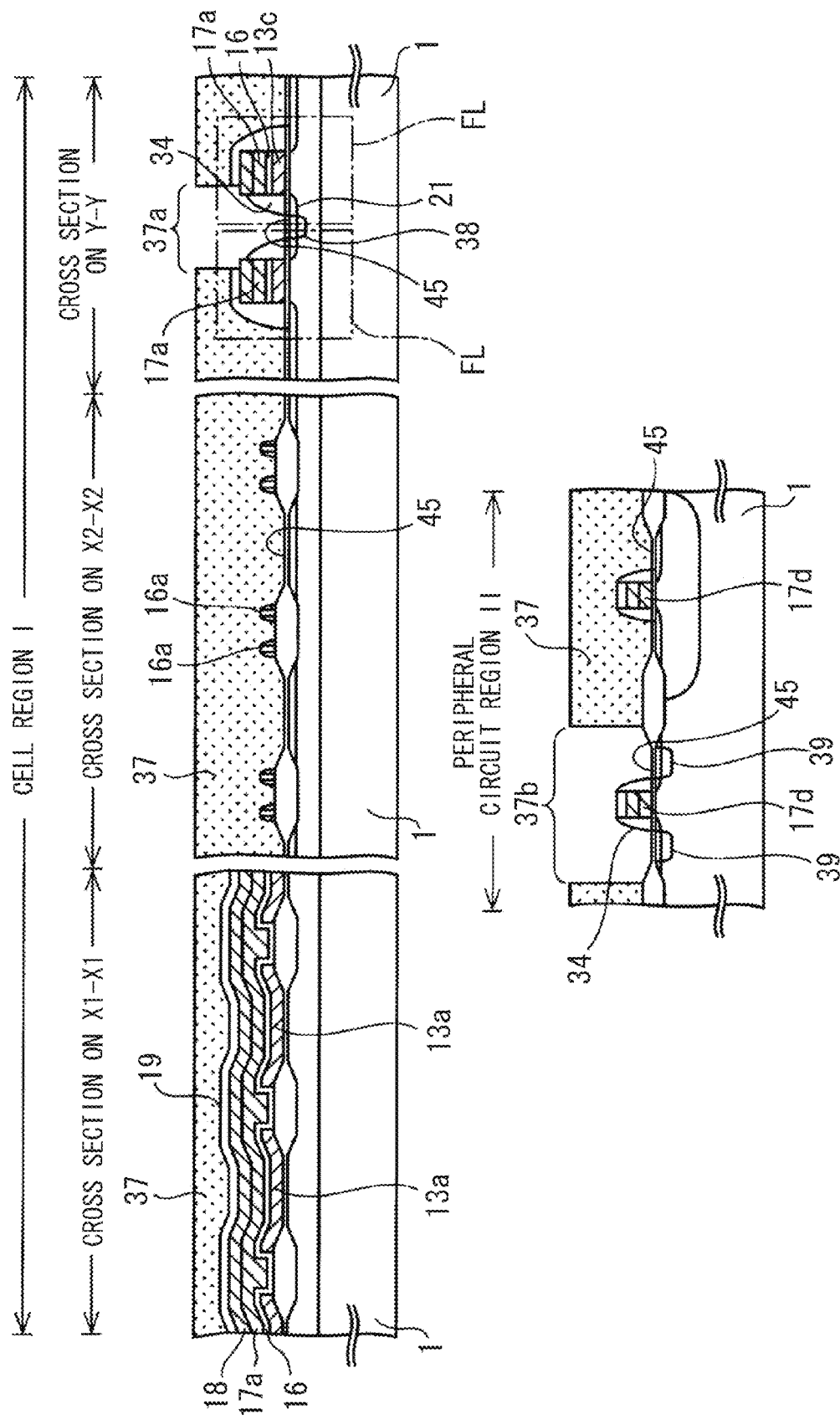

FIGS. 1AA-BB depict cross-sectional views of a semiconductor device, and in each of these drawings, a cell region I where a flash memory cell is to be formed and a peripheral circuit region II are both depicted.

FIGS. 2A-2E depict plan views of the semiconductor device, and the cross-sectional views of the cell region I depicted in each of FIGS. 1AA-1BB respectively correspond to cross-sections taken on lines X1-X1, X2-X2 and Y1-Y1 of FIGS. 2A-2E.

Processes performed for manufacturing the semiconductor device are now described.

A process performed for obtaining the cross-sectional structure depicted in FIG. 1AA is as follows:

After forming a thermally oxidized film 2 with a thickness of, for example, approximately 3 nm over a p-type silicon (semiconductor) substrate 1, a silicon nitride film 3 is deposited in a thickness of, for example, approximately 120 nm, over the thermally oxidized film 2 by CVD (Chemical Vapor Deposition). The silicon nitride film 3 is patterned by photolithography and etching, so as to allow the silicon nitride film 3 to remain over an active region of the silicon substrate 1.

FIG. 2A depicts a plan view of the semiconductor device attained after completing the process described with reference to FIG. 1AA.

As depicted in FIG. 2A, the silicon nitride film 3 is, in a plan view, in the shape of stripes extending along a row direction after the patterning.

Next, as depicted in FIG. 1AB, an n-type impurity is implanted into the peripheral circuit region II of the silicon substrate 1 through ion implantation using, as a mask, a resist pattern not depicted, thereby forming an n-type well 4.

Then, in an oxidation atmosphere, a portion of the silicon substrate 1 where the silicon nitride film 3 is not formed is thermally oxidized, thereby forming an isolation insulating film 6 with a thickness of, for example, approximately 300 nm as depicted in FIG. 1AC. In the active region disposed under the silicon nitride film 3, the thermal oxidation is not preceded and hence no isolation insulating film 6 is formed in such a region. The thermal oxidation is proceeded slowly in a portion close to the silicon nitride film 3, and therefore, an inclined surface 6a inclined against the surface of the silicon substrate 1 is formed in a portion of the isolation insulating film 6 close to the silicon nitride film 3.

Thereafter, as depicted in FIG. 1AD, the silicon nitride film 3 is removed by wet etching using a phosphoric acid solution.

Furthermore, as depicted in FIG. 1AE, the thermally oxidized film 2 is removed by wet etching using a hydrofluoric acid solution as an etching solution, thereby exposing a clean surface portion of the silicon substrate 1 between the isolation insulating films 6 adjacent to each other.

Through the processes performed so far, a structure in which a plurality of active regions AR is partitioned by the isolation insulating film 6 is obtained. Such an isolation structure is designated as LOCOS (Local Oxidation of Silicon) structure.

Figure 2B:
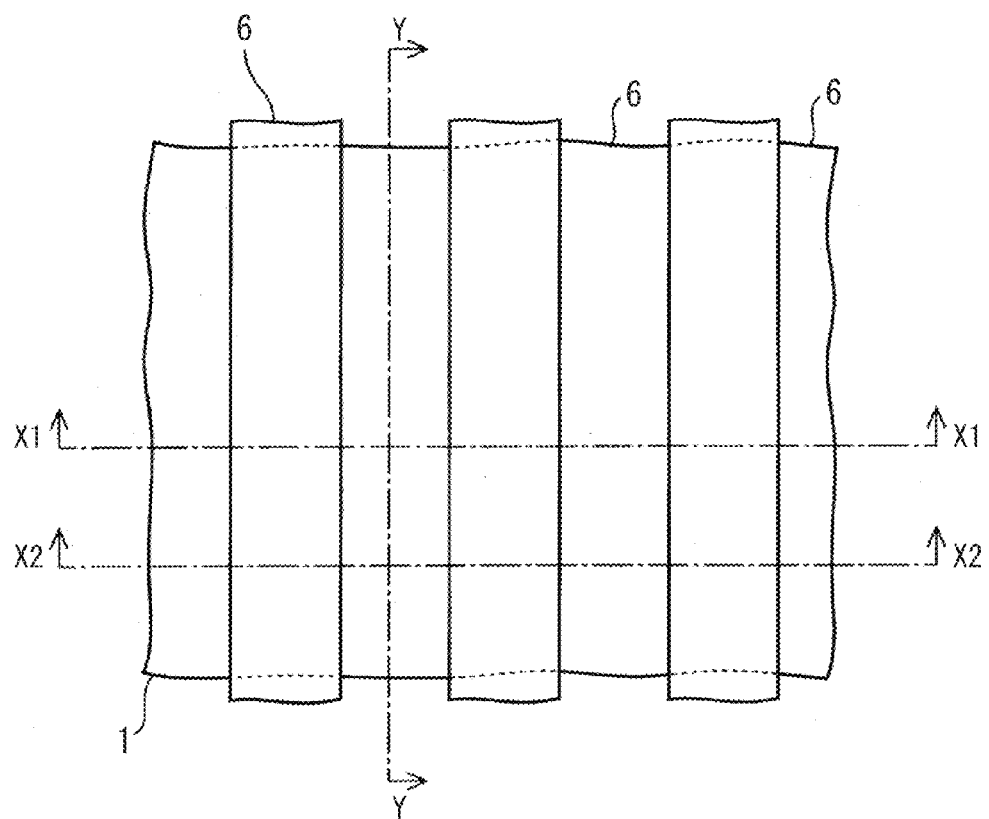

FIG. 2B depicts a plan view of the semiconductor device attained after completing the processes described with reference to FIGS. 1AA-AE.

As depicted in FIG. 2B, the isolation insulating film 6 is, in a plan view, in the shape of stripes extending along the row direction (that is, a first direction).

Next, a surface portion of the silicon substrate 1 is thermally oxidized again, thereby forming a thermally oxidized film with a thickness of, for example, approximately 15 nm as a protection insulating film 11 as depicted in FIG. 1AF.

A p-type impurity is ion implanted into a surface portion of the silicon substrate 1 with the protection insulating film 11 used as a through film, thereby forming an impurity diffusion region 10 used for controlling the threshold voltage of a flash memory cell described below. During the ion implantation, the peripheral circuit region II is covered with a resist pattern not depicted and hence no impurity is implanted into this region.

Thereafter, as depicted in FIG. 1AG, the protection insulating film 11 having been used as the through film for the ion implantation is removed by the wet etching using a hydrofluoric acid solution.

Next, a process performed for obtaining a cross-sectional structure depicted in FIG. 1AH is described.

A surface portion of the silicon substrate 1 is thermally oxidized again. Thus, a thermally oxidized film with a thickness of, for example, approximately 10 nm is formed as a tunnel insulating film 12. An amorphous silicon film with a thickness of, for example, approximately 90 nm is deposited on the tunnel insulating film 12 and the isolation insulating film 6 by the CVD. The amorphous silicon film thus obtained is used as a first conductive film 13. In depositing the amorphous silicon film, it is doped with phosphorus in a concentration of, for example, approximately $5 \times 10^{19}$ cm$^{-3}$ for lowering its resistance.

A polysilicon film may be used as the first conductive film 13 instead of the amorphous silicon film.

Next, as depicted in FIG. 1AI, a first resist pattern 15 having a window 15a disposed above the isolation insulating film 6 is formed by applying a photoresist over the entire top surface of the first conductive film 13 and exposing and developing it.

Thereafter, the first conductive film 13 is dry etched with the first resist pattern 15 used as a mask, thereby forming the first conductive film 13 into a plurality of conductive patterns 13a isolated from one another over the isolation insulating film 6 as depicted in FIG. 1AJ.

This dry etching is reactive ion etching (RIE). In the etching, a mixed gas of, for example, chlorine ($Cl_2$) and oxygen ($O_2$) may be used as the etching gas.

As depicted in FIG. 1AJ, a side face of each conductive pattern 13a is preferably positioned above a top surface 6b, that is, a flat portion of the isolation insulating film 6. Due to the positional shift between the conductive pattern 13a and the isolation insulating film 6, however, the side face may be positioned above the inclined surface 6a of the isolation insulating film 6 as depicted in a dotted line circle in FIG. 1AJ. As a result, a side face 13b of the conductive pattern 13a is inclined in a portion in contact with the inclined surface 6a in a skirt-like shape.

It is herein assumed that inclination toward the active region AR is designated as positive inclination and that inclination away from the active region AR is designated as negative inclination. For example, the aforementioned side face 13b includes positive inclination as depicted in FIG. 1AJ. A side face 13c having negative inclination is formed above the side face 13b. Slight negative inclination is preferred, and a complex surface of the negative side face 13c and the positive side face 13b is formed over the inclined surface 6a.

After dry etching the first conductive film 13 with the first resist pattern 15 used as a mask as described above, the first resist pattern 15 is removed.

FIG. 3 depicts a cross-sectional view of the conductive pattern 13a attained after removing the first resist pattern 15 based on a cross-sectional image obtained with an SEM (Scanning Electron Microscope). The side face of the conductive pattern 13a is in a skirt-like shape in a portion thereof in contact with the inclined surface of the isolation insulating film 6 so as to form a complex surface of a positive side face and a negative side face.

Figure 2C:
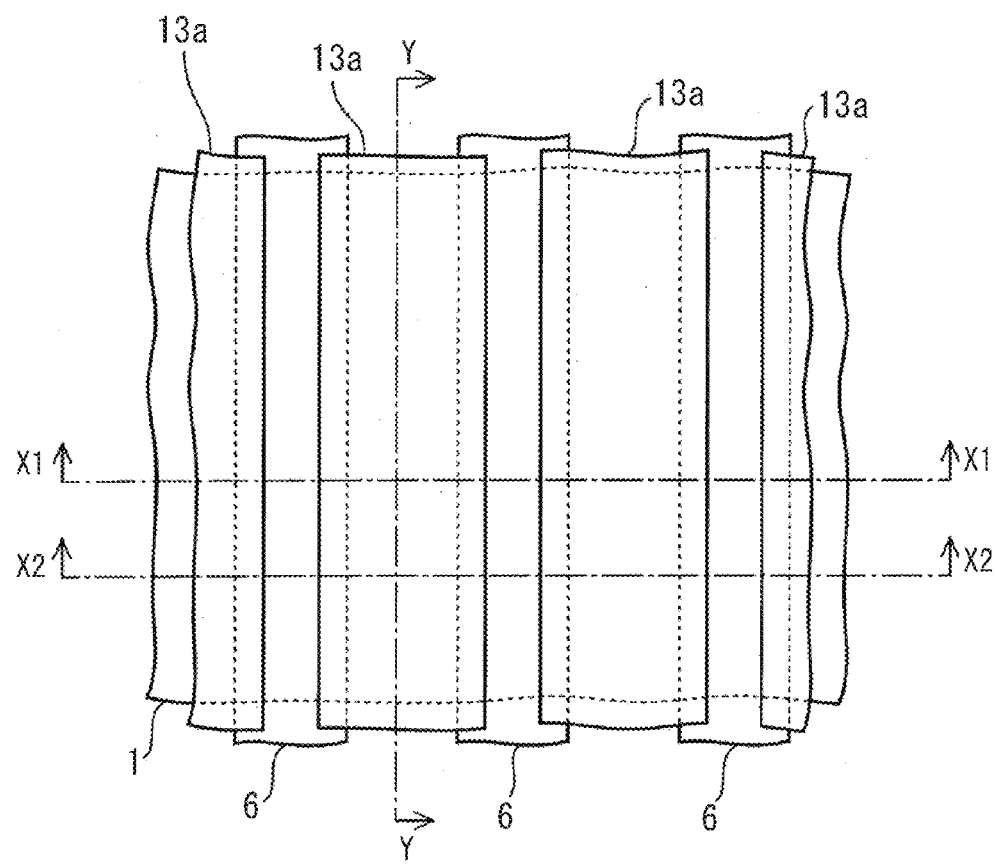

FIG. 2C depicts a plan view of the semiconductor device attained after completing the processes described with reference to FIGS. 1AA-1AJ.

As depicted in FIG. 2C, the conductive patterns 13a are in the shape of stripes extending along the extending direction of the isolation insulating film 6.

Next, an ONO film is formed as an intermediate insulating film 16 over the isolation insulating film 6 and the conductive pattern 13a as depicted in FIG. 1AK.

The intermediate insulating film 16 includes a first thermally oxidized film 16x, a silicon nitride film 16y and a second thermally oxidized film 16z in this order. The first thermally oxidized film 16x is formed by thermally oxidizing a surface portion of the conductive pattern 13a and includes a thickness of, for example, approximately 8 nm. The silicon nitride film 16y is deposited in a thickness of, for example, approximately 10 nm over the first thermally oxidized film 16x by the CVD. The second thermally oxidized film 16z is formed by thermally oxidizing a surface portion of the silicon nitride film 16y and includes a thickness of, for example, approximately 10 nm.

As depicted in FIG. 1AL, the conductive pattern 13a and the intermediate insulating film 16 are selectively removed by etching in the peripheral circuit region II with a resist pattern not depicted used as a mask, thereby exposing a portion of the surface of the silicon substrate 1 in the peripheral circuit region II.

Next, a process performed for obtaining a cross-sectional structure depicted in FIG. 1AM is described.

As depicted in FIG. 1AM, a thermally oxidized film is formed in a thickness of approximately 7 nm by thermally oxidizing a surface portion of the silicon substrate 1 in the peripheral circuit region II, and this thermally oxidized film is used as a gate insulating film 22.

Alternatively, a plurality of gate insulating films 22 with different thicknesses may be formed in the peripheral circuit region II. In this case, thermal oxidation is performed a plurality of times, thereby forming a plurality of gate insulating films 22 with different thicknesses.

Next, as further depicted in FIG. 1AM, an amorphous silicon film with a thickness of, for example, approximately 120 nm is deposited as a second conductive film 17 over the intermediate insulating film 16 and the gate insulating film 22 by the CVD. In depositing the amorphous silicon film, it is doped with phosphorous in a concentration of, for example, approximately $3 \times 10^{20}$ cm$^{-3}$ for lowering its resistance. It is noted that a polysilicon film may be formed as the second conductive film 17 instead of the amorphous silicon film.

As further depicted in FIG. 1AM, a tungsten silicide (WSi) film with a thickness of, for example, approximately 150 nm is deposited as a metal silicide film 18 over the second conductive film 17 by the CVD, so that a control gate and a gate electrode formed by patterning these films 17 and 18 in a subsequent process may attain low resistance.

As further depicted in FIG. 1AM, a silicon oxide film with a thickness of, for example, approximately 100 nm is deposited over the metal silicide film 18 by the CVD as a cap insulating film 19 used for protecting the metal silicide film 18 from an oxidation atmosphere.

Next, as depicted in FIG. 1AN, a second resist pattern 20 is formed by applying a photoresist over the cap insulating film 19 and exposing and developing it. The second resist pattern 20 is, in a plan view, in the shape of a belt correspondingly to the control gate described later in the cell region I.

Next, as depicted in FIG. 1AO, the cap insulating film 19, the metal silicide film 18, the second conductive film 17 and the intermediate insulating film 16 are etched in an RIE chamber with the second resist pattern 20 used as a mask, thereby forming a portion of the second conductive film 17 remaining after the etching into a control gate 17a.

In this etching, a mixed gas of $Cl_2$, $O_2$ and HBr may be used as an etching gas for the metal silicide film 18 and the second conductive film 17. As an etching gas for the intermediate insulating film 16, a mixed gas of $CF_4$ and $O_2$ may be used.

This etching is anisotropic etching with a maximum etching rate in a vertical direction to the top surface of the silicon substrate 1. Accordingly, a portion of the intermediate insulating film 16 disposed over the top surface of the conductive pattern 13a is removed through the etching but a portion of the intermediate insulating film 16 disposed over the side face of the conductive pattern 13a may not be completely removed because the thickness in the vertical direction of the silicon substrate 1 is larger in such a portion than in another portion. As a result, as depicted in a dotted line circle in FIG. 1AO, a residue 16a of the intermediate insulating film 16 remains over the side faces 13b and 13c of the conductive pattern 13a.

Next, as depicted in FIG. 1AP, with the RIE etching chamber subsequently used, the etching gas is switched to a mixed gas of $Cl_2$, $O_2$ and HBr. Thus, a portion of the conductive pattern 13a not covered with the second resist pattern 20 is removed by the RIE, thereby forming a portion of the conductive pattern 13a remaining after the etching into a floating gate 13c.

As further depicted in FIG. 1AP, the residue 16a of the intermediate insulating film 16 remains over the isolation insulating film 6 and the side face 13b of the conductive pattern 13a is formed over the inclined surface 6a of the isolation insulating film 6 in the skirt-like shape as described above. Therefore, as depicted in a dotted line circle in FIG. 1AP, a portion of the residue 16a remaining over the skirt-like portion works as a mask in the etching of the conductive pattern 13a, resulting in a stringer (a linear residue) 13s of the conductive pattern 13a remaining beside the residue 16a.

FIG. 2D depicts a plan view of the semiconductor device attained after completing the processes described with reference to FIGS. 1AA-1AP. It is noted that the second resist pattern 20 is omitted in FIG. 2D.

As depicted in FIG. 2D, a plurality of floating gates 13c are formed in the form of a matrix. The control gate 17a and the intermediate insulating film 16 disposed thereunder extend along a column direction (that is, a second direction) perpendicular to the row direction (that is, the first direction) and are in the shape of a belt, in a plan view, for covering all of a plural floating gates 13c arranged in a corresponding column.

As further depicted in FIG. 2D, the residue 16a extends from one of two floating gates 13c adjacent to each other in the row direction to the other. Accordingly, when the stringer 13s of the conductive pattern 13a is produced beside the residue 16a as described above, the adjacent floating gates 13c are electrically short-circuited through the stringer 13s.

Next, as depicted in FIG. 1AQ, with the second resist pattern 20 remaining, an n-type impurity such as arsenic or phosphorus is ion implanted into portions of the silicon substrate 1 disposed over both sides of each floating gate 13c, thereby forming n-type source/drain regions 21 for a flash memory cell. Thereafter, the second resist pattern 20 is removed.

The conditions for the ion implantation may not be particularly specified. In this exemplified case, for example, arsenic is ion implanted under the conditions of an acceleration energy of about 50 keV and a dose of about $4.0 \times 10^{15}$ cm$^{-1}$, for example.

Next, as depicted in FIG. 1AR, a silicon oxide film is deposited as a protection insulating film 27 over the entire top surface of the silicon substrate 1 by the CVD in a very small thickness of, for example, 7 nm. An n-type impurity is ion implanted again into the n-type source/drain regions 21, thereby increasing the impurity concentration in the n-type source/drain regions 21. The n-type impurity may be phosphorus or arsenic. It is noted that this ion implantation is performed with a resist pattern not depicted used as a mask, and the n-type impurity may be implanted into a portion other than the n-type source/drain regions 21.

Thereafter, as further depicted in FIG. 1AR, annealing is performed, for example, in an oxidation atmosphere of approximately 800-900° C., thereby activating the impurity having been implanted into the n-type source/drain regions 21.

Next, as depicted in FIG. 1AS, a third resist pattern 30 is formed by applying a photoresist over the entire top surface of the silicon substrate 1 and exposing and developing it.

Next, as depicted in FIG. 1AT, the cap insulating film 19, the metal silicide film 18 and the second conductive film 17 are etched in the peripheral circuit region II with the third resist pattern 30 used as a mask, thereby forming a portion of the second conductive film 17 disposed below the third resist pattern 30 into a gate electrode 17*d*. The gate length of the gate electrode 17*d* may not be particularly specified and is, for example, 0.35 µm in this exemplified case. Thereafter, the third resist pattern 30 is removed.

Subsequently, as depicted in FIG. 1AU, an n-type impurity is ion implanted into a portion of the peripheral circuit region II where an n-type MOS transistor is to be formed, thereby forming an n-type lightly doped diffusion region 31. In this n-type impurity ion implantation, for example, phosphorus is ion implanted under the conditions of an acceleration energy of 20 keV and a dose of $4.0 \times 10^{13}$ cm$^{-2}$, for example.

As further depicted in FIG. 1AU, a p-type impurity is ion implanted into a portion of the peripheral circuit region II where a p-type MOS transistor is to be formed, thereby forming a p-type lightly doped diffusion region 32. In this p-type impurity ion implantation, for example, BF$_2$ is ion implanted under the conditions of an acceleration energy of 20 keV and a dose of $8.0 \times 10^{12}$ cm$^{-2}$. It is noted that the n-type impurity and the p-type impurity are separately implanted by using resist patterns not depicted.

Subsequently, as depicted in FIG. 1AV, a silicon oxide film is formed in a thickness of, for example, approximately 100 nm over the entire top surface of the silicon substrate 1 as a sidewall insulting film 33.

As depicted in FIG. 1AW, a fourth resist pattern 35 is formed by applying a photoresist over the sidewall insulating film 33 and exposing and developing it. The fourth resist pattern 35 includes a window 35*a* between adjacent control gates 17*a*.

Next, as depicted in FIG. 1AX, portions of the sidewall insulating film 33, the protection insulating film 27 and the tunnel insulating film 12 disposed within the window 35*a* are etched. Thus, the sidewall insulating film 33 remains as a first insulating sidewall 33*a* and a portion of the surface of the silicon substrate 1 is exposed in the window 35*a*. Thereafter, the fourth resist pattern 35 is removed.

FIG. 2E depicts a cross-sectional view of the semiconductor device attained after completing the processes described with reference to FIGS. 1AA-1AX.

As depicted in FIG. 2E, a portion of the isolation insulating film 6 disposed within the window 35*a* (see FIG. 1AX) is removed through the etching.

Subsequently, as depicted in FIG. 1AY, a silicon oxide film with a thickness of, for example, approximately 70 nm is deposited over the entire top surface of the silicon substrate 1 by the CVD, and the silicon oxide film is etched back, thereby allowing it to remain over sides of the control gate 17*a* and the gate electrode 17*d* as second insulating sidewalls 34.

Next, a process performed for obtaining a cross-sectional structure depicted in FIG. 1AZ is as follows:

As depicted in FIG. 1AZ, a surface portion of the silicon substrate 1 is thermally oxidized in an oxidation atmosphere under conditions of a substrate temperature of, for example, approximately 800° C. and a processing time of 50 minutes, thereby forming a thermally oxidized film as a protection insulating film 45. A fifth resist pattern 37 is formed by applying a photoresist over the entire top surface of the silicon substrate 1 and exposing and developing it. Thereafter, an n-type impurity is ion implanted into the silicon substrate 1 through a window 37*a* of the fifth resist pattern 37. Thus, an n-type source line 38 is formed between the adjacent control gates 17*a* and n-type source/drain regions 39 are formed over both sides of the gate electrode 17*d* in the peripheral circuit region II.

The conditions for this ion implantation may not be particularly specified. In this exemplified case, for example, arsenic may be ion implanted under the conditions of an acceleration energy of about 60 keV and a dose of about $3.0 \times 10^{15}$ cm$^{-2}$.

As further depicted in FIG. 1AZ, a flash memory cell FL including the floating gate 13*c*, the intermediate insulating film 16, the control gate 17*a*, the source line 38, the source/drain regions 21 and the like is formed over the silicon substrate 1 through the processes performed so far. Thereafter, the fifth resist pattern 37 is removed.

Figure 1B:
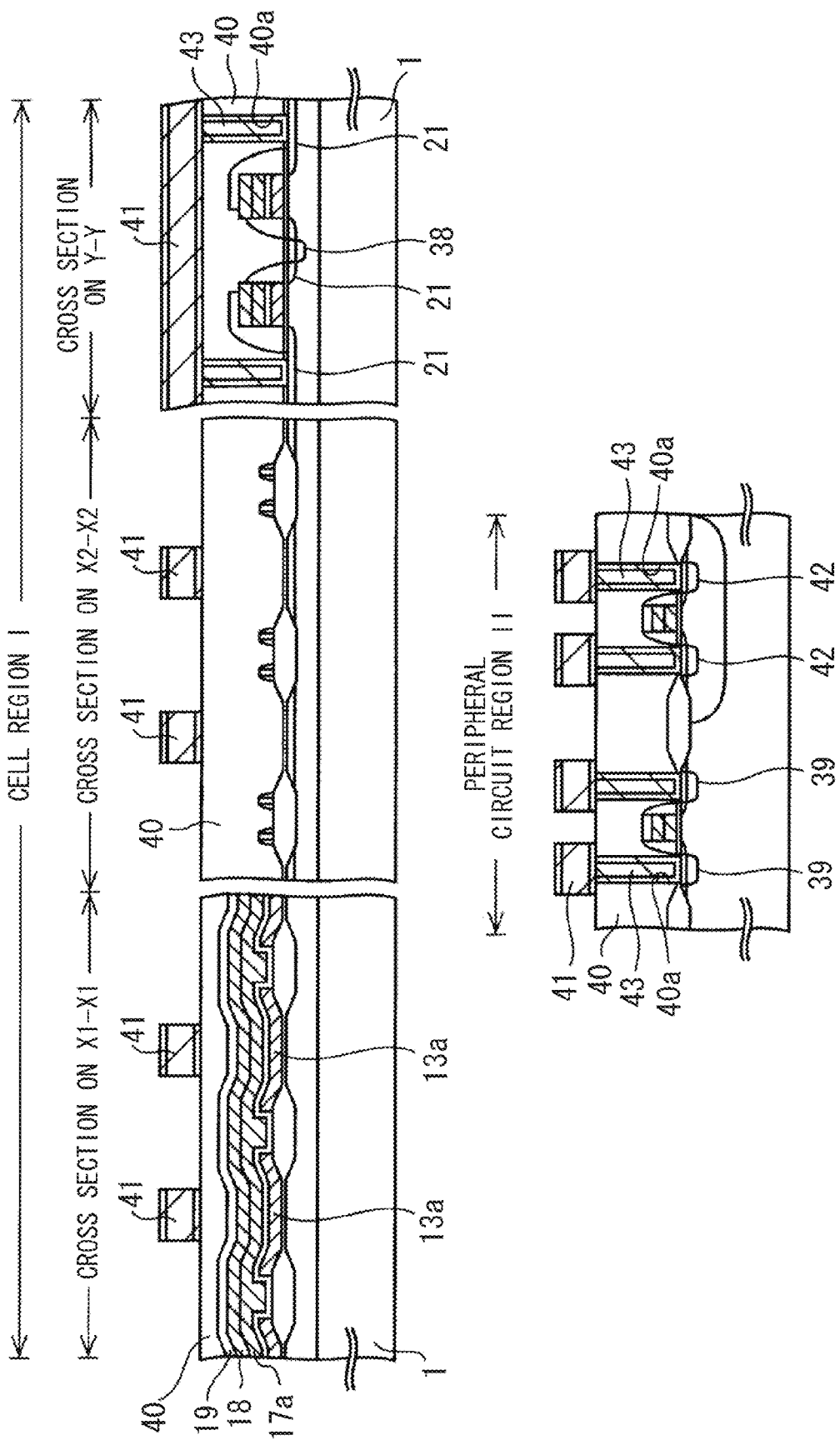

Subsequently, as depicted in FIG. 1BA, a p-type impurity is ion implanted into portions of the n-type well 4 disposed over both sides of the gate electrode 17*d* in the peripheral circuit region II, thereby forming p-type source/drain regions 42. In this p-type impurity ion implantation, for example, BF$_2$ is ion implanted under the conditions of an acceleration energy of 40 keV and a dose of $4.0 \times 10^{15}$ cm$^{-2}$. It is noted that this ion implantation is performed with a resist pattern not depicted used as a mask and hence the p-type impurity is implanted into neither the cell region I nor the n-type source/drain regions 39.

As further depicted in FIG. 1BA, basic structures of a p-type MOS transistor TRp and an n-type MOS transistor TRn are completed in the peripheral circuit region II through the processes performed so far.

Next, a process performed for obtaining a cross-sectional structure depicted in FIG. 1BB is described.

As depicted in FIG. 1BB, a silicon oxide film with a thickness of, for example, approximately 100 nm and a BPSG film with a thickness of, for example, approximately 160 nm are deposited in this order over the entire top surface of the silicon substrate 1 by the CVD, thereby obtaining an interlayer insulating film 40 composed of these films.

Then, in order to activate the impurities having been implanted into the source/drain regions 21, 39 and 42 and to stabilize the film quality of the interlayer insulating film 40, annealing is performed in a nitrogen atmosphere under the conditions of, for example, a substrate temperature of 850° C. and a processing time of 30 minutes.

Thereafter, the top surface of the interlayer insulating film 40 is flattened through polishing by CMP (Chemical Mechanical Polishing).

Next, contact holes 40*a* are formed by patterning the interlayer insulating film 40, and the contact holes 40*a* are filled with conductive plugs 43 mainly including tungsten, so that the source/drain regions 21, 39 and 42 may be electrically coupled to the conductive plugs 43.

Furthermore, a metal laminated film including an aluminum film is formed over the interlayer insulating film 40 by sputtering. The metal laminated film is patterned by the photolithography into metal wires 41 electrically coupled to the conductive plugs 43.

In this manner, the basic structure of the semiconductor device is completed.

Since the side face of the conductive pattern 13a is formed in a skirt-like shape over the inclined surface 6a of the isolation insulating film 6 as described with reference to FIG. 1AP, the stringer 13s of the conductive pattern 13a may remain beside the reside 16a of the intermediate insulating film 16 in this semiconductor device as depicted in FIG. 1BB.

Figure 4A:
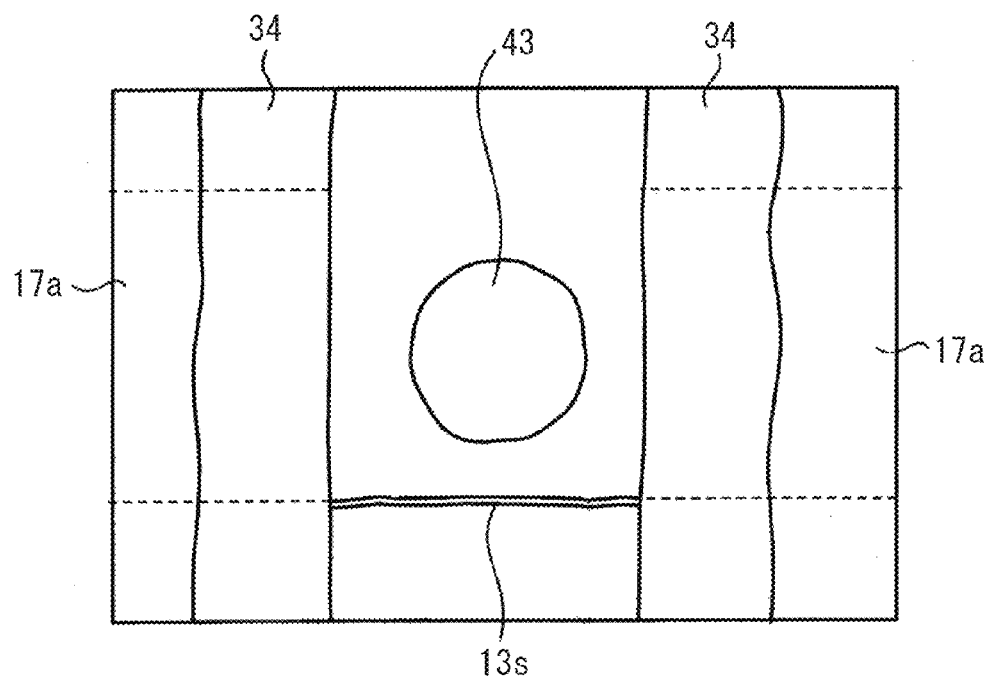
FIGS. 4A and 4B respectively depict a plan view and a cross-sectional view of the semiconductor device on the basis of electron micrographs.
Figure 4B:
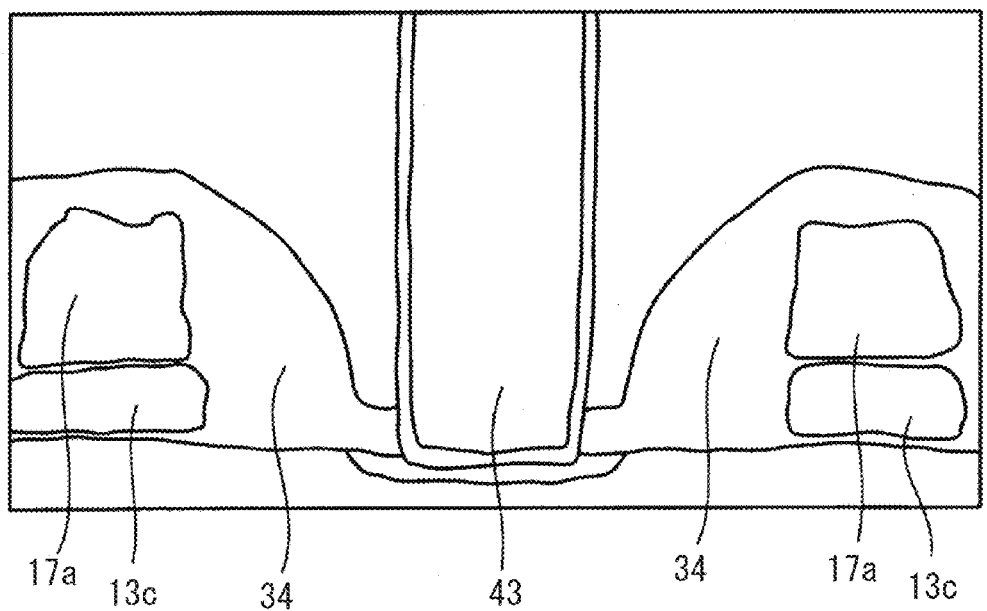

FIG. 4A depicts a plan view obtained on the basis of an electron micrograph of the aforementioned semiconductor device and FIG. 4B depicts a cross-sectional view obtained on the basis of an electron micrograph of the semiconductor device. It is understood that the stringer 13s is produced between the floating gates 13c adjacent to each other.

As depicted in FIG. 4A, the floating gates 13c of flash memory cells FL adjacent to each other in the row direction are electrically short-circuited through the stringer 13s. As a result, electrons accumulated in one floating gate 13c leak to the other floating gate 13c through the stringer 13s, and thus, the charge loss easily occurs.

The stringer 13s is conspicuously formed particularly when the side face of the conductive pattern 13a is positioned above the inclined surface 6a of the isolation insulating film 6 due to the positional shift between the isolation insulating film 6 and the conductive pattern 13a as depicted in FIG. 1AP.

In this manner, a structure in which a failure such as the charge loss is minimally caused even when there arises a positional shift between the isolation insulating film 6 and the conductive pattern 13a is preferably employed in a semiconductor device including a flash memory.

The present inventor includes the following embodiments in consideration of the aforementioned preliminary matter. It is noted that like reference numerals are used, in drawings mentioned in the following embodiments, to refer to like elements described as the preliminary technique above so as to omit the description.

FIGS. 5A-5F depict cross-sectional views of a semiconductor device according to Embodiment 1.

Figure 6B:
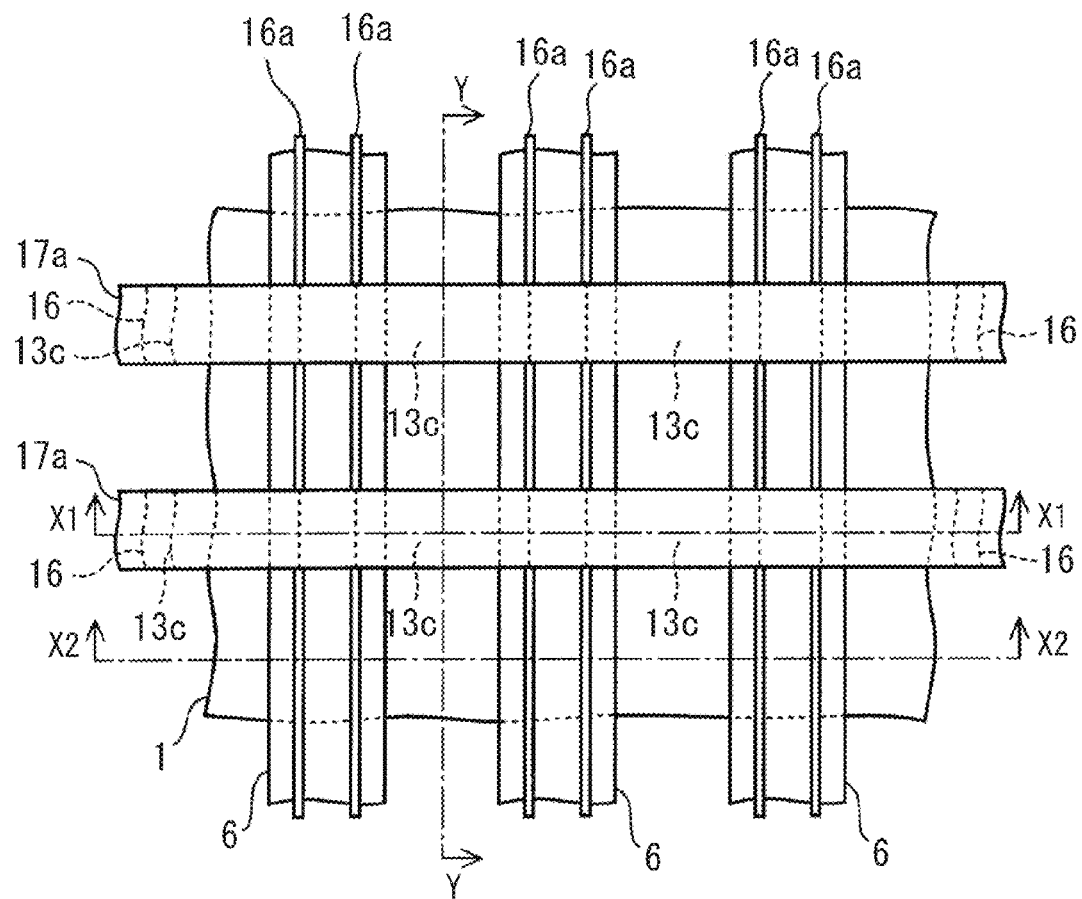

FIGS. 6A and 6B depict plan views of a cell region I of the semiconductor device of Embodiment 1. The cross-sectional views of the cell region I depicted in each of FIGS. 5A-5F respectively correspond to cross-sections taken on lines X1-X1, X2-X2 and Y1-Y1 of FIGS. 6A and 6B.

In manufacturing the semiconductor device of Embodiment 1, a structure in which the first resist pattern 15 is formed over the first conductive film 13 is first obtained as depicted in FIG. 5A through the aforementioned processes described with reference to FIGS. 1AA-1AI.

Next, as depicted in FIG. 5B, the first conductive film 13 is dry etched by the RIE with the first resist pattern 15 used as a mask, thereby forming the first conductive film 13 into a plurality of conductive patterns 13a isolated from one another over the isolation insulating film 6.

If a side face of each conductive pattern 13a is formed in a skirt-like shape on the inclined surface 6a of the isolation insulating film 6 through this etching, a stringer of the conductive pattern 13a is produced later as described above as the preliminary technique.

In Embodiment 1, this etching is performed through two steps as described below so as to avoid the skirt-like shape of the side face of the conductive pattern 13a.

Figure 11:
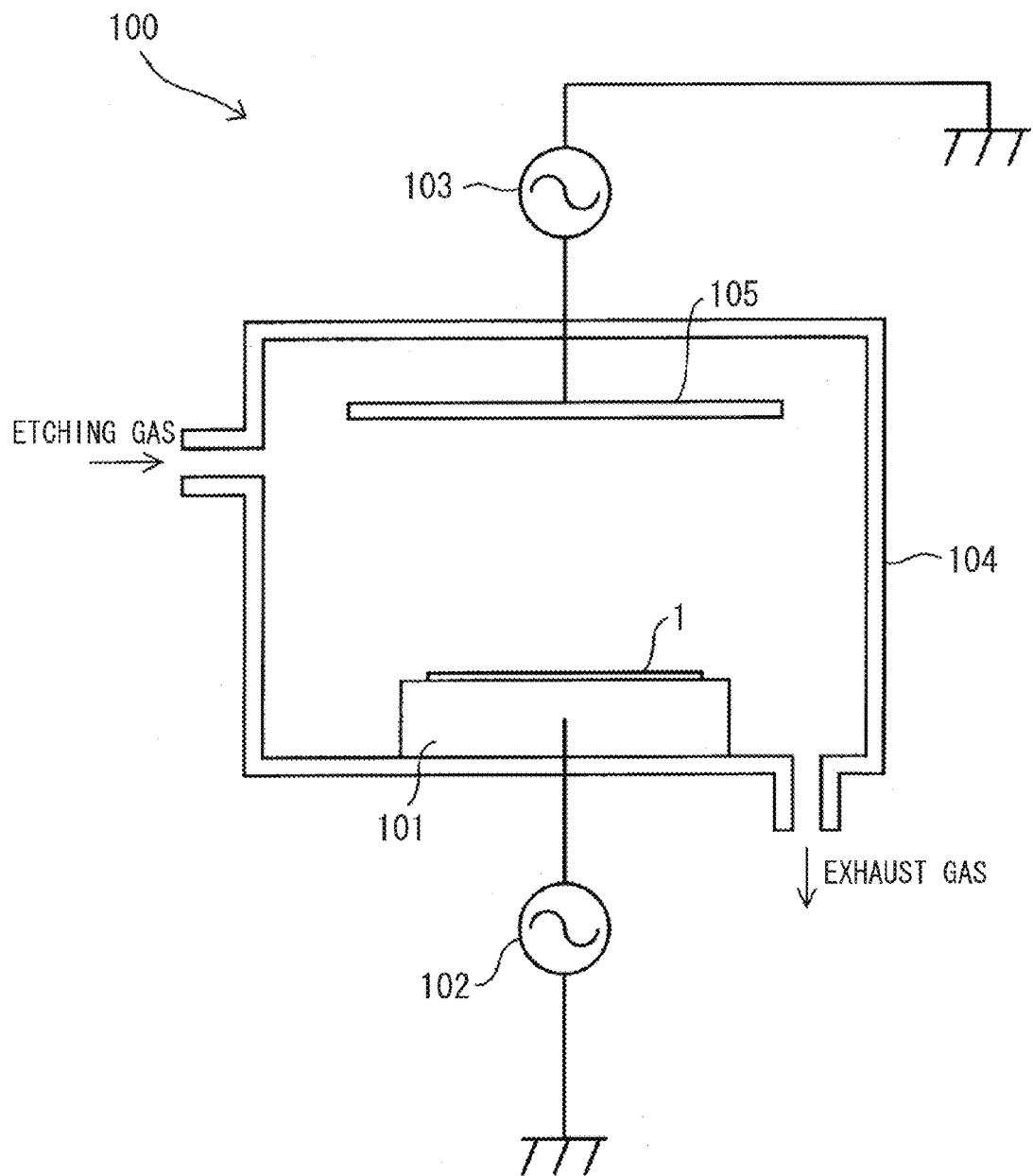
FIG. 11 depicts an RIE system applicable in Embodiment 1.

FIG. 11 depicts a diagram of the architecture of an RIE system used in this etching.

As depicted in FIG. 11, the RIE system 100 includes a chamber 104 in which the pressure may be reduced, and a cathode 101 and an anode 105 opposing each other within the chamber 104. The cathode 101 also works as a table for the silicon substrate 1, and the silicon substrate 1 placed over may be heated to a desired temperature with a heater not depicted. Furthermore, the cathode 101 and the anode 105 are respectively coupled to a bias high frequency power source 102 and a plasma generation high frequency power source 103. The frequency of the bias high frequency power source 102 is, for example, 13.56 MHz and the frequency of the plasma generation high frequency power source 103 is, for example, 12.56 MHz. The inner walls of the chamber 104 are heated to a desired temperature with a heater not depicted.

Figure 7A:
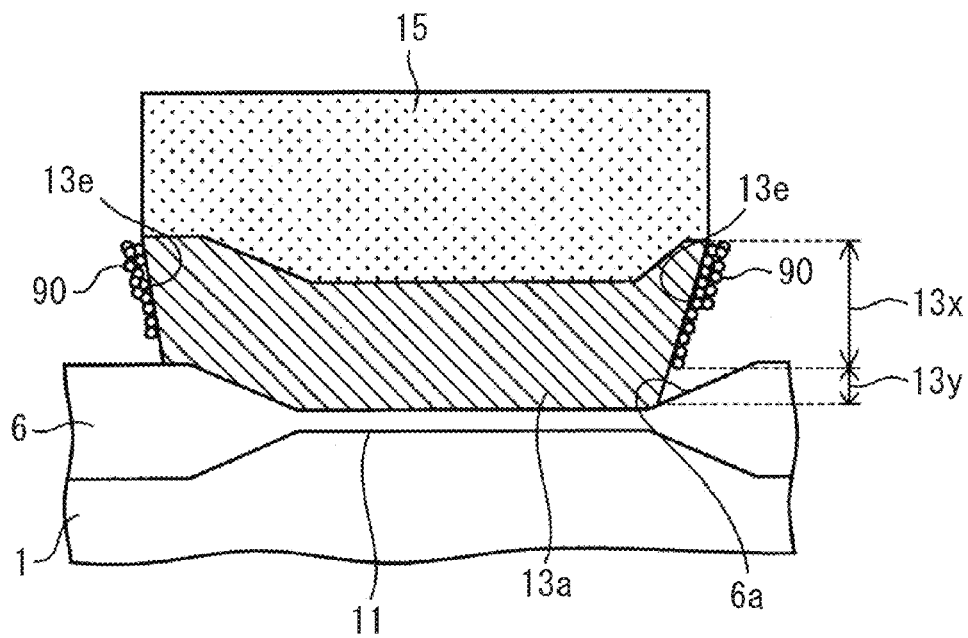
FIGS. 7A and 7B depict cross-sectional views explaining two-step etching performed in Embodiment 1.
Figure 7B:
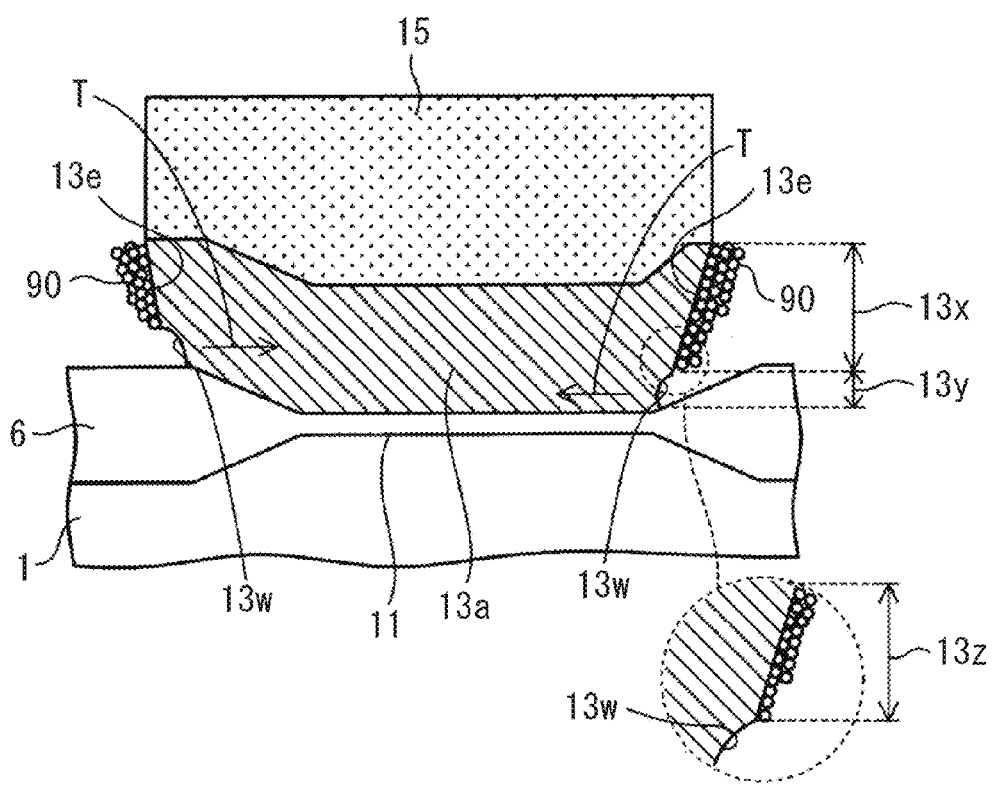

FIGS. 7A and 7B depict cross-sectional views explaining the two-step etching performed by using the RIE system 100 of FIG. 11 in Embodiment 1.

In first etching performed as the first step, as depicted in FIG. 7A, a portion of the first conductive film 13 not covered with the first resist pattern 15 is completely etched for forming the conductive patterns 13a.

As further depicted in FIG. 7A, an organic deposition 90 is adhered over a side face 13e of the conductive pattern 13a through a reaction caused between an etching gas and the first resist pattern 15. An upper portion 13x of the side face 13e close to the first resist pattern 15 is exposed to the etching atmosphere for a long period of time until the etching reaches the isolation insulating film 6, and therefore, the deposition 90 is adhered over the upper portion 13x in a larger amount than in another portion. On the other hand, a bottom portion 13y of the side face 13e close to the isolation insulating film 6 is exposed to the etching atmosphere for a short period of time, and hence, the amount of deposition 90 adhered over the bottom portion 13y is smaller than that adhered over the upper portion 13x.

The etching gas used in the first etching may not be particularly specified and may be, for example, a mixed gas of $Cl_2$, HBr and $O_2$-including He. The $Cl_2$ and the HBr make a contribution to increasing the etching rate for the first conductive film 13 made of amorphous silicon. The HBr also includes a function of increasing etch selectivity between the first resist pattern 15 and the first conductive film 13. The $O_2$ increases etch selectivity ratio between the first conductive film 13 and the isolation insulating film 6, so that the isolation insulating film 6 may work as an etching stopper.

The conditions for the first etching may not be particularly specified. In Embodiment 1, for example, the following conditions are employed:

Temperature of cathode 101: from about 60 to 70° C., for example.

Temperature of inner walls of chamber 104: from about 65 to 75° C., for example.

Pressure within chamber 104: from about 4 to 8 mTorr, for example.

Power of bias high frequency power supply 102: from about 70 to 90 W, for example.

Power of plasma generation high frequency power supply 103: from about 530 to 590 W, for example.

Flow rate ratio of etching gas (HBr:$O_2$-including He:$Cl_2$): 5:1:1, for example.

In second etching performed as the second step, as depicted in FIG. 7B, the side face 13e is etched under the conditions in which the amount of deposition 90 deposited per unit time is larger than in the first etching. Thus, the deposition 90 is deposited over the side face 13e in a larger amount than in the first etching. In particular, the upper portion 13x of the side face 13e is covered with the deposition 90 with a large thickness produced in the first and second etching, and therefore, the upper portion 13x is minimally etched.

On the other hand, the amount of deposition 90 adhered in the first etching is smaller and the amount of deposition 90 produced in the second etching is also smaller on the bottom portion 13y of the side face 13e than on the upper portion 13x as depicted in FIG. 7B. Therefore, the deposition 90 minimally works as an etching mask over the bottom portion 13y, and the etching is proceeded in the lateral direction of the substrate 1, resulting in forming a notch 13w. In a lower portion 13z of the side face 13e that is positioned above the notch 13w and over which the deposition 90 is adhered in a comparatively small amount, the deposition 90 works less as a mask, and hence, the side face may be sometimes inclined in a direction T corresponding to the depth direction of the notch 13w as depicted in a dotted line circle in FIG. 7B.

In order to increase the amount of deposition 90 produced per unit time in the second etching as compared with that in the first etching as described above, the flow rate of $O_2$ is set to be larger by increasing the flow rate of the $O_2$-including He or the flow rate of the $Cl_2$ is set to be smaller than in the first etching. Alternatively, the amount of deposition 90 produced per unit time may be increased in the second etching as compared with that in the first etching by setting the temperature of the cathode 101 (namely, the temperature of the substrate) or the temperature of the inner walls of the chamber 104 to be lower in the second etching than in the first etching.

In Embodiment 1, the amount of deposition 90 produced per unit time is increased as follows: The flow rate of the $Cl_2$ is set to 0 and a mixed gas of the HBr and the $O_2$-including He is used as the etching gas, and thus, the flow rate of the $Cl_2$ included in the etching gas is reduced in the second etching as compared with that in the first etching.

Furthermore, since the second etching is performed with a portion of the isolation insulating film 6 not covered with the first resist pattern 15 exposed, it is understood that the isolation insulating film 6 may be exposed to the etching atmosphere to be unnecessarily etched.

Accordingly, the second etching is preferably performed under the conditions where the etch selectivity between the isolation insulating film 6 and the conductive film 13 is higher than in the first etching. Thus, the etching of the isolation insulating film 6 is suppressed.

The etch selectivity between the isolation insulating film 6 and the conductive film 13 may be controlled in accordance with the flow rate of $O_2$ included in the etching gas, and as the flow rate of $O_2$ is higher, the etch rate for the isolation insulating film 6 is further lower than that for the conductive film 13. Accordingly, the etch selectivity between the isolation insulating film 6 and the conductive film 13 may be set to be higher than in the first etching by setting the flow rate of $O_2$ higher in the second etching than in the first etching.

The other conditions may not be particularly specified, and for example, the following conditions may be employed:

Temperature of cathode 101: from about 60 to 70° C., for example.

Temperature of inner walls of chamber 104: from about 65 to 75° C., for example.

Pressure within chamber 104: from about 46 to 54 mTorr, for example.

Power of bias high frequency power supply 102: from about 90 to 110 W, for example.

Power of plasma generation high frequency power supply 103: from about 570 to 630 W, for example.

Flow rate ratio of etching gas (HBr:$O_2$-including He): 16:1, for example.

Figure 8A:
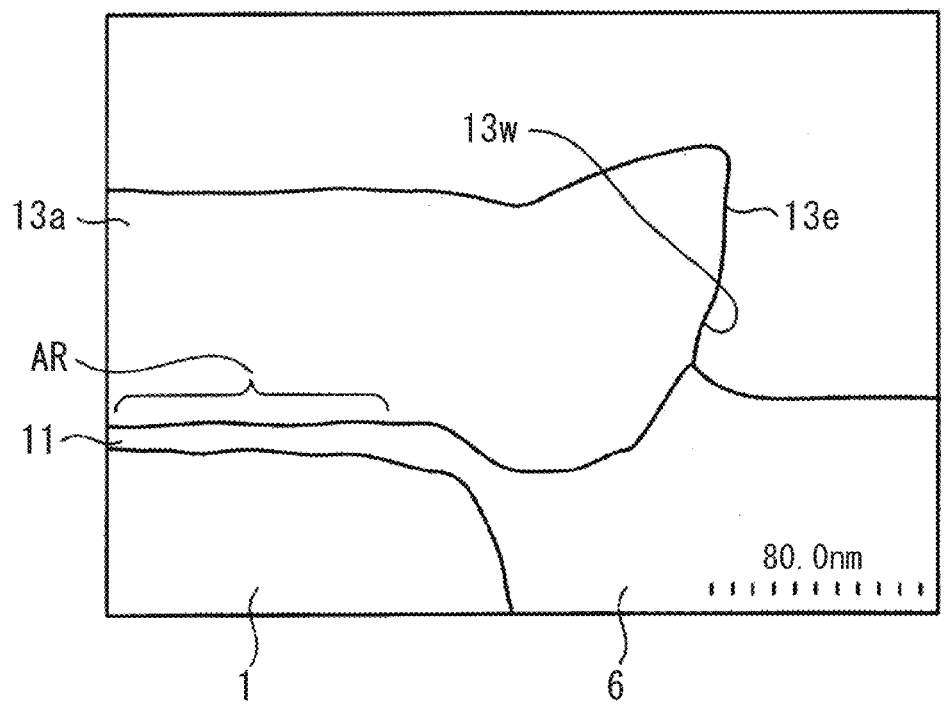
FIGS. 8A and 8B depict cross-sectional views based on cross-sectional images obtained with an SEM after performing the two-step etching in Embodiment 1.
Figure 8B:
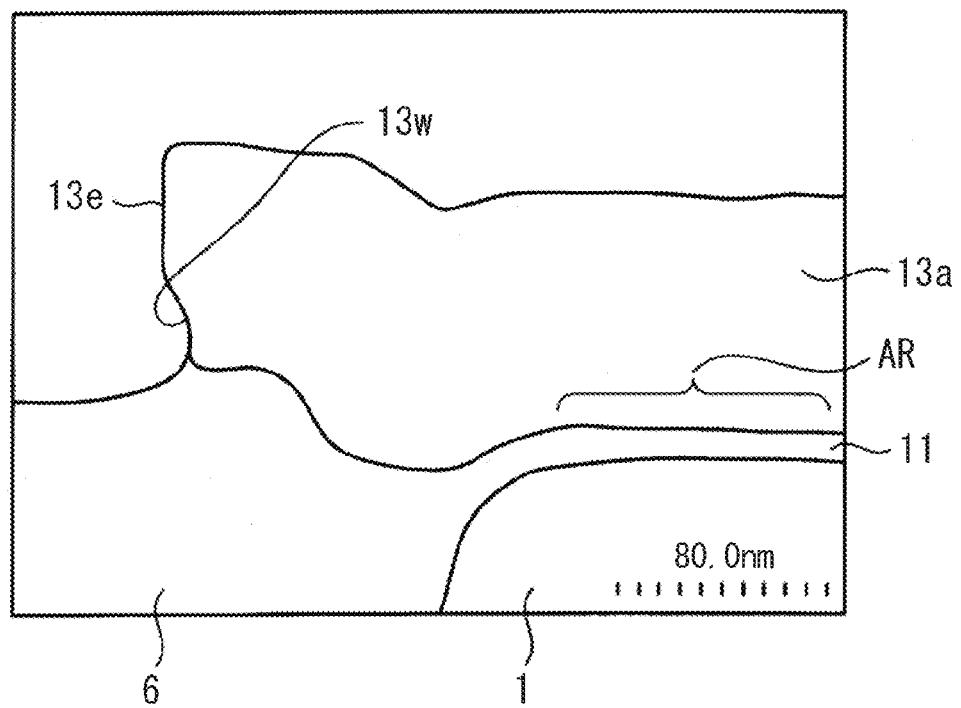

FIGS. 8A and 8B depict diagrams based on cross-sectional images obtained with an SEM of the conductive pattern 13a after completing the two-step etching described with reference to FIGS. 7A and 7B. The notch 13w is in a shape concaved toward the active region AR of the silicon substrate 1. In this exemplified case, a portion of the side face 13e of the conductive pattern 13a positioned above the notch 13w is vertical to the surface of the silicon substrate 1. Thereafter, the first resist pattern 15 is removed.

FIG. 6A depicts a plan view of the semiconductor device of Embodiment 1 attained after completing the aforementioned process.

As depicted in FIG. 6A, a plurality of conductive patterns 13a are formed in the shape of stripes extending along the row direction in a plan view and are spaced from one another in the column direction.

As depicted in FIG. 6B, the side face 13e of each conductive pattern 13a is disposed above the isolation insulating film 6. The depth direction T of the notch 13w is parallel to the column direction depicted in FIG. 6A.

Next, as depicted in FIG. 5C, an ONO film is formed as an intermediate insulating film 16 over the isolation insulating film 6 and the conductive patterns 13a. The intermediate insulating film 16 is formed under the similar conditions as those described with reference to FIG. 1AK and includes a first thermally oxidized film 16x, a silicon nitride film 16y and a second thermally oxidized film 16z in this order.

Thereafter, the processes described with reference to FIGS. 1AL-1AO as the preliminary technique are performed, so that the etching may be carried out with the second resist pattern 20 used as a mask down to the intermediate insulating film 16 as depicted in FIG. 5D.

This etching is performed, for example, within an RIE etching chamber, and an etching gas for the metal silicide film 18 and the second conductive film 17 is, for example, a mixed gas of $Cl_2$, $O_2$ and HBr.

An etching gas for the intermediate insulating film 16 is, for example, a mixed gas of $CF_4$ and $O_2$.

The RIE is anisotropic etching with a maximum etching rate in a vertical direction to the top surface of the silicon substrate 1. Accordingly, a portion of the intermediate insulating film 16 disposed over the top surface of the conductive pattern 13a is removed through the etching but a portion of the intermediate insulating film 16 disposed over the side face of the conductive pattern 13a may not be completely removed because the thickness in the vertical direction to the silicon substrate 1 is larger in such a portion than in another portion.

As a result, as depicted in a dotted line circle in FIG. 5D, a residue 16a of the intermediate insulating film 16 remains over the side face 13e of the conductive pattern 13a.

Subsequently, as depicted in FIG. 5E, with the RIE etching chamber continuously used, the etching gas is changed to a mixed gas of $Cl_2$, $O_2$ and HBr. Thus, a portion of the conductive pattern 13a not covered with the second resist pattern 20 is removed through the RIE, thereby forming a portion of the conductive pattern 13a remaining after the etching into a floating gate 13c.

At this point, since the notch 13w has been formed in the side face 13e of the conductive pattern 13a in the etching described with reference to FIG. 5B, the reside 16a does not work as a mask for the conductive pattern 13a in this etching, and hence, no stringer of the conductive pattern 13a is produced beside the residue 16a.

FIG. 6B depicts a plan view of the semiconductor device of Embodiment 1 attained after completing this process.

As depicted in FIG. 6B, although the reside 16a of the intermediate insulating film 16 extends from one of two floating gates 13c adjacent to each other in the row direction to the other floating gate 13c, since there is no stringer of the conductive pattern 13a beside the reside 16a, there is no fear of electric short-circuit between the adjacent floating gates 13c.

Thereafter, the basic structure of the semiconductor device of Embodiment 1 as depicted in FIG. 5F is completed by performing, for example, the processes described with reference to FIGS. 1AQ-1BB.

In Embodiment 1, as described with reference to FIGS. 7A and 7B, the etching of the first conductive film 13 is carried out through the two steps of the first etching and the second etching, and the notch 13w is formed in the side face of the conductive pattern 13a in the second etching.

Therefore, when the conductive pattern 13a is etched in the process described with reference to FIG. 5E, the residue 16a of the intermediate insulating film 16 does not work as a mask for the conductive pattern 13a, and hence, no stringer of the conductive pattern 13a is produced beside the residue 16a after the etching.

Accordingly, a fear of electric short-circuit otherwise caused between the adjacent floating gates 13c through a conductive stringer may be reduced, so that the charge loss of the flash memory may be reduced and the yield of the semiconductor device may be increased.

According to Embodiment 1, there may not be need to additionally perform a new process but the etching of the first conductive film 13 is performed separately through the first etching (depicted in FIG. 7A) and the second etching (depicted in FIG. 7B), and hence, there is no fear of cost increase or yield lowering otherwise caused in additionally performing a new process.

The depth of the notch 13w of the conductive pattern 13a may be controlled in accordance with the etching time of the second etching (depicted in FIG. 7B) as described below.

Figure 9A:
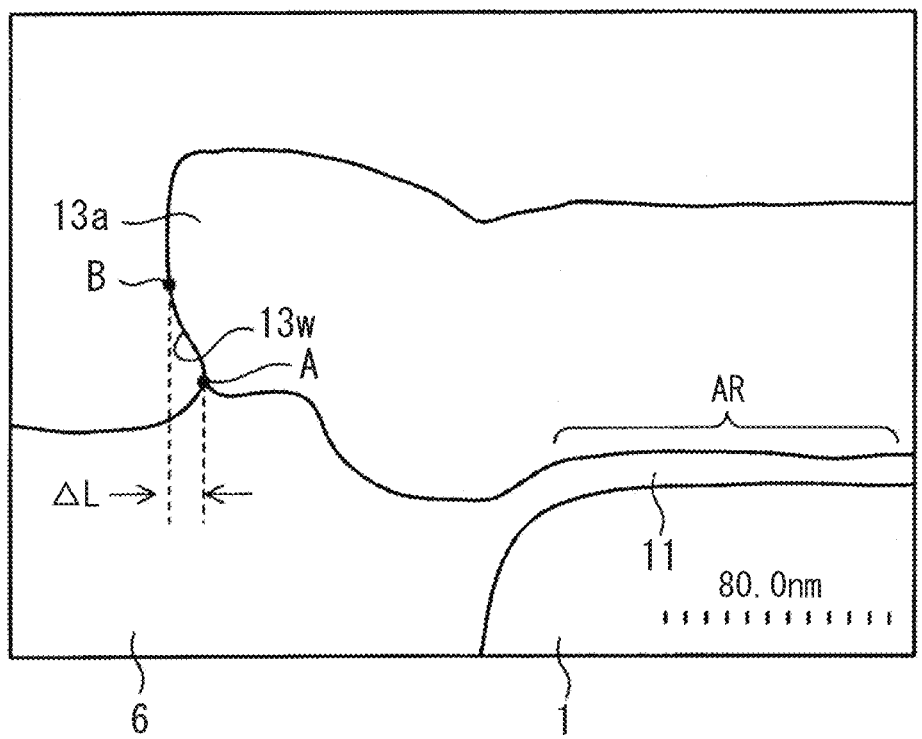
FIGS. 9A and 9B depict cross-sectional views based on cross-sectional images of a conductive pattern obtained with an SEM with etching time of second etching varied in Embodiment 1.
Figure 9B:
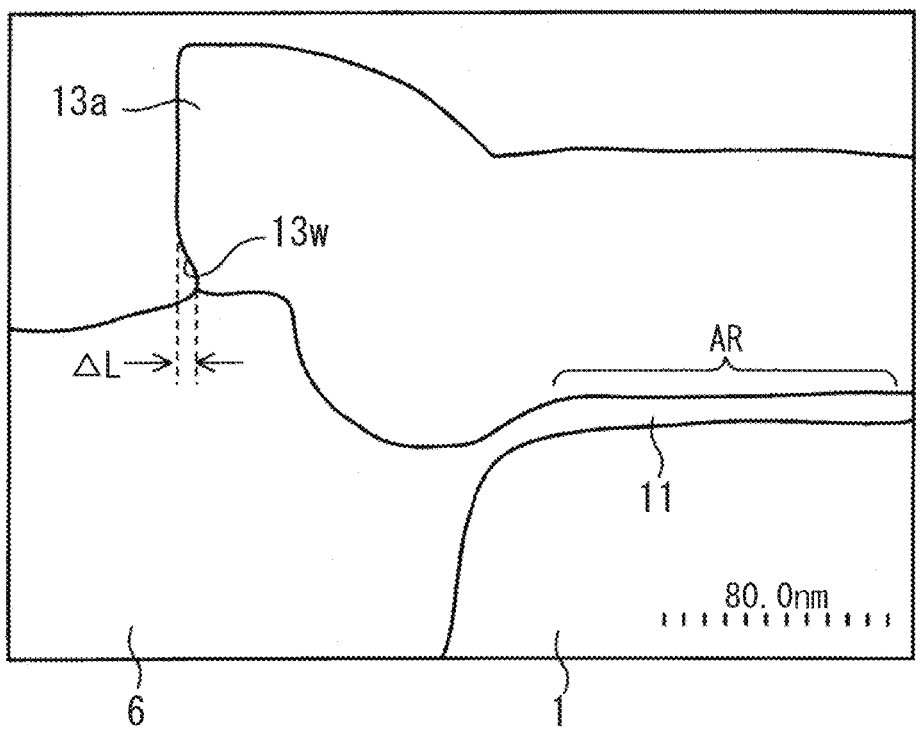

FIGS. 9A and 9B depict diagrams based on cross-sectional images obtained with an SEM of the conductive pattern 13a with the etching time of the second etching varied. FIG. 9A is a diagram obtained with the etching time of the second etching set to 65 seconds and FIG. 9B is a diagram obtained with the etching time set to 35 seconds.

The depth ΔL of the notch 13w corresponds to a distance between a point A of the notch 13w concaved most deeply toward the active region AR and a point B of the side face of the conductive pattern 13a farthest from the active region AR.

As depicted in FIG. 9A, when the etching time of the second etching is 65 seconds, the depth ΔL is approximately 12.57 nm. On the other hand, when the etching time is 35 seconds, the depth ΔL is approximately 6.86 nm as depicted in FIG. 9B.

Figure 10:
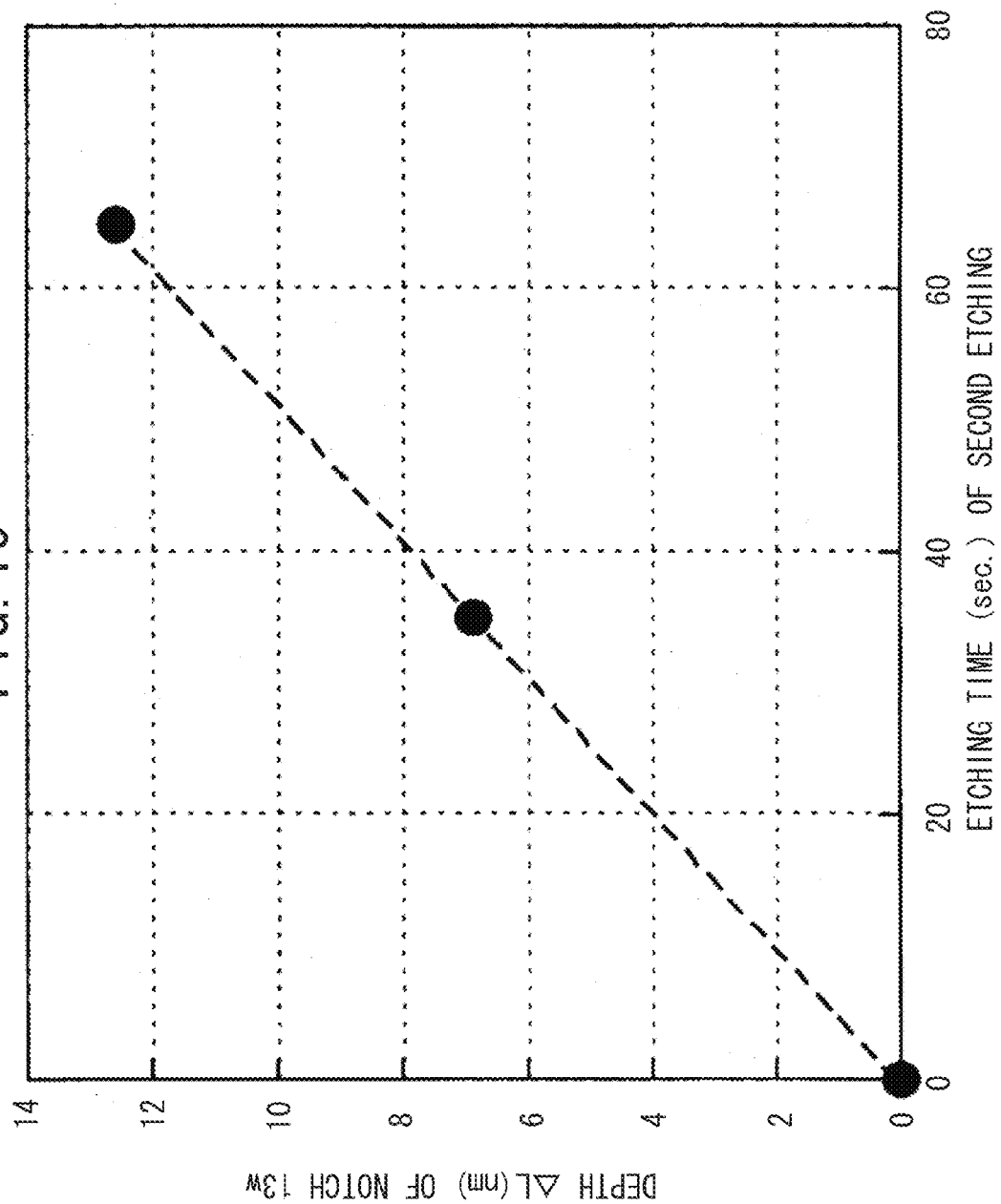
FIG. 10 depicts the relationship between the etching time of the second etching and a depth of a notch in Embodiment 1.

The aforementioned results are plotted in FIG. 10.

In FIG. 10, the abscissa indicates the etching time of the second etching and the ordinate indicates the depth ΔL. It is understood from FIG. 10 that the depth ΔL is increased by increasing the etching time of the second etching.

According to another study made by the present inventor, it has been found that the depth ΔL is increased by increasing the flow rate of $O_2$ included in the etching gas with the etching time of the second etching not varied.

As described so far, the notch 13w with a desired depth ΔL may be formed by controlling the etching time of the second etching or the flow rate of $O_2$.

In Embodiment 1, the formation of the skirt-like shape of the conductive pattern 13a over the inclined surface of the isolation insulating film 6 is avoided in the LOCOS structure.

Such a skirt-like shape is caused when the isolation insulating film includes an inclined surface on its top surface not only in the LOCOS structure but also in an STI (Shallow Trench Isolation) structure.

In Embodiment 2, the STI structure is employed for the isolation.

Figure 12A:
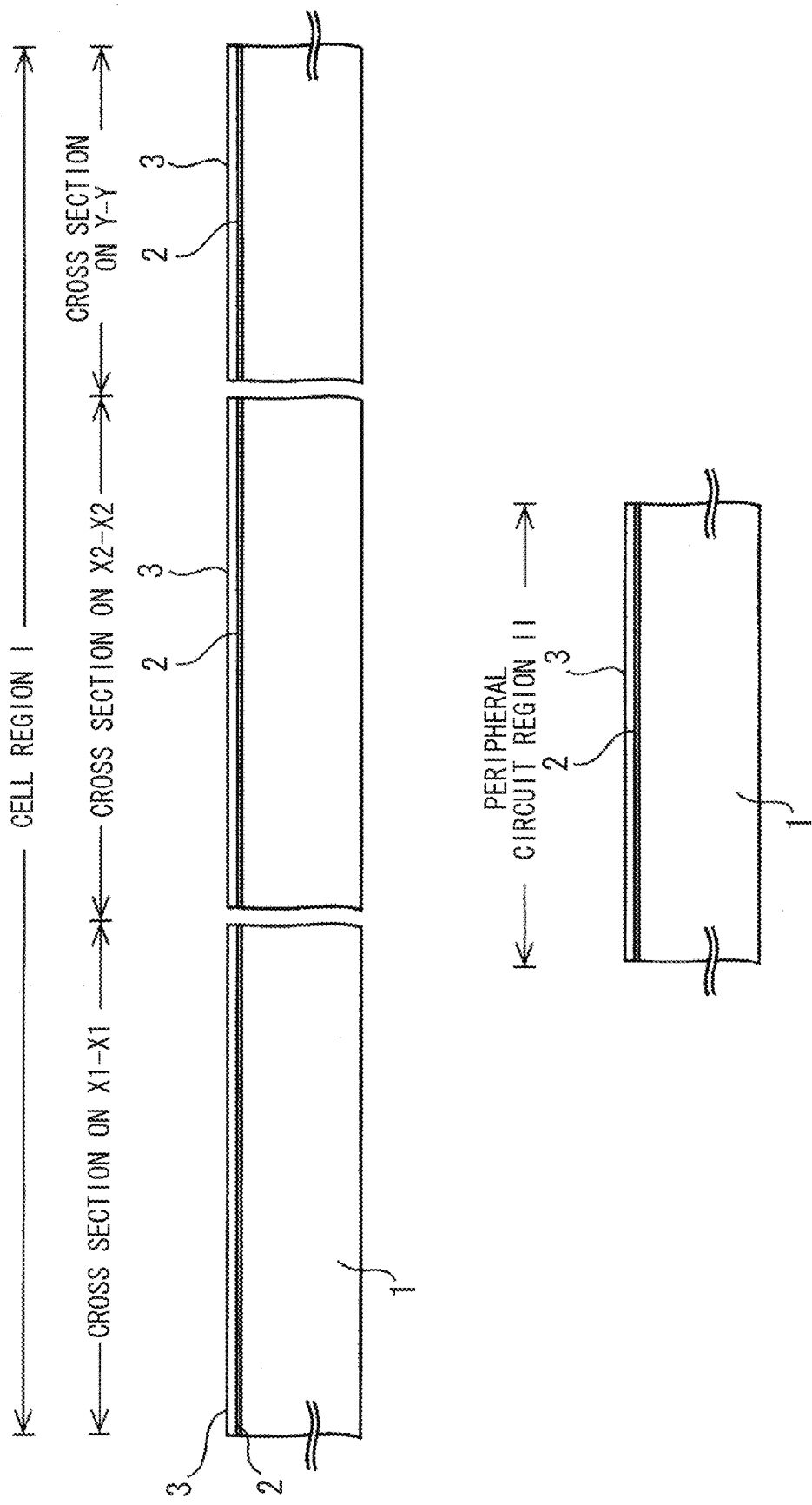

FIGS. 12A-2F depict cross-sectional views of a semiconductor device of Embodiment 2. It is noted that like reference numerals are used in FIGS. 12A-12F to refer to like elements described in Embodiment 1 so as to omit the description.

As depicted in FIG. 12A, a thermally oxidized film 2 with a thickness of, for example, approximately 3 nm is formed by thermally oxidizing a surface portion of a p-type silicon substrate 1. Furthermore, a silicon nitride film 3 with a thickness of, for example, approximately 120 nm is deposited on the thermally oxidized film 2 by the CVD.

Figure 12B:
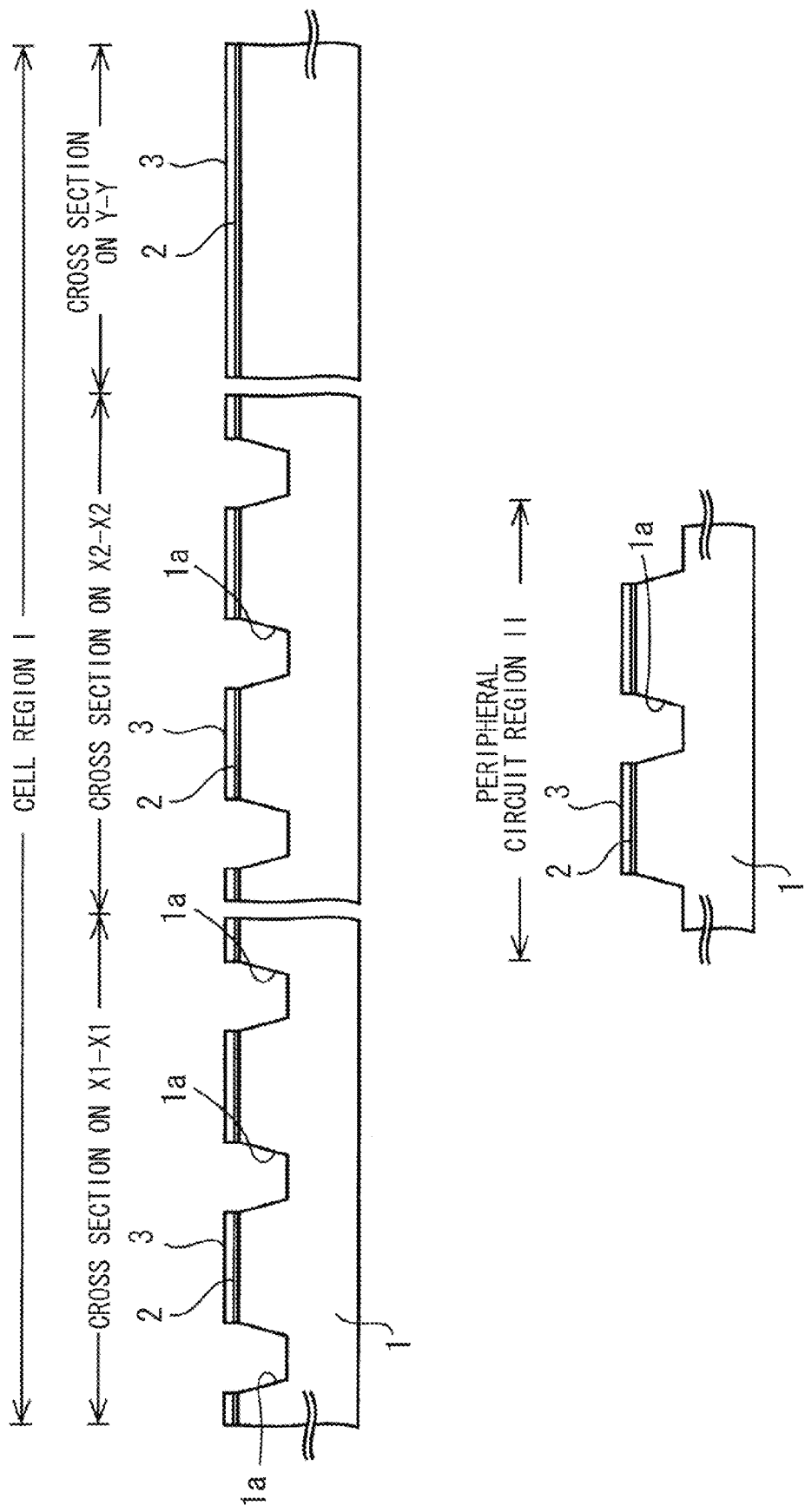

Next, as depicted in FIG. 12B, the silicon nitride film 3 is patterned by the photolithography. The thermally oxidized film 2 and the silicon substrate 1 are etched by the RIE with the patterned silicon nitride film 3 used as a mask, thereby forming an isolation trench 1a in the silicon substrate 1.

Figure 12C:
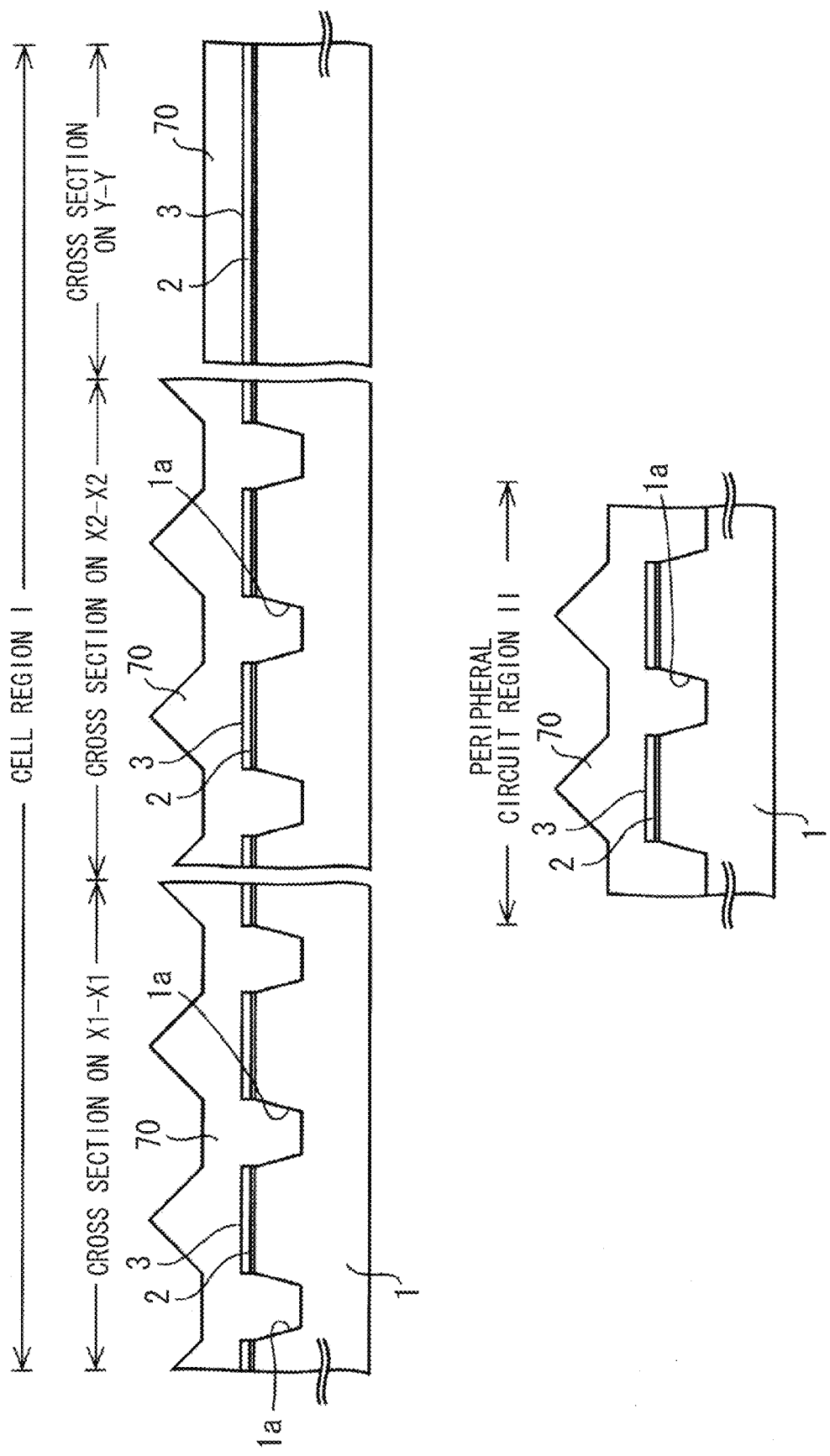

Subsequently, as depicted in FIG. 12C, a silicon oxide film is deposited, as an isolation insulating film 70, within the isolation trench 1a and over the silicon nitride film 3 by the CVD, so as to completely fill the isolation trench 1a with the isolation insulating film.

Figure 12D:
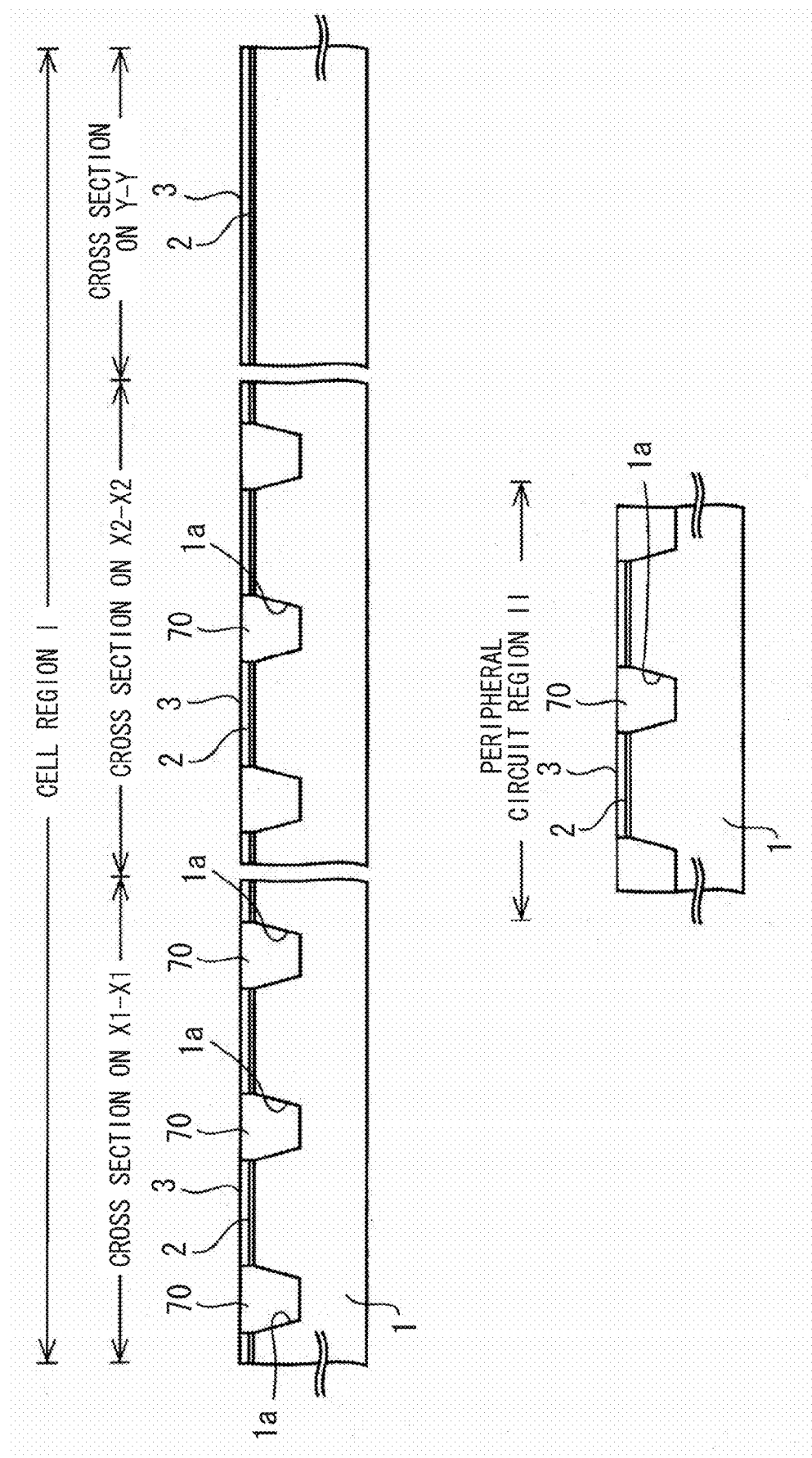

Thereafter, as depicted in FIG. 12D, an excessive portion of the isolation insulating film 70 disposed over the silicon nitride film 3 is polished and removed by the CMP, so as to allow the isolation insulating film 70 to remain in the isolation trench 1a alone.

Next, as depicted in FIG. 12E, the silicon nitride film 3 is wet etched with a phosphoric acid solution and the thermally oxidized film 2 is wet etched with a hydrofluoric acid solution, thereby exposing a clean surface portion of the silicon substrate 1.

Thereafter, the processes described in Embodiment 1 with reference to FIGS. 1AF-1BB are performed, resulting in completing a basic structure of the semiconductor device of Embodiment 2 as depicted in FIG. 12F.

In Embodiment 2, the isolation insulating film 6 of the STI structure is etched, for example, in removing the thermally oxidized film 2 through the wet etching performed in the process of FIG. 12E, and an inclined surface may be formed over the top surface thereof.

As described with reference to FIG. 1AJ, the inclined surface encourages a skirt-like shape of the side face of the conductive pattern 13a in the etching of the first conductive film 13.

Therefore, also in the case where the STI structure is employed for the isolation, the first conductive film 13 is preferably etched through the two-step etching (depicted in FIGS. 7A and 7B) as described in Embodiment 1 so as to form the notch 13w in the side face of the conductive pattern 13a. As described in Embodiment 1, the notch 13w suppresses a stringer of the conductive pattern 13a, so that a fear of electric short-circuit between adjacent floating gates 13c through a stringer may be reduced.

In the aforementioned embodiments, the amount of deposition deposited over a side face of a conductive pattern is larger in the second etching than in the first etching, and therefore, a portion of the side face over which the deposition has been adhered is minimally etched.

Accordingly, the second etching is proceeded mainly in a bottom portion of the side face where the amount of adhered deposition is smaller than in an upper portion of the side face, resulting in forming a notch in the bottom portion. A residue of an insulating film remaining over the side face of the conductive pattern is in a shape depending upon the shape of the notch, and therefore, the reside does not work as a mask in etching the conductive pattern.

As a result, an etching residue of the conductive pattern does not remain beside the residue of the insulating film, so that a fear of short-circuit between device patterns, such as floating gates, through the residue may be reduced and the yield of the semiconductor device may be increased.

In the aforementioned embodiments, there may not be need to additionally perform a new process but merely the etching of the conductive film is performed through the two steps of the first etching and the second etching. Therefore, there is no fear of cost increase or yield lowering otherwise caused in additionally performing a new process.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
   a semiconductor substrate;
   an element isolation insulating film formed in the semiconductor substrate;
   a tunnel insulating film formed over the semiconductor substrate and next to the element isolation insulating film;
   a conductive pattern formed over the tunnel insulating film and the element isolation insulating film, a side face of the conductive pattern being over the element isolation insulating film; and
   an insulating film formed over the element isolation insulating film and the conductive pattern,
   wherein the side face of the conductive pattern comprises a notch over the element isolation insulating film.

2. The semiconductor device according to claim 1,
   wherein the element isolation insulating film extends along a first direction of the semiconductor substrate,
   wherein the insulating film extends along a second direction perpendicular to the first direction,
   wherein the notch is in a shape concaved along the second direction toward the semiconductor substrate.

3. The semiconductor device according to claim 2,
   wherein the conductive pattern includes the notch in a bottom portion of the side face of the conductive pattern,
   wherein a portion of the side face of the conductive pattern disposed above the notch is vertical to the semiconductor substrate or a lower portion of the side face of the conductive pattern disposed above the notch is inclined toward a depth direction of the notch.

4. The semiconductor device according to claim 2,
   wherein the element isolation insulating film includes an inclined surface inclined against a surface of the semiconductor substrate and a flat portion,
   wherein the notch is disposed above the inclined surface or the flat portion.

5. The semiconductor device according to claim 2,
   wherein the conductive pattern corresponds to a floating gate of a flash memory cell,
   wherein the insulating film corresponds to an intermediate insulating film of the flash memory cell,
   wherein the flash memory cell includes a control gate over the intermediate insulating film.

6. The semiconductor device according to claim 1,
   wherein the element isolation insulating film includes a flat portion, and the notch is disposed over the flat portion.

7. The semiconductor device according to claim 1,
   wherein the notch is disposed on a lower portion of the side face of the conductive pattern.

* * * * *